(12) United States Patent
Kaneyama et al.

(10) Patent No.: US 8,932,672 B2
(45) Date of Patent: Jan. 13, 2015

(54) SUBSTRATE PROCESSING APPARATUS

(75) Inventors: Koji Kaneyama, Kyoto (JP); Masashi Kanaoka, Kyoto (JP); Tadashi Miyagi, Kyoto (JP); Kazuhito Shigemori, Kyoto (JP); Shuichi Yasuda, Kyoto (JP); Tetsuya Hamada, Kyoto (JP)

(73) Assignee: SCREEN Semiconductor Solutions Co., Ltd., Kyoto (JP)

( * ) Notice: Subject to any disclaimer, the term of this patent is extended or adjusted under 35 U.S.C. 154(b) by 0 days.

(21) Appl. No.: 12/628,120

(22) Filed: Nov. 30, 2009

(65) Prior Publication Data

US 2010/0075054 A1 Mar. 25, 2010

Related U.S. Application Data

(62) Division of application No. 11/670,108, filed on Feb. 1, 2007, now abandoned.

(30) Foreign Application Priority Data

| Feb. 2, 2006 | (JP) | 2006-025362 |
| Aug. 31, 2006 | (JP) | 2006-235084 |

(51) Int. Cl.
| B05D 3/12 | (2006.01) |
| B08B 1/00 | (2006.01) |
| B08B 1/04 | (2006.01) |
| B08B 3/04 | (2006.01) |
| G11B 5/84 | (2006.01) |
| G03F 7/16 | (2006.01) |
| G03F 7/20 | (2006.01) |
| H01L 21/67 | (2006.01) |
| G11B 7/26 | (2006.01) |

(52) U.S. Cl.
CPC .............. *G11B 5/8404* (2013.01); *G03F 7/168* (2013.01); *G03F 7/7075* (2013.01); *G03F 7/70916* (2013.01); *G03F 7/70925* (2013.01); *G03F 7/70991* (2013.01); *H01L 21/67051* (2013.01); *H01L 21/67225* (2013.01); *G11B 7/261* (2013.01); *Y10S 134/902* (2013.01)

USPC ................. 427/240; 134/6; 134/33; 134/151; 134/153; 134/157; 134/902; 438/780; 438/782

(58) Field of Classification Search
USPC .......... 427/240, 352, 353, 368; 438/758, 780, 438/782; 118/52, 107; 134/137, 6, 33, 151, 134/153, 157, 902
See application file for complete search history.

(56) References Cited

U.S. PATENT DOCUMENTS

| 4,775,560 A | 10/1988 | Katsura et al. |
| 5,078,939 A | 1/1992 | Katsura et al. |

(Continued)

FOREIGN PATENT DOCUMENTS

| JP | 63-067243 A | 3/1988 |
| JP | 02-146829 U | 12/1990 |

(Continued)

OTHER PUBLICATIONS

JPO computer-generated translation of JP 2006-080403 A, published Mar. 2006.*

(Continued)

*Primary Examiner* — Kirsten Jolley
(74) *Attorney, Agent, or Firm* — Kilpatrick Townsend & Stockton LLP

(57) ABSTRACT

A substrate processing apparatus comprises an indexer block, an anti-reflection film processing block, a resist film processing block, a development processing block, a resist cover film processing block, a resist cover film removal block, a cleaning/drying processing block, and an interface block. An exposure device is arranged adjacent to the interface block in the substrate processing apparatus. The exposure device subjects a substrate to exposure processing by means of an immersion method. In the edge cleaning unit in the cleaning/drying processing block, a brush abuts against an end of the rotating substrate, so that the edge of the substrate before the exposure processing is cleaned. At this time, the position where the substrate is cleaned is corrected.

8 Claims, 30 Drawing Sheets

(56) References Cited

U.S. PATENT DOCUMENTS

| | | |
|---|---|---|
| 5,729,856 A | 3/1998 | Jang et al. |
| 6,439,962 B1 | 8/2002 | Ato |
| 6,530,157 B1 | 3/2003 | Henderson et al. |
| 6,893,171 B2 | 5/2005 | Fukutomi et al. |
| 7,497,633 B2 | 3/2009 | Kaneyama et al. |
| 7,522,823 B2 | 4/2009 | Fukumoto et al. |
| 7,604,424 B2 | 10/2009 | Shigemori et al. |
| 2003/0211740 A1 | 11/2003 | Bang et al. |
| 2004/0005212 A1 | 1/2004 | Wu |
| 2004/0253091 A1 | 12/2004 | Iida et al. |
| 2005/0000652 A1 | 1/2005 | Nam et al. |
| 2005/0087441 A1 | 4/2005 | Hongo et al. |
| 2006/0098977 A1 | 5/2006 | Kaneyama |
| 2006/0098978 A1 | 5/2006 | Yasuda et al. |
| 2006/0098979 A1 | 5/2006 | Kaneyama et al. |
| 2006/0104635 A1 | 5/2006 | Kaneyama et al. |
| 2006/0147201 A1 | 7/2006 | Asano et al. |
| 2006/0147202 A1 | 7/2006 | Yasuda et al. |
| 2006/0152693 A1 | 7/2006 | Yasuda et al. |
| 2006/0152694 A1 | 7/2006 | Yasuda et al. |
| 2006/0159449 A1 | 7/2006 | Yasuda et al. |
| 2006/0177586 A1 | 8/2006 | Ishida et al. |
| 2006/0250602 A1 | 11/2006 | Sato et al. |
| 2006/0291854 A1 | 12/2006 | Kaneyama et al. |
| 2006/0291855 A1 | 12/2006 | Shigemori et al. |
| 2007/0003278 A1 | 1/2007 | Kaneyama |
| 2007/0071439 A1 | 3/2007 | Kaneyama et al. |
| 2007/0128554 A1* | 6/2007 | Kawamura et al. ........... 430/311 |
| 2007/0166031 A1 | 7/2007 | Hamada |
| 2007/0172233 A1 | 7/2007 | Hamada |
| 2007/0177869 A1 | 8/2007 | Yamamoto et al. |
| 2007/0177870 A1 | 8/2007 | Hamada |
| 2010/0159142 A1 | 6/2010 | Yasuda et al. |

FOREIGN PATENT DOCUMENTS

| | | |
|---|---|---|
| JP | 03-211749 A | 9/1991 |
| JP | 04-084410 A | 3/1992 |
| JP | 05-076814 A | 3/1993 |
| JP | 06-045302 A | 2/1994 |
| JP | 06-155213 A | 6/1994 |
| JP | 07-106240 A | 4/1995 |
| JP | 08-264418 A | 10/1996 |
| JP | 09-223664 A | 8/1997 |
| JP | 09-298181 A | 11/1997 |
| JP | 2001-093828 A | 4/2001 |
| JP | 2001-110712 A | 4/2001 |
| JP | 2002-329661 A | 11/2002 |
| JP | 2003-045788 A | 2/2003 |
| JP | 2003-156322 A | 5/2003 |
| JP | 2003-197592 | 7/2003 |
| JP | 2003-324139 | 11/2003 |
| JP | 2003-347181 A | 12/2003 |
| JP | 2005-011853 | 1/2005 |
| JP | 2005-136364 A | 5/2005 |
| JP | 2005-197469 | 7/2005 |
| JP | 2005-294520 | 10/2005 |
| JP | 2005-340846 A | 12/2005 |
| JP | 2006-080403 A * | 3/2006 |
| JP | 2006-222158 | 8/2006 |
| JP | 2006-310733 A | 11/2006 |
| JP | 2007-005659 A | 1/2007 |
| KR | 2003-0087424 | 11/2003 |
| KR | 2004-0047602 | 5/2004 |
| WO | WO 99/49504 | 9/1999 |
| WO | WO 2006/027900 | 3/2006 |
| WO | WO 2006/028173 | 3/2006 |

OTHER PUBLICATIONS

JPO computer-generated translation of JP 2003-197592 A, published Jul. 2003.*
Front page of the pamphlet of the announced patent specification in the counterpart Chinese application (200710006705.4).
Office Action of Chinese Application No. 2007100067054, dated Jan. 23, 2009, 7 pages total. [No English Translation].
Korean Office Action for KR Patent Application No. 1 0-2007-0009513, dated Mar. 12, 2008, 13 pages total (including English translation).
Office Action in the counterpart Japanese Application No. 2006-235084, dated May 10, 2011, 5 pages.
Office Action in the counterpart Japanese Application No. 2006-235084, dated Oct. 4, 2011, 5 pages.
Office Action in the counterpart Japanese Application No. 2011/151739, dated Apr. 18, 2013, 3 pages.
Office Action for corresponding Japanese Application No. 2011-151739 dated Jul. 10, 2012, 3 pages.

* cited by examiner

F I G. 2 4
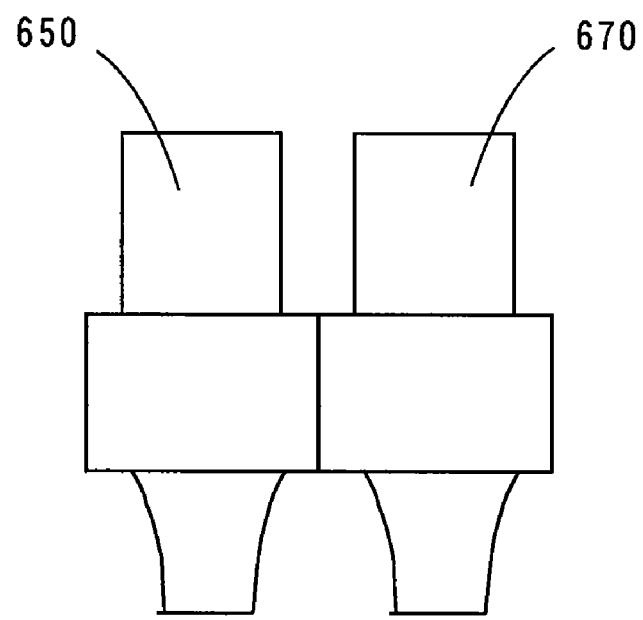

F I G. 2 9
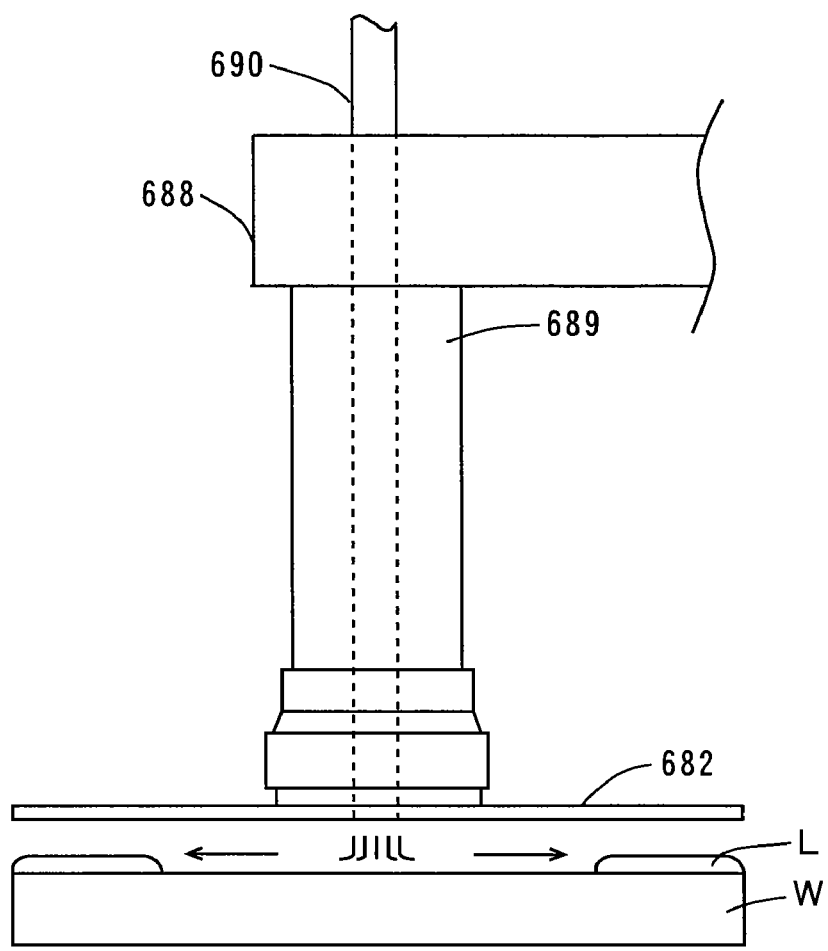

US 8,932,672 B2

SUBSTRATE PROCESSING APPARATUS

CROSS-REFERENCES TO RELATED APPLICATIONS

This application is a division of U.S. patent application Ser. No. 11/670,108, filed Feb. 1, 2007; which claims priority to Japanese Patent Application No. 2006-025362, filed Feb. 2, 2006; and Japanese Patent Application 2006-235084, filed Aug. 31, 2006. The disclosures of Ser. No. 11/670,108, JP 2006-025362, and JP 2006-235084 are hereby incorporated by reference in their entirety for all purposes.

FIELD OF THE INVENTION

The present invention relates to a substrate processing apparatus that subjects substrates to processing.

BACKGROUND OF THE INVENTION

Substrate processing apparatuses are used to subject various types of substrates such as semiconductor substrates, substrates for liquid crystal displays, plasma displays, optical disks, magnetic disks, magneto-optical disks, and photomasks, and other substrates to various types of processing.

Such a substrate processing apparatus generally subjects a single substrate to a plurality of different types of processing successively. The substrate processing apparatus as described in JP 2003-324139 A comprises an indexer block, an anti-reflection film processing block, a resist film processing block, a development processing block, and an interface block. An exposure device is arranged adjacent to the interface block as an external device separate from the substrate processing apparatus.

In the above-mentioned substrate processing apparatus, a substrate carried out of the indexer block is transported to the exposure device through the interface block after being subjected to anti-reflection film formation and resist film coating processing in the anti-reflection film processing block and the resist film processing block. After the resist film on the substrate is subjected to exposure processing in the exposure device, the substrate is transported to the development processing block through the interface block. After the resist film on the substrate is subjected to development processing to form a resist pattern thereon in the development processing block, the substrate is transported to the indexer block.

With recent increases in density and integration of devices, making finer resist patterns has become an important problem. Conventional exposure devices have generally performed exposure processing by reduction-projecting a reticle pattern on a substrate through a projection lens. With such conventional exposure devices, however, the line width of an exposure pattern is determined by the wavelength of a light source of the exposure device. Therefore, making finer resist patterns has had a limitation.

Therefore, an immersion method is suggested as a projection exposure method allowing for finer exposure patterns (see, e.g., WO99/49504 pamphlet). In a projection exposure device according to the WO99/49504 pamphlet, an area between a projection optical system and a substrate is filled with a liquid, resulting in a shorter wavelength of exposure light on a main surface of the substrate. This allows for finer exposure patterns.

In the projection exposure device according to the above-mentioned WO99/49504 pamphlet, however, exposure processing is performed with the substrate and the liquid brought into contact with each other. When a contaminant adheres to the substrate before the exposure processing, the contaminant is mixed into the liquid.

Although the substrate is subjected to various types of film formation processing before the exposure processing, an edge of the substrate may, in some cases, be contaminated in the process of the film formation processing. When the substrate is subjected to the exposure processing with the edge of the substrate thus contaminated, a lens of the exposure device may be contaminated, resulting in a defective dimension and a defective shape of an exposure pattern.

BRIEF SUMMARY OF THE INVENTION

An object of the present invention to provide a substrate processing apparatus capable of preventing contamination in an exposure device due to contamination at an edge of a substrate.

(1) A substrate processing apparatus according to an aspect of the present invention is a substrate processing apparatus that is arranged adjacent to an exposure device, comprising a processing section that subjects a substrate to processing; and an interface provided adjacent to one end of the processing section for exchanging the substrate between the processing section and the exposure device, at least one of the processing section and the interface further comprising a first processing unit that cleans an edge of the substrate before the exposure processing by the exposure device, and the first processing unit comprising a substrate holding device that holds the substrate substantially horizontally, a rotation driving mechanism that rotates the substrate held by the substrate holding device around an axis perpendicular to the substrate, a cleaning device that cleans the edge of the substrate rotated by the rotation driving mechanism, and a position correction device that corrects the position where the substrate is cleaned by the cleaning device.

The substrate processing apparatus is arranged adjacent to the exposure device. In the substrate processing apparatus, the substrate is subjected to the predetermined processing by the processing section, and is exchanged between the processing section and the exposure device by the interface provided adjacent to the one end of the processing section.

The first processing unit cleans the edge of the substrate before the exposure processing by the exposure device. In the first processing unit, the cleaning device cleans the edge of the substrate rotated by the rotation driving mechanism. At this time, the position correction device corrects the position where the substrate is cleaned by the cleaning device. Thus, the edge of the substrate can be uniformly cleaned. This prevents the edge of the substrate from being non-uniform in cleaning, thereby allowing a contaminant that has adhered to the edge of the substrate to be reliably removed.

As a result, contamination in the exposure device due to the contamination at the edge of the substrate can be prevented, which can prevent a defective dimension and a defective shape of an exposure pattern.

Furthermore, when an organic film is formed on the substrate, components of the organic film on the substrate may be eluted or deposited during the exposure processing. By cleaning the edge of the substrate, therefore, the components eluded or deposited from the organic film on the substrate during the exposure processing are previously eluded or deposited in the first processing unit, so that an eluate or a deposit is cleaned away. Consequently, the components of the organic film on the substrate are prevented from being eluded or deposited during the exposure processing. This prevents the exposure device from being contaminated, thereby preventing a defective dimension and a defective shape of an exposure pattern.

(2) The position correction device may correct the position of the substrate such that the center of the substrate held by the substrate holding device coincides with the rotation center of the substrate by the rotation driving mechanism.

In this case, in the first processing unit, the position of the substrate is corrected by the position correction device such that the center of the substrate held substantially horizontally by the substrate holding device coincides with the rotation center of the substrate by the rotation driving mechanism.

Thus, the center of the substrate is prevented from being eccentric from the rotation center when the edge of the substrate is cleaned, so that the edge of the substrate can be uniformly cleaned. This prevents the edge of the substrate from being non-uniform in cleaning, thereby allowing a contaminant that has adhered to the edge of the substrate to be reliably removed.

The center of the substrate coincides with the rotation center, so that a cleaning region at the edge of the substrate by the cleaning device can be adjusted with high accuracy. Thus, various regions at the edge of the substrate can be cleaned selectively and accurately. This prevents a portion of the substrate, which should not be cleaned, from being unnecessarily cleaned.

Furthermore, the rotation of the substrate is stabilized when the edge of the substrate is cleaned, which prevents a cleaning liquid used for the cleaning from being splashed in an irregular direction. Thus, the splashed cleaning liquid is prevented from contaminating the substrate by adhering to the main surface of the substrate again.

(3) The position correction device may comprise a plurality of abutting members that abut against outer edges of the substrate to correct the position of the substrate.

In this case, the abutting members abut against the outer edges of the substrate, and press the substrate in a substantially horizontal direction, to correct the position of the substrate. Even in a case where the organic film is formed on the substrate, therefore, the abutting members can reliably correct the position of the substrate without damaging the organic film on the substrate.

(4) The plurality of abutting members may be respectively arranged at positions symmetrical with the rotation center of the substrate used as a basis and may move at equal speeds toward the rotation center of the substrate.

In this case, the plurality of abutting members move at equal speeds toward the rotation center of the substrate, to press the substrate such that the center of the substrate coincides with the rotation center of the substrate. This allows the position of the substrate to be quickly and reliably corrected in a simple configuration.

(5) The plurality of abutting members may be arranged so as to extend, inclined obliquely upward outward from the rotation center of the substrate by the rotation driving mechanism, the position correction device may further comprise a lifting device that holds the plurality of abutting members so as to be movable upward and downward, and the lifting device may raise the plurality of abutting members such that the plurality of abutting members abut against the outer edges of the substrate.

In this case, when the lifting device raises the plurality of abutting members, any one of the plurality of abutting members abuts against the outer edges of the substrate. When the lifting device further raises the plurality of abutting members in this state, it moves in the horizontal direction toward the rotation center of the substrate by the rotation driving mechanism while sliding along the abutting member that abuts against the outer edges of the substrate because the abutting members extend, inclined obliquely upward outward from the rotation center of the substrate by the rotation driving mechanism.

Thus, the plurality of abutting members abut against the outer edges of the substrate, so that the center of the substrate and the rotation center of the substrate by the rotation driving mechanism coincide with each other. This allows the position of the substrate to be quickly and reliably corrected in a simple configuration.

(6) The position correction device may comprise a supporting member that supports a back surface of the substrate and moves in a substantially horizontal direction to correct the position of the substrate.

In this case, the supporting member moves in a substantially horizontal direction so that the position of the substrate is corrected with the back surface of the substrate supported by the supporting member. Even in a case where the organic film is formed on the substrate, therefore, the supporting member can reliably correct the position of the substrate without damaging the organic film on the substrate.

(7) The substrate processing apparatus may further comprise a substrate position detector that detects the position of the substrate relative to the substrate holding device, and a control device that controls the position correction device on the basis of an output signal of the substrate position detector.

In this case, the control device accurately recognizes the position of the substrate relative to the substrate holding device. The control device controls the position correction device on the basis of the recognition, so that the position of the substrate is accurately corrected.

(8) The position correction device may comprise an edge detector that detects the position of the edge of the substrate rotated by the rotation driving mechanism, and a cleaning device moving mechanism that moves the cleaning device such that the relative position between the cleaning device and the center of the substrate is held on the basis of the position of the edge of the substrate detected by the edge detector.

In this case, the edge detector detects the position of the edge of the substrate rotated by the rotation driving mechanism. The cleaning device is moved by the cleaning device moving mechanism such that the relative position between the cleaning device and the center of the substrate is held on the basis of the detected position of the edge of the substrate.

Thus, the relative position between the cleaning device and the center of the substrate is held even in a case where the center of the substrate and the rotation center of the substrate by the rotation driving mechanism are shifted from each other when the edge of the substrate is cleaned, so that the edge of the substrate can be uniformly cleaned. This prevents the edge of the substrate from being non-uniform in cleaning, thereby allowing a contaminant that has adhered to the edge of the substrate to be reliably removed.

Furthermore, a cleaning region at the edge of the substrate by the cleaning device can be adjusted with high accuracy. Thus, various regions at the edge of the substrate can be cleaned selectively and accurately. This prevents a portion of the substrate that, which should not be cleaned, from being unnecessarily cleaned.

(9) The position correction device may comprise an edge detector that detects the position of the edge of the substrate rotated by the rotation driving mechanism, and a holding device moving mechanism that moves the substrate holding device such that the relative position between the cleaning device and the center of the substrate is held on the basis of the position of the edge of the substrate detected by the edge detector.

In this case, the edge detector detects the position of the edge of the substrate rotated by the rotation driving mechanism. The substrate holding device is moved by the holding device moving mechanism such that the relative position between the cleaning device and the center of the substrate is held on the basis of the detected position of the edge of the substrate.

Thus, the relative position between the cleaning device and the center of the substrate is held even in a case where the center of the substrate and the rotation center of the substrate by the rotation driving mechanism are shifted from each other when the edge of the substrate is cleaned, so that the edge of the substrate can be uniformly cleaned. This prevents the edge of the substrate from being non-uniform in cleaning, thereby allowing a contaminant that has adhered to the edge of the substrate to be reliably removed.

Furthermore, a cleaning region at the edge of the substrate by the cleaning device can be adjusted with high accuracy. Thus, various regions at the edge of the substrate can be cleaned selectively and accurately. This prevents a portion of the substrate, which should not be cleaned, from being unnecessarily cleaned.

(10) The substrate processing apparatus may further comprise a carry-in section that carries the substrate into the first processing unit, and the position correction device may comprise a carry-in position detector that detects the position of the carry-in section in a case where the carry-in section carries the substrate into the first processing unit, and a position adjustment device that adjusts the position of the carry-in section on the basis of the position detected by the carry-in position detector.

In this case, the carry-in position detector detects the position of the carry-in section when the carry-in section carries the substrate into the first processing unit, and the position adjustment device adjusts the position of the carry-in section on the basis of the detected position. This causes the position of the substrate placed on the substrate holding device to be corrected. Even in a case where the organic film is formed on the substrate, therefore, the abutting members can reliably correct the position of the substrate without damaging the organic film on the substrate.

(11) The interface may comprise a transport device that transports the substrate between the processing section and the exposure device, the transport device may comprise first and second holders that hold the substrate, the first holder may hold the substrate when the substrate before the exposure processing is transported, and the second holder may hold the substrate when the substrate after the exposure processing is transported.

In this case, even if the liquid adheres to the substrate during the exposure processing, the second holder is used for transporting the substrate after the exposure processing, and the first holder is used for transporting the substrate before the exposure processing, so that the liquid can be prevented from adhering to the first holder. Thus, the liquid can be prevented from adhering to the substrate before the exposure processing. This can reliably prevent particles and the like in an atmosphere from adhering to the substrate before the exposure processing.

(12) The second holder may be provided below the first holder.

In this case, even if the liquid drops from the second holder and the substrate held thereby, the liquid does not adhere to the first holder and the substrate held thereby. This can reliably prevent particles and the like from adhering to the substrate before the exposure processing.

(13) The processing section may further comprise a second processing unit that forms a photosensitive film made of a photosensitive material on the substrate.

In this case, after the second processing unit forms the photosensitive film made of the photosensitive material on the substrate, the first processing unit cleans the edge of the substrate. Thus, components eluded or deposited from the photosensitive film during the exposure processing are previously eluded or deposited in the first processing unit, so that an eluate or a deposit is cleaned away. Consequently, the components of the photosensitive film are prevented from being eluded or deposited during the exposure processing. This prevents the exposure device from being contaminated, which prevents a defective dimension and a defective shape of an exposure pattern.

(14) The processing section may further comprise a third processing unit that forms a protective film for protecting the photosensitive film.

In this case, the protective film is formed on the photosensitive film. Therefore, the components of the photosensitive film are prevented from being eluted in the liquid even if the exposure device performs the exposure processing with the substrate brought into contact with the liquid. This can reliably prevent the contamination in the exposure device.

(15) The processing section may further comprise a fourth processing unit that removes the protective film after the exposure processing.

In this case, the protective film formed on the photosensitive film can be reliably removed.

(16) The processing section may further comprise a fifth processing unit that forms an anti-reflection film on the substrate before the second processing unit forms the photosensitive film.

In this case, the anti-reflection film is formed on the substrate. Therefore, standing waves and halation generated during the exposure processing can be reduced.

(17) The processing section may further comprise a sixth processing unit that subjects the substrate to development processing.

In this case, the sixth processing unit subjects the substrate to the development processing.

(18) The cleaning device in the first processing unit may comprise a two-fluid nozzle that discharges a fluid mixture of a liquid and a gas to the edge of the substrate.

In this case, in the first processing unit, the edge of the substrate is cleaned by the two-fluid nozzle. When the edge of the substrate is thus cleaned using the two-fluid nozzle, the liquid mixture of the gas and the liquid is discharged to the edge of the substrate, so that the edge is cleaned. This allows a high cleaning effect to be obtained.

The fluid mixture of the gas and the liquid is discharged to the edge of the substrate, so that the edge is cleaned in non-contact, which prevents the edge of the substrate from being damaged during the cleaning. Further, it is also possible to easily control conditions under which the edge of the substrate is cleaned by controlling the discharge pressure of the fluid mixture and the ratio of the gas and the liquid in the fluid mixture.

Furthermore, the two-fluid nozzle allows the uniform fluid mixture to be discharged to the edge of the substrate, which prevents the edge from being non-uniform in cleaning.

(19) The cleaning device in the first processing unit may comprise a ultrasonic nozzle that discharges ultrasonic waves to the edge of the substrate while applying the ultrasonic waves to the liquid.

In this case, the first processing unit cleans the edge of the substrate using the ultrasonic nozzle. When the substrate is thus subjected to the edge cleaning processing using the ultrasonic nozzle, a high-frequency output is applied to the liquid passing through the ultrasonic nozzle depending on the value of a high-frequency current. Thus, the liquid in a ultrasonic vibration state is discharged to the edge of the substrate, so that the edge is cleaned. In this case, the high-frequency output applied to the liquid can be variably controlled electrically depending on the type of the substrate and the cleaning conditions.

(20) A substrate processing apparatus according to another aspect of the present invention is a substrate processing apparatus that is arranged adjacent to an exposure device, comprising a processing section that subjects a substrate to processing; and an interface provided adjacent to one end of the processing section for exchanging the substrate between the processing section and the exposure device, the interface further comprising an edge cleaning unit that cleans an edge of the substrate before exposure processing by the exposure device.

The substrate processing apparatus is arranged adjacent to the exposure device. In the substrate processing apparatus, the substrate is subjected to the predetermined processing by the processing section, and is exchanged between the processing section and the exposure device by the interface provided adjacent to the one end of the processing section.

The edge cleaning unit provided in the interface cleans the edge of the substrate before the exposure processing by the exposure device. This allows a contaminant that has adhered to the edge of the substrate to be removed. Thus, the edge of the substrate is kept in a sufficiently clean state immediately before the exposure processing.

As a result, contamination in the exposure device due to the contamination at the edge of the substrate can be prevented, which can prevent a defective dimension and a defective shape of an exposure pattern.

Furthermore, when an organic film is formed on the substrate, components of the organic film on the substrate may be eluded or deposited during the exposure processing. By cleaning the edge of the substrate, therefore, the components eluded or deposited from the organic film on the substrate are previously eluded or deposited in the first processing unit during the exposure processing, so that an eluate or a deposit is cleaned away. Consequently, the components of the organic film on the substrate are prevented from being eluded or deposited during the exposure processing. This prevents the exposure device from being contaminated, thereby preventing a defective dimension and a defective shape of an exposure pattern.

Other features, elements, characteristics, and advantages of the present invention will become more apparent from the following description of preferred embodiments of the present invention with reference to the attached drawings.

BRIEF DESCRIPTION OF THE DRAWINGS

FIG. 24 is a schematic view showing another example of a nozzle for drying processing;

FIG. 29 is a diagram for explaining a method of subjecting a substrate to drying processing using the cleaning/drying processing unit shown in FIG. 28.

DETAILED DESCRIPTION OF THE INVENTION

A substrate processing apparatus according to an embodiment of the present invention will be described with reference to the drawings. In the following description, a substrate refers to a semiconductor substrate, a substrate for a liquid crystal display, a substrate for a plasma display, a glass substrate for a photomask, a substrate for an optical disk, a substrate for a magnetic disk, a substrate for a magneto-optical disk, a substrate for a photomask, or the like, and the substrate contains silicon (Si).

The following drawings are accompanied by arrows that respectively indicate X, Y, and Z directions perpendicular to one another for clarity of a positional relationship. The X and Y directions are perpendicular to each other within a horizontal plane, and the Z direction corresponds to a vertical direction. In each of the directions, the direction of the arrow is defined as a + direction, and the opposite direction is defined as a − direction. A rotation direction centered around the Z direction is defined as a θ direction.

(1) Configuration of Substrate Processing Apparatus

A substrate processing apparatus according to an embodiment of the present invention will be now described with reference to the drawings.

Figure 1:
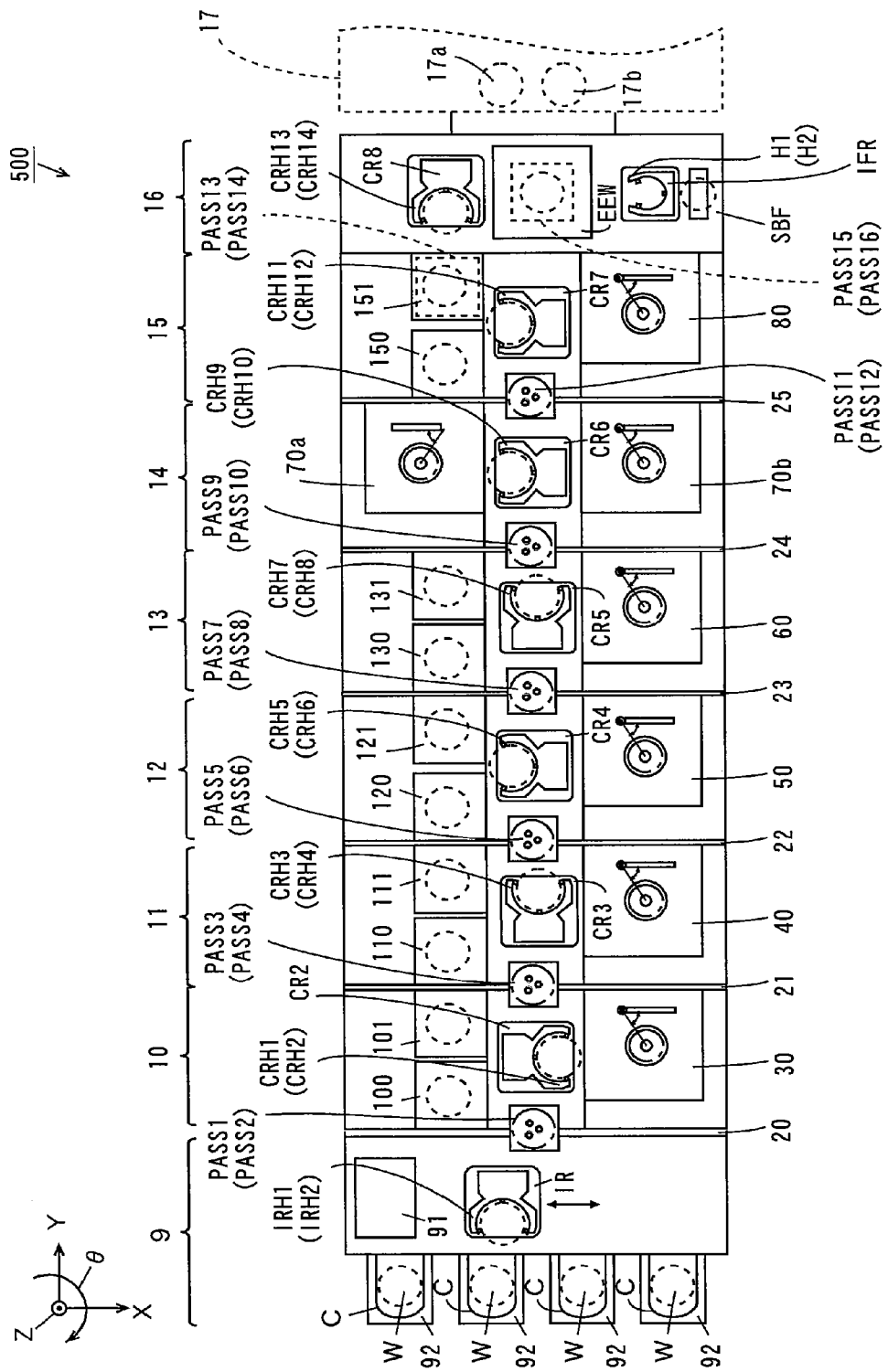
FIG. 1 is a schematic plan view of a substrate processing apparatus according to an embodiment of the present invention.

FIG. 1 is a schematic plan view of a substrate processing apparatus according to an embodiment of the present invention.

As shown in FIG. 1, a substrate processing apparatus 500 comprises an indexer block 9, an anti-reflection film processing block 10, a resist film processing block 11, a development processing block 12, a resist cover film processing block 13, a resist cover film removal block 14, a cleaning/drying processing block 15, and an interface block 16. In the substrate processing apparatus 500, the blocks are provided side by side in the foregoing order.

An exposure device 17 is arranged adjacent to the interface block 16 in the substrate processing apparatus 500. The exposure device 17 subjects a substrate W to exposure processing by means of an immersion method.

The indexer block 9 comprises a main controller (controller) 91 for controlling the operation of each of the blocks, a plurality of carrier platforms 92, and an indexer robot IR. The indexer robot IR has a vertical stack of hands IRH1 and IRH2 provided for exchanging the substrates W.

The anti-reflection film processing block 10 comprises thermal processing groups 100 and 101 for anti-reflection film, a coating processing group 30 for anti-reflection film, and a second central robot CR2. The coating processing group 30 is provided opposite to the thermal processing groups 100 and 101 with the second central robot CR2 interposed therebetween. The second central robot CR2 has hands CRH1 and CRH2 provided one above the other for exchanging the substrates W.

A partition wall 20 is provided between the indexer block 9 and the anti-reflection film processing block 10 for shielding an atmosphere. The partition wall 20 has substrate platforms PASS1 and PASS2 provided in close proximity one above the other for exchanging the substrates W between the indexer block 9 and the anti-reflection film processing block 10. The upper substrate platform PASS1 is used in transporting the substrates W from the indexer block 9 to the anti-reflection film processing block 10, and the lower substrate platform PASS2 is used in transporting the substrates W from the anti-reflection film processing block 10 to the indexer block 9.

Each of the substrate platforms PASS1 and PASS2 is provided with an optical sensor (not shown) for detecting the presence or absence of the substrate W. This allows determination to be made whether or not the substrate W is placed on the substrate platform PASS1 or PASS2. In addition, each of the substrate platforms PASS1 and PASS2 has a plurality of support pins secured thereto. Note that each of substrate platforms PASS3 to PASS16 described later is similarly provided with an optical sensor and support pins.

The resist film processing block 11 comprises thermal processing groups 110 and 111 for resist film, a coating processing group 40 for resist film, and a third central robot CR3. The coating processing group 40 is provided opposite to the thermal processing groups 110 and 111 with the third central robot CR3 interposed therebetween. The third central robot CR3 has hands CRH3 and CRH4 provided one above the other for exchanging the substrates W.

A partition wall 21 is provided between the anti-reflection film processing block 10 and the resist film processing block 11 for shielding an atmosphere. The partition wall 21 has substrate platforms PASS3 and PASS4 provided in close proximity one above the other for exchanging the substrates W between the anti-reflection film processing block 10 and the resist film processing block 11. The upper substrate platform PASS3 is used in transporting the substrates W from the anti-reflection film processing block 10 to the resist film processing block 11, and the lower substrate platform PASS4 is used in transporting the substrates W from the resist film processing block 11 to the anti-reflection film processing block 10.

The development processing block 12 comprises thermal processing groups 120 and 121 for development, a development processing group 50, and a fourth central robot CR4. The development processing group 50 is provided opposite to the thermal processing groups 120 and 121 with the fourth central robot CR4 interposed therebetween. The fourth central robot CR4 has hands CRH5 and CRH6 provided one above the other for exchanging the substrates W.

A partition wall 22 is provided between the resist film processing block 11 and the development processing block 12 for shielding an atmosphere. The partition wall 22 has substrate platforms PASS5 and PASS6 provided in close proximity one above the other for exchanging the substrates W between the resist film processing block 11 and the development processing block 12. The upper substrate platform PASS5 is used in transporting the substrates W from the resist film processing block 11 to the development processing block 12, and the lower substrate platform PASS6 is used in transporting the substrates W from the development processing block 12 to the resist film processing block 11.

The resist cover film processing block 13 comprises thermal processing groups 130 and 131 for resist cover film, a coating processing group 60 for resist cover film, and a fifth central robot CR5. The coating processing group 60 is provided opposite to the thermal processing groups 130 and 131 with the fifth central robot CR5 interposed therebetween. The fifth central robot CR5 has hands CRH7 and CRH8 provided one above the other for exchanging the substrates W.

A partition wall 23 is provided between the development processing block 12 and the resist cover film processing block 13 for shielding an atmosphere. The partition wall 23 has substrate platforms PASS7 and PASS8 provided in close proximity one above the other for exchanging the substrates W between the development processing block 12 and the resist cover film processing block 13. The upper substrate platform PASS7 is used in transporting the substrates W from the development processing block 12 to the resist cover film processing block 13, and the lower substrate platform PASS8 is used in transporting the substrates W from the resist cover film processing block 13 to the development processing block 12.

The resist cover film removal block 14 comprises removal processing groups 70a and 70b for resist cover film and a sixth central robot CR6. The removal processing groups 70a and 70b are provided opposite to each other with the sixth central robot CR6 interposed therebetween. The sixth central robot CR6 has hands CRH9 and CRH10 provided one above the other for exchanging the substrates W.

A partition wall 24 is provided between the resist cover film processing block 13 and the resist cover film removal block 14 for shielding an atmosphere. The partition wall 24 has substrate platforms PASS9 and PASS10 provided in close proximity one above the other for exchanging the substrates W between the resist cover film processing block 13 and the resist cover film removal block 14. The upper substrate platform PASS9 is used in transporting the substrates W from the resist cover film processing block 13 to the resist cover film removal block 14, and the lower substrate platform PASS10 is used in transporting the substrates W from the resist cover film removal block 14 to the resist cover film processing block 13.

The cleaning/drying processing block 15 comprises thermal processing groups 150 and 151 for post-exposure bake, a cleaning/drying processing group 80, and a seventh central robot CR7. The thermal processing group 151 is adjacent to the interface block 16, and comprises substrate platforms PASS13 and PASS14, as described later. The cleaning/drying processing group 80 is provided opposite to the thermal processing groups 150 and 151 with the seventh central robot CR7 interposed therebetween. The seventh central robot CR7 has hands CRH11 and CRH12 provided one above the other for exchanging the substrates W.

A partition wall 25 is provided between the resist cover film removal block 14 and the cleaning/drying processing block 15 for shielding an atmosphere. The partition wall 25 has substrate platforms PASS11 and PASS12 provided in close proximity one above the other for exchanging the substrates W between the resist cover film removal block 14 and the cleaning/drying processing block 15. The upper substrate platform PASS11 is used in transporting the substrates W from the resist cover film removal block 14 to the cleaning/drying processing block 15, and the lower substrate platform PASS12 is used in transporting the substrates W from the cleaning/drying processing block 15 to the resist cover film removal block 14.

The interface block 16 comprises an eighth central robot CR8, a sending buffer unit SBF, an interface transporting mechanism IFR, and an edge exposure unit EEW. Further, each of the substrate platforms PASS15 and PASS16 and a return buffer unit RBF are provided below the edge exposure unit EEW. The eighth central robot CR8 has hands CRH13 and CRH14 provided one above the other for exchanging the substrates W, and the interface transporting mechanism IFR has hands H1 and H2 provided one above the other for exchanging the substrates W.

Figure 2:
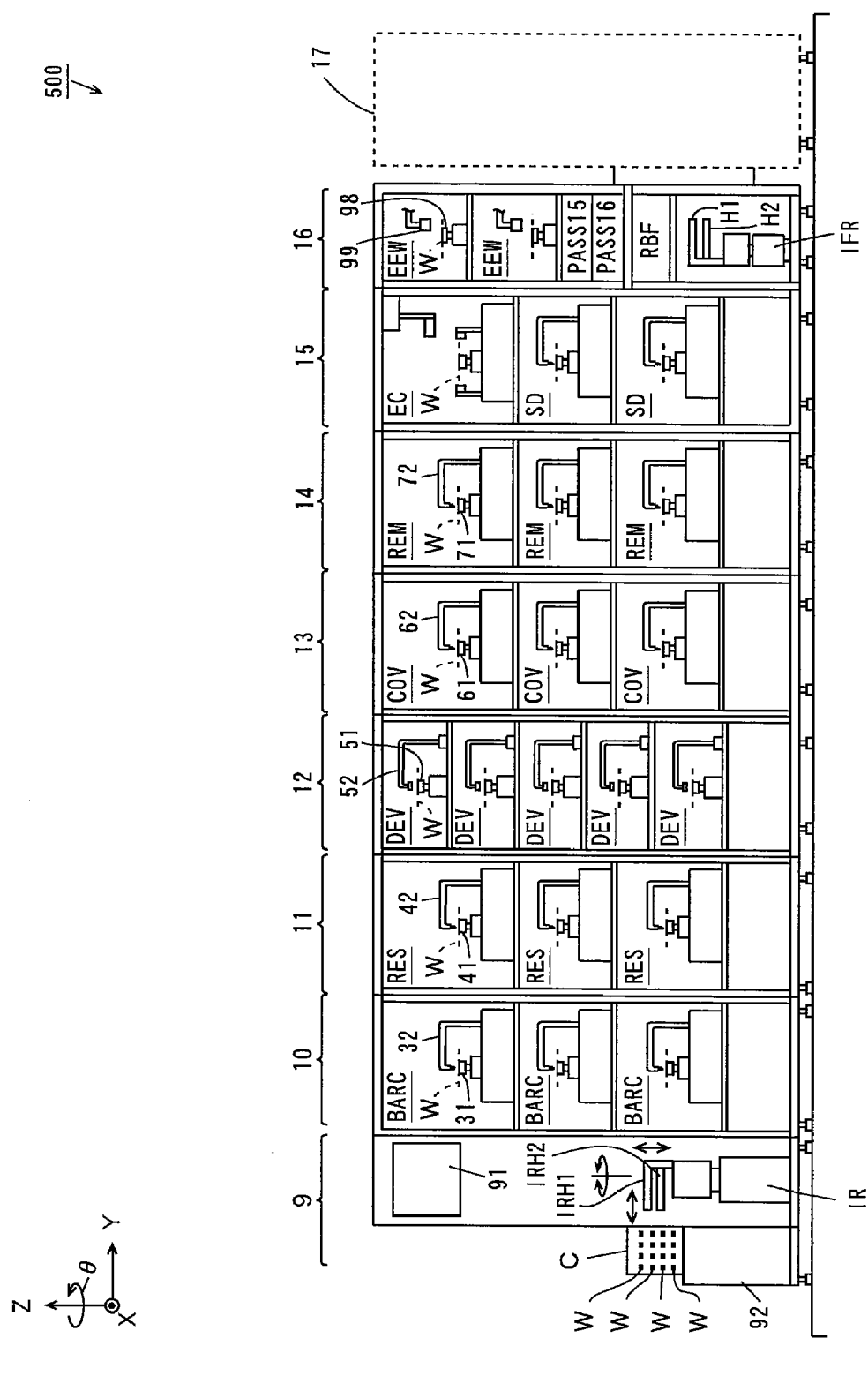
FIG. 2 is a side view of the substrate processing apparatus shown in FIG. 1 as viewed from the +X direction.

FIG. 2 is a side view of the substrate processing apparatus 500 shown in FIG. 1 as viewed from the +X direction.

The coating processing group 30 (see FIG. 1) in the anti-reflection film processing block 10 has a vertical stack of three coating units BARC. Each of the coating units BARC comprises a spin chuck 31 for rotating the substrate W with the substrate W held in a horizontal attitude by suction, and a supply nozzle 32 for supplying a coating liquid for an anti-reflection film to the substrate W held on the spin chuck 31.

The coating processing group 40 (see FIG. 1) in the resist film processing block 11 has a vertical stack of three coating units RES. Each of the coating units RES comprises a spin chuck 41 for rotating the substrate W with the substrate W held in a horizontal attitude by suction, and a supply nozzle 42 for supplying a coating liquid for a resist film to the substrate W held on the spin chuck 41.

The development processing group 50 (see FIG. 1) in the development processing block 12 has a vertical stack of five development processing units DEV. Each of the development processing units DEV comprises a spin chuck 51 for rotating the substrate W with the substrate W held in a horizontal attitude by suction, and a supply nozzle 52 for supplying a development liquid to the substrate W held on the spin chuck 51.

The coating processing group 60 (see FIG. 1) in the resist cover film processing block 13 has a vertical stack of three coating units COV. Each of the coating units COV comprises a spin chuck 61 for rotating the substrate W with the substrate W held in a horizontal attitude by suction, and a supply nozzle 62 for supplying a coating liquid for a resist cover film to the substrate W held on the spin chuck 61. Materials having a low affinity for resists and water (materials having low reactivity to resists and water) can be used as the coating liquid for the resist cover film. An example of the coating liquid is fluororesin. Each of the coating units COV forms a resist cover film on the resist film formed on the substrate W by applying the coating liquid onto the substrate W while rotating the substrate W.

The removal processing group 70b (see FIG. 1) in the resist cover film removal block 14 has a vertical stack of three removal units REM. Each of the removal units REM comprises a spin chuck 71 for rotating the substrate W with the substrate W held in a horizontal attitude by suction, and a supply nozzle 72 for supplying a stripping liquid (e.g. fluororesin) to the substrate W held on the spin chuck 71. Each of the removal units REM removes the resist cover film formed on the substrate W by applying the stripping liquid onto the substrate W while rotating the substrate W.

Note that a method of removing the resist cover film in the removal units REM is not limited to the above-mentioned example. For example, the resist cover film may be removed by supplying the stripping liquid onto the substrate W while moving a slit nozzle above the substrate W.

The cleaning/drying processing group 80 (see FIG. 1) in the cleaning/drying processing block 15 has a stack of one edge cleaning unit EC and two cleaning/drying processing units SD in this order. The details of the edge cleaning unit EC and the cleaning/drying processing unit SD will be described later.

The interface block 16 has a vertical stack of two edge exposure units EEW, substrate platforms PASS15 and PASS16, and a return buffer unit RBF, and has an eighth central robot CR8 (see FIG. 1) and an interface transporting mechanism IFR arranged therein. Each of the edge exposure units EEW comprises a spin chuck 98 for rotating the substrate W with the substrate held in a horizontal attitude by suction, and a light irradiator 99 for exposing a peripheral portion of the substrate W held on the spin chuck 98.

Figure 3:
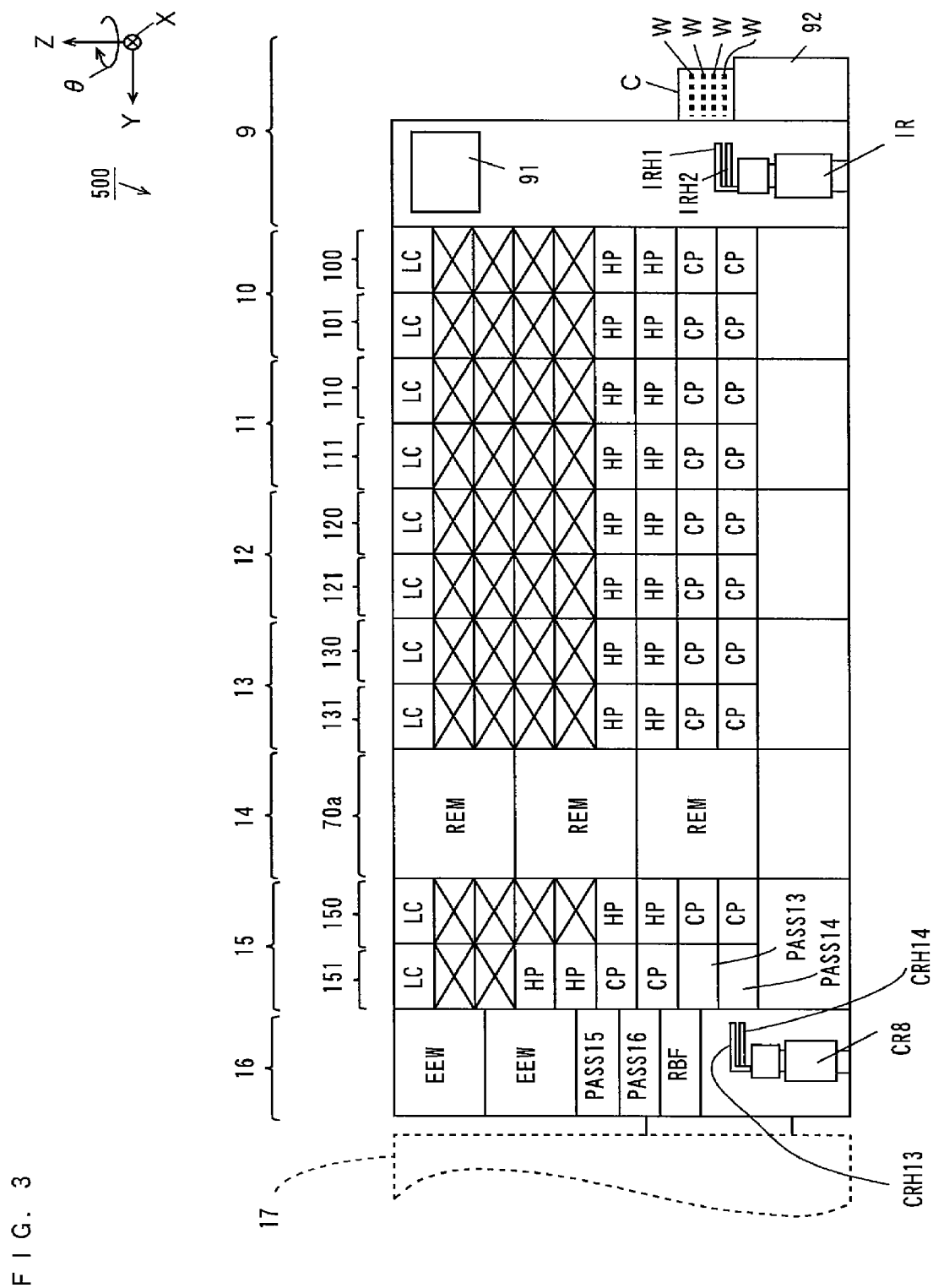
FIG. 3 is a side view of the substrate processing apparatus shown in FIG. 1 as viewed from the −X direction.

FIG. 3 is a side view of the substrate processing apparatus 500 shown in FIG. 1 as viewed from the −X direction.

In the processing block 10, the thermal processing group 100 has a vertical stack of two heating units (hot plates) HP and two cooling units (cooling plates) CP, and the thermal processing group 101 has a vertical stack of two heating units HP and two cooling units CP. Each of the thermal processing groups 100 and 101 also has a local controller LC for controlling the temperatures of the cooling unit CP and the heating unit HP arranged in its uppermost part.

In the resist film processing block 11, the thermal processing group 110 has a vertical stack of two heating units HP and two cooling units CP, and the thermal processing group 111 has a vertical stack of two heating units HP and two cooling units CP. Each of the thermal processing groups 110 and 111 also has a local controller LC for controlling the temperatures of the cooling unit CP and the heating unit HP arranged in its uppermost part.

In the development processing block 12, the thermal processing group 120 has a vertical stack of two heating units HP and two cooling units CP, and the thermal processing group 121 has a vertical stack of two heating units HP and two cooling units CP. Each of the thermal processing groups 120 and 121 also has a local controller LC for controlling the temperatures of the cooling unit CP and the heating unit HP arranged in its uppermost part.

In the resist cover film processing block 13, the thermal processing group 130 has a vertical stack of two heating units HP and two cooling units CP, and the thermal processing group 131 has a vertical stack of two heating units HP and two cooling units CP. Each of the thermal processing groups 130 and 131 also has a local controller LC for controlling the temperatures of the cooling unit CP and the heating unit HP arranged in its uppermost part.

The removal processing group 70a in the resist cover film removal block 14 has a vertical stack of three removal units REM.

In the cleaning/drying processing block 15, the thermal processing group 150 has a vertical stack of two heating units HP and two cooling units CP, and the thermal processing group 151 has a vertical stack of two heating units HP, two cooling units CP, and substrate platforms PASS13 and PASS14. Each of the thermal processing groups 150 and 151 has a local controller LC for controlling the respective temperatures of the cooling unit CP and the heating unit HP arranged in its uppermost part.

The respective numbers of edge cleaning units EC, coating units BARC, RES, and COV, cleaning/drying processing units SD, removal units REM, developing processing units DEV, heating units HP, and cooling units CP may be appropriately changed depending on the processing speed of each of the blocks.

(2) Operation of Substrate Processing Apparatus

The operation of the substrate processing apparatus 500 according to the present embodiment will be then described with reference to FIGS. 1 to 3.

Carriers C that store a plurality of substrates W in multiple stages are respectively carried onto the carrier platforms 92 in the indexer block 9. The indexer robot IR takes out the unprocessed substrate W that is stored in the carrier C using the upper hand IRH1. Thereafter, the indexer robot IR rotates in the ±θ direction while moving in the ±X direction, to place the unprocessed substrate W on the substrate platform PASS1.

Although FOUPs (Front Opening Unified Pods) are adopted as the carriers C in the present embodiment, the present invention is not limited to the same. For example, SMIF (Standard Mechanical Inter Face) pods, or OCs (Open Cassettes) that expose the stored substrates W to outside air may be used.

Furthermore, although linear-type transport robots that move their hands forward or backward by linearly sliding them to the substrate W are respectively used as the indexer robot IR, the second to eighth central robots CR2 to CR8, and the interface transporting mechanism IFR, the present invention is not limited to the same. For example, multi joint type transport robots that linearly move their hands forward and backward by moving their joints may be used.

The substrate W placed on the substrate platform PASS1 is received by the second central robot CR2 in the processing block 10. The second central robot CR2 carries the substrate W into the coating processing group 30. The coating processing group 30 forms a coating of an anti-reflection film on the substrate W using the coating unit BARC in order to reduce standing waves and halation generated during the exposure processing.

Thereafter, the second central robot CR2 then takes out the substrate W after the coating processing from the coating processing group 30, and carries the substrate W into the thermal processing group 100 or 101.

Then, the second central robot CR2 takes out the thermally processed substrate W from the thermal processing group 100 or 101, and places the substrate W on the substrate platform PASS3.

The substrate W placed on the substrate platform PASS3 is received by the third central robot CR3 in the resist film processing block 11. The third central robot CR3 carries the substrate W into the coating processing group 40. In the coating processing group 40, the coating unit RES forms a coating of a resist film on the substrate W coated with the anti-reflection film.

Thereafter, the third central robot CR3 takes out the substrate W after the coating processing from the coating processing group 40, and carries the substrate W into the thermal processing group 110 or 111. Then, the third central robot CR3 takes out the thermally processed substrate W from the thermal processing group 110 or 111, and places the substrate W on the substrate platform PASS5.

The substrate W placed on the substrate platform PASS5 is received by the fourth central robot CR4 in the development processing block 12. The fourth central robot CR4 places the substrate W on the substrate platform PASS7.

The substrate W placed on the substrate platform PASS7 is received by the fifth central robot CR5 in the resist cover film processing block 13. The fifth central robot CR5 carries the substrate W into the coating processing group 60. In the coating processing group 60, the coating unit COV forms a coating of a resist cover film over the resist film, as described above.

Thereafter, the fifth central robot CR5 takes out the substrate W after the coating processing from the coating processing group 60, and carries the substrate W into the thermal processing group 130 or 131. Then, the fifth central robot CR5 takes out the thermally processed substrate W from the thermal processing group 130 or 131, and places the substrate W on the substrate platform PASS9.

The substrate W placed on the substrate platform PASS9 is received by the sixth central robot CR6 in the resist cover film removal block 14. The sixth central robot CR6 places the substrate W on the substrate platform PASS11.

The substrate W placed on the substrate platform PASS11 is received by the seventh central robot CR7 in the cleaning/drying processing block 15.

Here, in the present embodiment, the substrate W is subjected to edge cleaning processing, described later, before the exposure processing by the exposure device 17. The seventh central robot CR7 carries the received substrate W into the edge cleaning unit EC in the cleaning/drying processing block 80. The substrate W carried into the edge cleaning unit EC is subjected to the edge cleaning processing.

The seventh central robot CR7 then takes out the substrate W after the edge cleaning processing from the edge cleaning unit EC, and places the substrate W on the substrate platform PASS13.

The substrate W placed on the substrate platform PASS13 is received by the eighth central robot CR8 in the interface block 16. The eighth central robot CR8 carries the substrate W into the edge exposure unit EEW. In the edge exposure unit EEW, the peripheral portion of the substrate W is subjected to the exposure processing.

Then, the eighth central robot CR8 takes out the substrate W after the edge exposure processing from the edge exposure unit EEW, and places the substrate W on the substrate platform PASS15.

The interface transporting mechanism IFR carries the substrate W placed on the substrate platform PASS15 into a substrate carry-in section 17a (see FIG. 1.) in the exposure device 17.

When the exposure device 17 cannot receive the substrate W, the substrate W is temporarily stored in the sending buffer unit SBF.

After the exposure device 17 subjects the substrate W to the exposure processing, the interface transporting mechanism IFR takes out the substrate W from an exposure device 17b (see FIG. 1) in the exposure device 17 and carries the same into the cleaning/drying processing group 80 in the cleaning/drying processing block 15. In the cleaning/drying processing unit SD in the cleaning/drying processing group 80, the substrate W after the exposure processing is subjected to cleaning and drying processing. The details will be described later.

After the cleaning/drying processing group 80 subjects the substrate W after the exposure processing to the cleaning and drying processing, the interface transporting mechanism IFR takes out the substrate W from the cleaning/drying processing group 80, and places the same on the substrate platform PASS16. The details of the operations of the interface transporting mechanism IFR in the interface block 16 will be described later.

When the cleaning/drying processing group 80 cannot temporarily perform the cleaning and drying processing due to a failure or the like, the substrate W after the exposure processing can be temporarily stored in the return buffer unit RBF in the interface block 16.

The substrate W placed on the substrate platform PASS16 is received by the eighth central robot CR8 in the interface block 16. The eighth central robot CR8 carries the substrate W into the thermal processing group 151 in the cleaning/drying processing block 15. In the thermal processing group 151, the substrate W is subjected to post-exposure bake (PEB). Thereafter, the eighth central robot CR8 takes out the substrate W from the thermal processing group 151, and places the substrate W on the substrate platform PASS14.

Although the thermal processing group 151 subjects the substrate W to post-exposure bake in the present embodiment, the thermal processing group 150 may subject the substrate W to post-exposure bake.

The substrate W placed on the substrate platform PASS14 is received by the seventh central robot CR7 in the cleaning/drying processing block 15. The seventh central robot CR7 places the substrate W on the substrate platform PASS12.

The substrate W placed on the substrate platform PASS12 is received by the sixth central robot CR6 in the resist cover film removal block 14. The sixth central robot CR6 carries the substrate W into the resist cover film removal processing group 70a or 70b. In the resist cover film removal processing group 70a or 70b, a removal unit REM removes the resist cover film on the substrate W.

Thereafter, the sixth central robot CR6 takes out the processed substrate W from the resist cover film removal processing group 70a or 70b, and places the substrate W on the substrate platform PASS10.

The substrate W placed on the substrate platform PASS10 is received by the fifth central robot CR5 in the resist cover film processing block 13. The fifth central robot CR5 places the substrate W on the substrate platform PASS8.

The substrate W placed on the substrate platform PASS8 is received by the fourth central robot CR4 in the development processing block 12. The fourth central robot CR4 carries the substrate W into the development processing group 50. In the development processing group 50, the development processing unit DEV subjects the substrate W to development processing.

Thereafter, the fourth central robot CR4 takes out the substrate W after the development processing from the development processing group 50, and carries the substrate W into the thermal processing group 120 or 121.

The fourth central robot CR4 then takes out the substrate W after thermal processing from the thermal processing group 120 or 121, and places the substrate W on the substrate platform PASS6.

The substrate W placed on the substrate platform PASS6 is received by the third central robot CR3 in the resist film processing block 11. The third central robot CR3 places the substrate W on the substrate platform PASS4.

The substrate W placed on the substrate platform PASS4 is received by the second central robot CR2 in the processing block 10. The second central robot CR2 places the substrate W on the substrate platform PASS2.

The substrate W placed on the substrate platform PASS2 is stored in the carrier C by the indexer robot IR in the indexer block 9.

(3) As to Edge Cleaning Unit

The above-mentioned edge cleaning unit EC will be herein described in detail with reference to the drawings. Note that the operation of each of constituent elements in the edge cleaning unit EC, described below, is controlled by the main controller (controller) 91 shown in FIG. 1.

(3-a) Configuration of Edge Cleaning Unit

Figure 4:
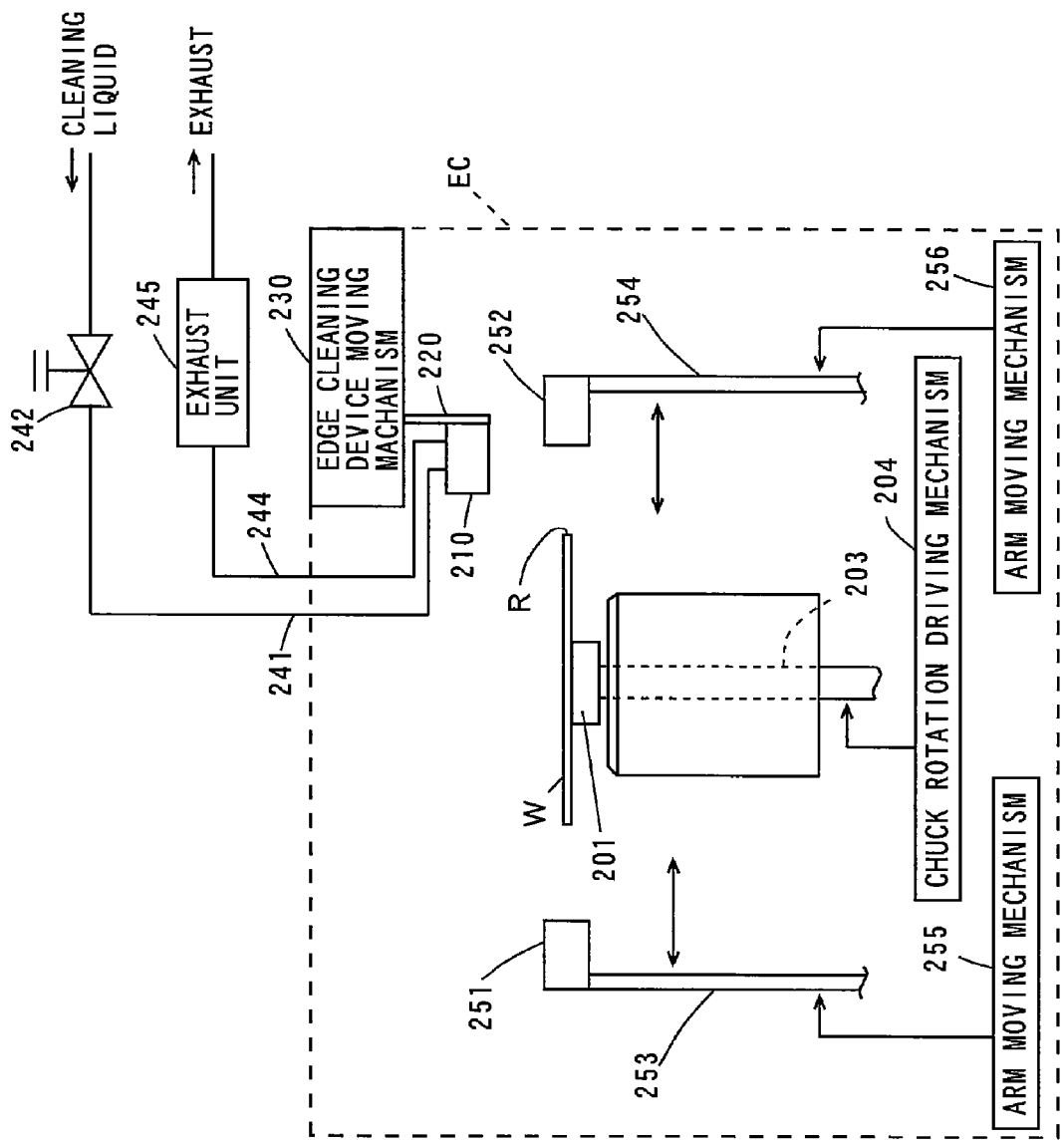
FIG. 4 is a diagram for explaining the configuration of an edge cleaning unit.

FIG. 4 is a diagram for explaining the configuration of the edge cleaning unit EC. As shown in FIG. 4, the edge cleaning unit ED comprises a spin chuck 201 for rotating a substrate W about a vertical rotation shaft passing through the center of the substrate W while horizontally holding the substrate W.

The spin chuck 201 is secured to an upper end of a rotation shaft 203, which is rotated by a chuck rotation driving mechanism 204. A suction path (not shown) is formed in the spin chuck 201. Air inside the suction path is exhausted with the substrate W placed on the spin chuck 201, to adsorb a back surface of the substrate W on the spin chuck 201 under vacuum, so that the substrate W can be held in a horizontal attitude.

Note that the seventh central robot CR7 shown in FIG. 1 places the substrate W such that the center of the substrate W coincides with the axis of the spin chuck 201. In a case where the operational accuracy of the seventh central robot CR7 is low, however, the substrate W may, in some cases, be placed with the center of the substrate W not coinciding with the axis of the spin chuck 201. When the substrate W is held by the spin chuck 201 in such a state, the substrate W rotates in an eccentric state during edge cleaning processing of the substrate W, described later, so that an edge R of the substrate W cannot be uniformly cleaned. In the present embodiment, therefore, the position of the substrate W is corrected before the edge cleaning processing of the substrate W. The details will be described later.

An edge cleaning device moving mechanism 230 is provided beside the spin chuck 201 and in an upper part of the edge cleaning unit EC. A stick-shaped supporting member 220 extending downward is attached to the edge cleaning device moving mechanism 230. The supporting member 220 moves in the vertical direction and the horizontal direction by the edge cleaning device moving mechanism 230.

An edge cleaning device 210 having a substantially cylindrical shape is attached to a lower end of the supporting member 220 so as to extend in the horizontal direction. This causes the edge cleaning device 210, together with the supporting member 220, to move by the edge cleaning device moving mechanism 230.

This causes one end of the edge cleaning device 210 to be opposed to the edge R of the substrate W. In the following description, the one end, which is opposed to the edge R of the substrate W, of the edge cleaning device 210 is taken as a front.

The definition of the edge R of the substrate W will be herein described while referring to the following drawings.

Figure 5:
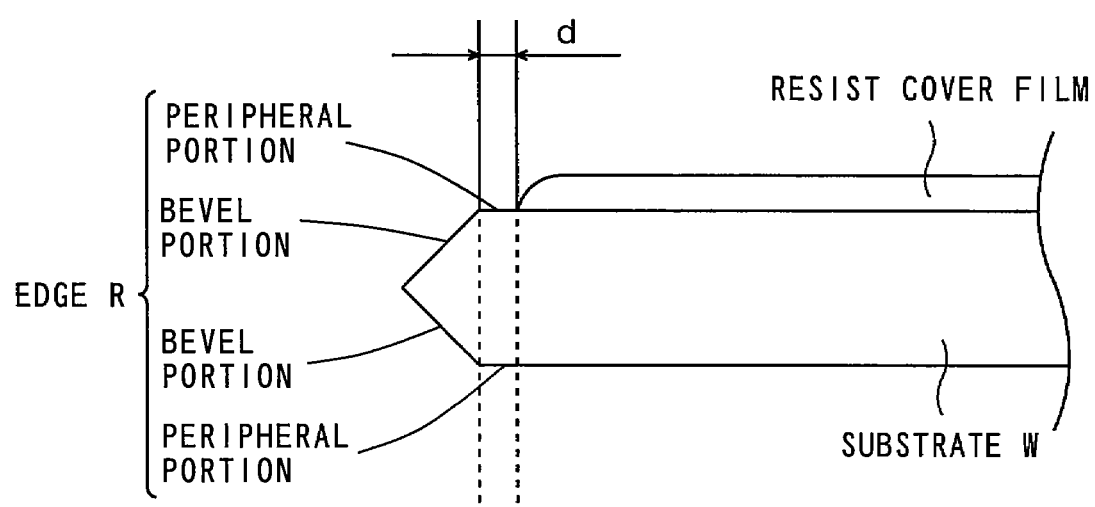
FIG. 5 is a schematic view for explaining an edge of a substrate.

FIG. 5 is a schematic view for explaining the edge R of the substrate W. As shown in FIG. 5, an anti-reflection film and a resist film (both are not illustrated) and a resist cover film, described above, are formed on the substrate W.

The substrate W has an end surface. The end surface is as schematically illustrated in FIG. 5. The end surface is generally referred to as a bevel portion. A region inwardly spaced a distance d apart from an end of a surface of the substrate W on which the resist cover film is formed is generally referred to as a peripheral portion. In the present embodiment, the bevel portion and the peripheral portion are generically referred to as an edge R. The distance d is 2 to 3 mm, for example. The edge R need not include the peripheral portion. In this case, the edge cleaning unit EC cleans only the bevel portion on the substrate W.

Generally, the resist cover film may not be formed so as to cover the peripheral portion on the substrate W in many cases. That is, one or both of the anti-reflection film and the resist film formed in the peripheral portion on the substrate W is/are exposed.

Returning to FIG. 4, the edge cleaning device 210 moves to a position in the vicinity of the edge R of the substrate W on the spin chuck 201 by the edge cleaning device moving mechanism 230 during the edge cleaning processing of the substrate W, while waiting above a guide arm 252, described later, in a time period during which the edge cleaning processing is not performed.

The edge cleaning device 210 has a space in its inner part (a cleaning chamber 211, described later). A cleaning liquid supply pipe 241 and an exhaust pipe 244 are connected to the edge cleaning device 210. The cleaning liquid supply pipe 241 is connected to a cleaning liquid supply system (not shown) through a valve 242. By opening the valve 242, a cleaning liquid is supplied to the inner space of the edge cleaning device 210 through the cleaning liquid supply pipe 241.

Furthermore, the exhaust pipe 244 is connected to an exhaust unit 245. The exhaust unit 245 sucks in an atmosphere in the inner space of the edge cleaning device 210, and exhausts the air through the exhaust pipe 244. The details of the edge cleaning device 210 will be described later.

A pair of guide arms 251 and 252 is provided outside the spin chuck 201. The guide arms 251 and 252 are arranged opposite to each other with the substrate W held by the spin chuck 201 interposed therebetween.

The guide arms 251 and 252 are respectively supported by supporting members 253 and 254 extending downward. The supporting members 253 and 254 respectively move in the horizontal direction by arm moving mechanisms 255 and 256. As the supporting members 253 and 254 move, the guide arms 251 and 252 respectively move in directions nearer to and away from the substrate W. The positions where the guide arms 251 and 252 are farthest away from the outer periphery of the substrate W are respectively referred to as waiting positions.

Figure 6:
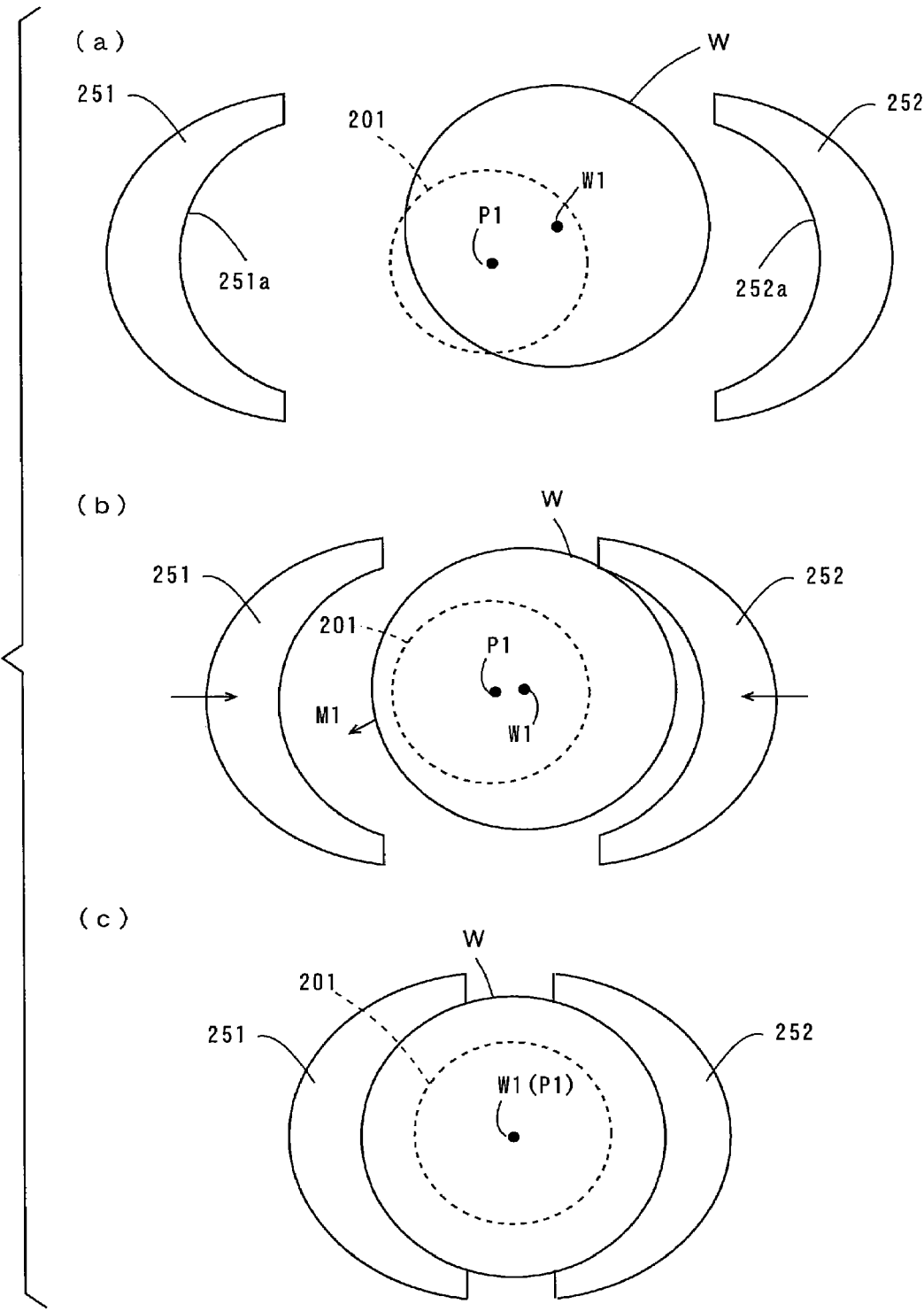
FIG. 6 is a diagram for explaining the details of the shape and the operation of a guide arm.

The shape and the operation of the guide arms 251 and 252 will be herein described with reference to FIG. 6. FIG. 6 is a top view of the guide arms 251 and 252 and the substrate W.

As shown in FIGS. 6 (a) and 6 (b), the guide arm 251 has a semi-cylindrical shape, and has its inner surface 251a formed along the circular arc of the substrate W. The guide arm 252 has a shape equal to the guide arm 251, and has its inner surface 252a formed along the circular arc of the substrate W. The guide arms 251 and 252 are arranged so as to be symmetrical around an axis P1 of the spin chuck 201. Note that the axis P1 of the spin chuck 201 is equal to the axis of the rotation shaft 203 (FIG. 4).

The operation of the guide arms 251 and 252 will be then described.

The seventh central robot CR7 (FIG. 1) carries the substrate W into the edge cleaning unit EC, and places the substrate W on the spin chuck 201 with the guide arms 251 and 252 at the respective waiting positions farthest away from the axis P1 of the spin chuck 201, as shown in FIG. 6 (a).

The guide arms 251 and 252 then respectively move toward the axis P1 of the spin chuck 201 at equal speeds, as shown in FIG. 6 (b). At this time, in a case where the center W1 of the substrate W is shifted from the axis P1 of the spin chuck 201, the substrate W is pressed by at least one of the guide arms 251 and 252. Thus, the substrate W moves such that the center W1 of the substrate W comes closer to the axis P1 of the spin chuck 201 (see an arrow M1 in FIG. 6 (b)).

When the guide arms 251 and 252 move toward the axis P1 of the spin chuck 201, as shown in FIG. 6 (c), the substrate W is sandwiched between the guide arms 251 and 252, so that the center W1 of the substrate W coincides with the axis P1 of the spin chuck 201.

The guide arms 251 and 252 thus correct the position of the substrate W such that the center W1 of the substrate W coincides with the axis P1 of the spin chuck 201.

Note that the operation of the guide arms 251 and 252 is performed with the edge cleaning device 210 shown in FIG. 4 waiting above the guide arm 252.

Figure 7:
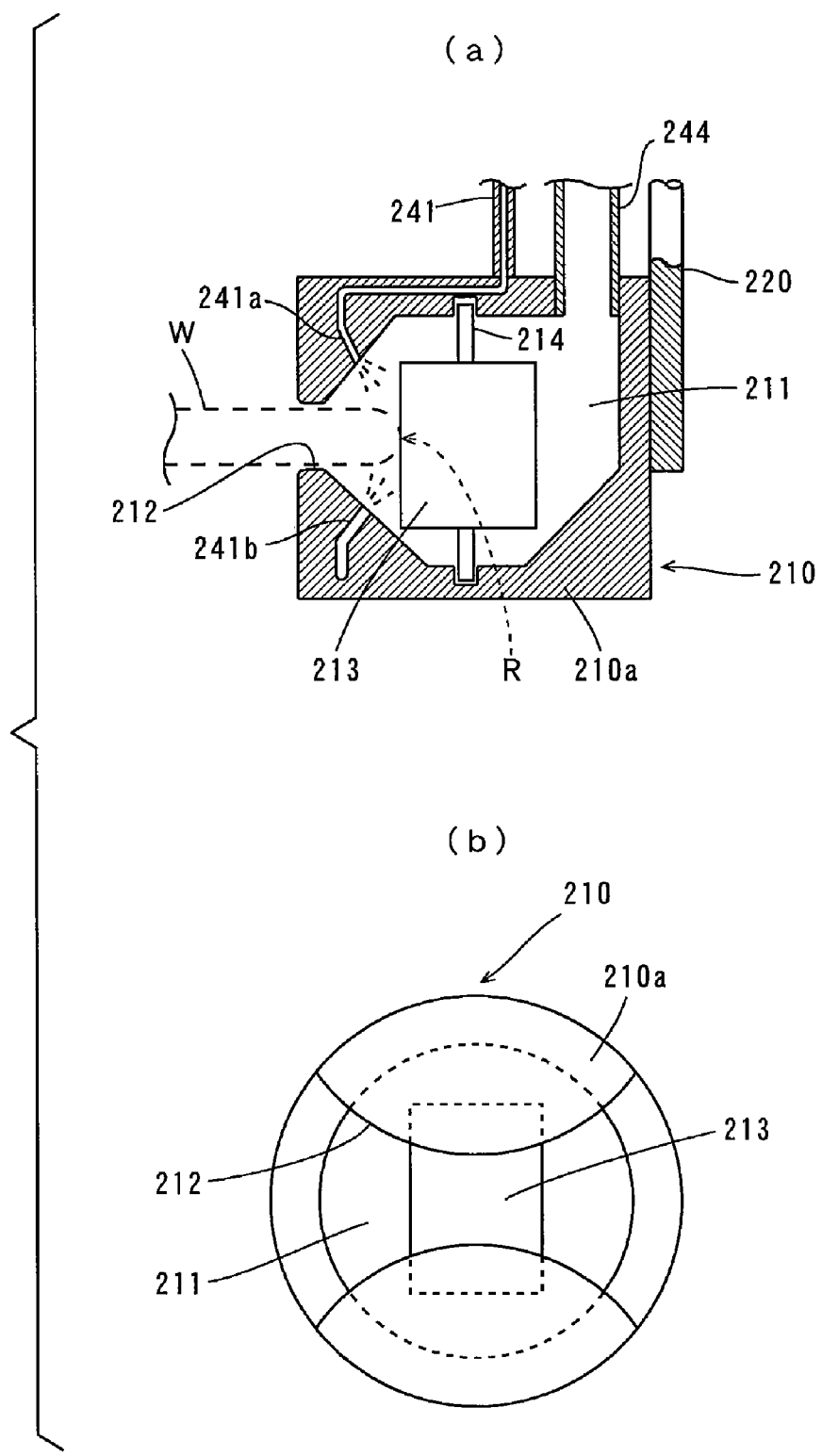
FIG. 7 is a diagram for explaining the configuration of an edge cleaning device in the edge cleaning unit shown in FIG. 4.

The details of the edge cleaning device 210 will be then described. FIG. 7 is a diagram for explaining the configuration of the edge cleaning device 210 in the edge cleaning unit EC shown in FIG. 4. FIG. 7 (a) is a vertical sectional view of the edge cleaning device 210, and FIG. 7 (b) is a front view of the edge cleaning device 210.

As shown in FIG. 7 (a), a cleaning chamber 211 is formed inside a substantially cylindrical housing 210a in the edge cleaning device 210.

As shown in FIGS. 7 (a) and 7 (b), an opening 212 for causing the cleaning chamber 211 and the outside of the housing 210a to communicate with each other is formed on a front of the housing 210a. The opening 212 has an upper surface and a lower surface in a circular arc shape such that the vertical width thereof is gradually enlarged sideward on both sides from the center thereof. During the edge cleaning processing of the substrate W, the edge R of the substrate W held by suction on the spin chuck 201 is inserted into the opening 212.

A brush 213 having a substantially cylindrical shape is arranged so as to extend in the vertical direction within the cleaning chamber 211. The brush 213 is attached to a rotation shaft 214 extending in the vertical direction. An upper end and a lower end of the rotation shaft 214 are respectively attached to rotation bearings formed at the top and the bottom of the cleaning chamber 211. This causes the brush 213 to be rotatably supported by the cleaning chamber 211 and the rotation shaft 214.

During the edge cleaning processing of the substrate W, the edge R of the rotating substrate W and the brush 213 come into contact with each other. This causes the edge R of the substrate W to be cleaned with the brush 213.

Here, in the edge cleaning unit EC shown in FIG. 4, the rotation shaft 214 having the brush 213 attached thereto is arranged so as to be substantially parallel to the rotation shaft 203 having the spin chuck 201 secured thereto. This causes the brush 213 to rotate with the brush 213 brought into reliable contact with the edge R of the rotating substrate W.

The cleaning liquid supply pipe 241 and the exhaust pipe 244, described above, are connected to the top of the edge cleaning device 210.

The cleaning liquid supply pipe 241 is connected to cleaning liquid supply paths 241a and 241b formed within the housing 210a. As shown in FIG. 7 (a), the cleaning liquid supply path 241a extends to an inner surface at the top of the cleaning chamber 211 from the outside of the housing 210a. The cleaning liquid supply path 241b extends to an inner surface at the bottom of the cleaning chamber 211 from the outside of the housing 210a. FIG. 7 (a) illustrates only a part of the cleaning liquid supply pipe 241b.

Such a configuration causes a cleaning liquid supplied to the edge cleaning device 210 to be sprayed in the vertical direction toward the edge R of the substrate W coming into contact with the brush 213 within the cleaning chamber 211 during the edge cleaning processing of the substrate W. This causes the edge R of the substrate W to be efficiently cleaned.

The exhaust pipe 244 is inserted into the cleaning chamber 211 through a hole provided at the top of the housing 210a. This causes an atmosphere in the cleaning chamber 211 to be sucked in by the exhaust unit 245 shown in FIG. 4 and exhausted through the exhaust pipe 244.

In the cleaning chamber 211, the exhaust unit 245 exhausts the atmosphere inside thereof, so that the volatilized cleaning liquid and a mist of the cleaning liquid are efficiently exhausted.

In the foregoing, an example of the cleaning liquid supplied to the edge cleaning device 210 and sprayed on the edge R of the substrate W is any one of a predetermined resist solvent, a fluorine-based medical liquid, an ammonia/hydrogen peroxide mixture, and a liquid used for the immersion method in the exposure device 17.

Another example of the cleaning liquid may be any one of pure water, a pure water solution containing a complex (ionized), carbonic water, hydrogen water, electrolytic ionic water, HFE (hydrofluoroether), hydrofluoric acid, sulfuric acid, and a sulfuric acid/hydrogen peroxide mixture.

(3-b) Another Example of Configuration of Edge Cleaning Unit

Figure 8:
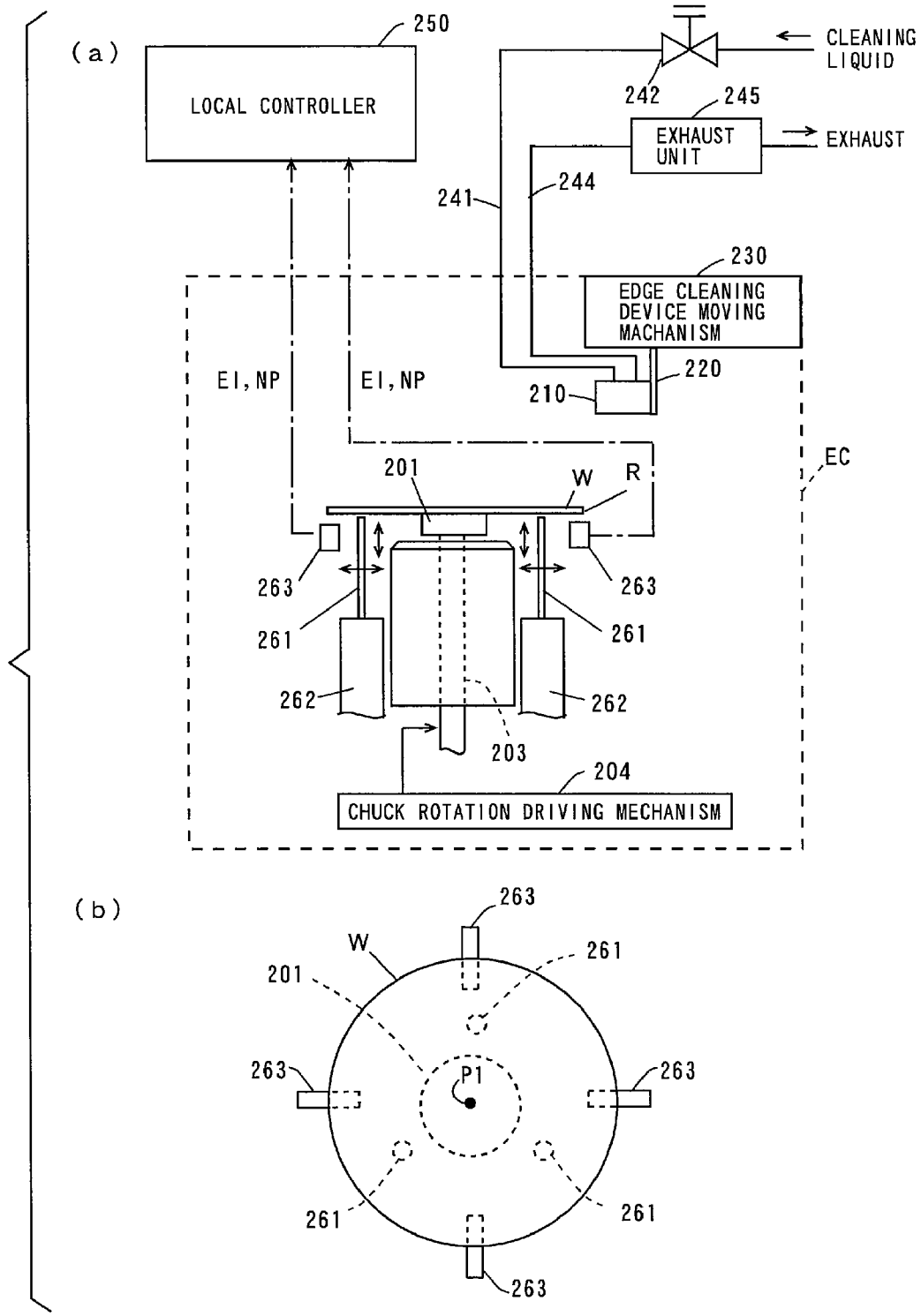
FIG. 8 is a diagram for explaining another example of the configuration of an edge cleaning unit.

The edge cleaning unit EC may have the following configuration. FIG. 8 is a diagram for explaining another example of the configuration of the edge cleaning unit EC. FIG. 8 (a) is a side view showing another example of the configuration of the edge cleaning unit EC, and FIG. 8 (b) is a top view of a part of the edge cleaning unit EC shown in FIG. 8 (a). The difference between the edge cleaning unit EC shown in FIG. 8 and the edge cleaning unit EC shown in FIG. 4 will be described.

As shown in FIGS. 8 (a) and 8 (b), three or more correction pins 261 extending in the vertical direction are provided beside a rotation shaft 203 and a spin chuck 201. In the present embodiment, the three correction pins 261 are provided. The correction pins 261 are arranged at substantially equal angles around the axis P1 of the spin chuck 201. Further, the three correction pins 261 are movable integrally with one another in the vertical direction and the horizontal direction by pin driving devices 262.

Furthermore, four eccentricity sensors 263 are provided outside the correction pins 261 and in the vicinity of an edge R of a substrate W placed on the spin chuck 201. The four eccentricity sensors 263 are arranged at substantially equal angles around the axis P1 of the spin chuck 201.

The eccentricity sensor 263 detects the eccentricity amount of the substrate W from the axis P1 of the spin chuck 201 and the position of a notch of the substrate W, and feeds an eccentric signal EI and a notch position signal NP to a local controller 250 for controlling the operation of the edge cleaning unit EC. Here, the notch of the substrate W refers to a notch formed at the edge R of the substrate W in order to easily determine the direction or the like of the substrate W. An example of the eccentricity sensor 263 is a CCD (Charge Coupled Device) line sensor.

An edge cleaning device 210, a supporting member 220, an edge cleaning device moving machine 230, and a supply system and an exhaust system of a cleaning liquid have the same configurations and functions as those of the edge cleaning unit EC shown in FIG. 4.

In the edge cleaning unit EC shown in FIG. 8, the eccentricity amount of the substrate W is detected by the eccentricity sensor 263, and the position of the substrate W is corrected by the correction pins 261.

Figure 9:
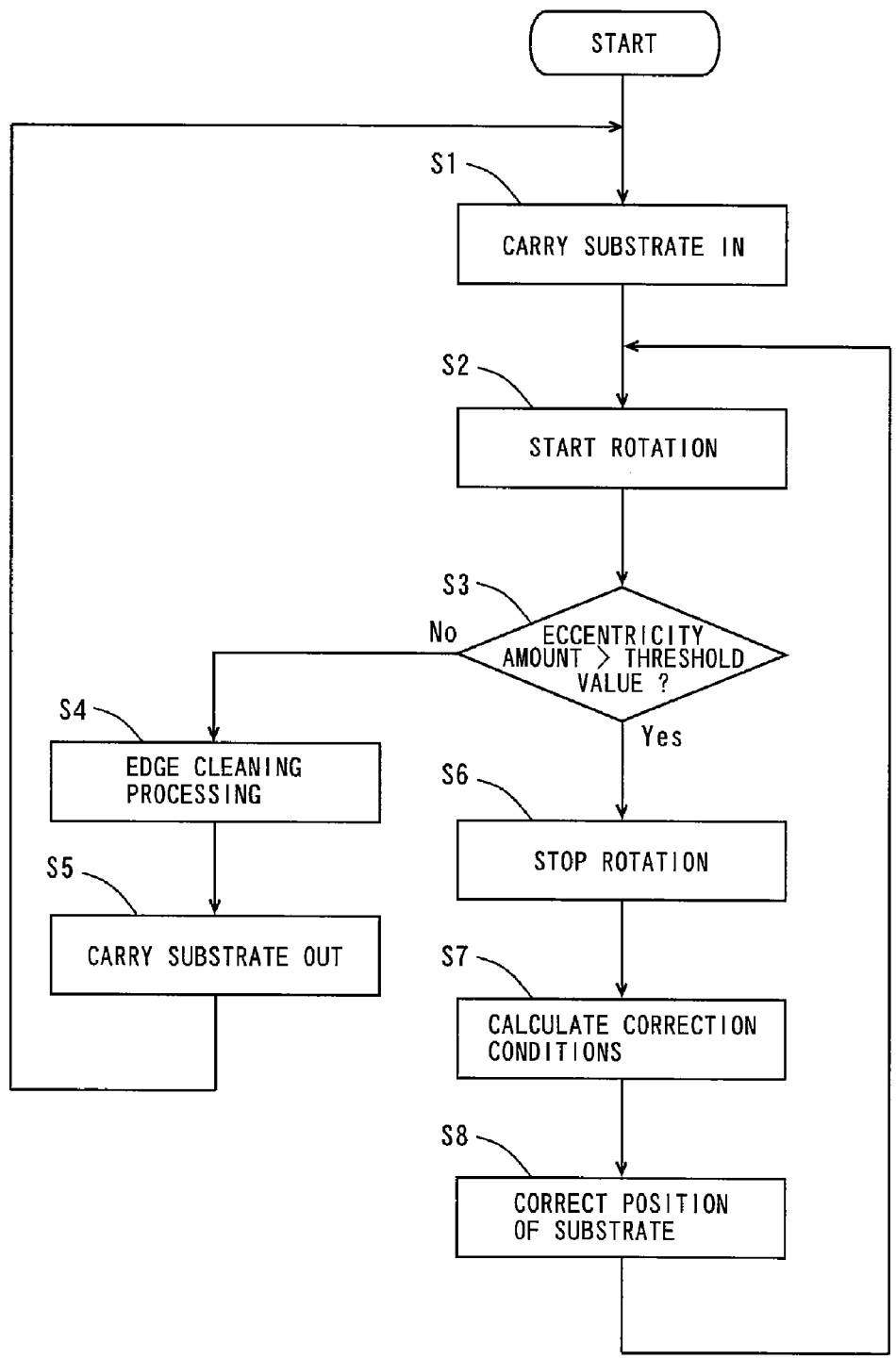
FIG. 9 is a flow chart showing an example of control of an edge cleaning unit by a local controller.

The correction of the position of the substrate W in the edge cleaning unit EC shown in FIG. 8 will be herein described with reference to FIG. 9. FIG. 9 is a flow chart showing an example of control of the edge cleaning unit EC by the local controller 250.

As shown in FIG. 9, the local controller 250 causes the seventh central robot CR7 to carry the substrate W into the edge cleaning unit EC (step S1). The substrate W carried into the edge cleaning unit EC is held on the spin chuck 201. The local controller 250 then causes the chuck rotation driving mechanism 204 to start the rotation of the rotation shaft 203 to start the rotation of the substrate W held on the spin chuck 201 (step S2).

The local controller 250 then determines whether or not the eccentricity amount of the substrate W from the axis of the rotation shaft 203 is larger than a threshold value on the basis of the eccentric signal EI fed from the eccentricity sensor 263 (step S3).

When the eccentricity amount of the substrate W from the axis of the rotation shaft 203 is not more than the threshold value in the step S3, the local controller 250 causes the edge cleaning device 210 (FIG. 4) to subject the substrate W to edge cleaning processing (step S4). The edge cleaning processing of the substrate W in the step S4 is the same as the edge cleaning processing of the substrate W in the edge cleaning unit EC shown in FIG. 4.

Thereafter, the local controller 250 causes the seventh central robot CR7 to carry the substrate W out of the edge cleaning unit EC (step S5). Thereafter, the procedure is returned to the processing in the step S1.

In a case where the eccentricity amount of the substrate W from the axis of the rotation shaft 203 is more than the threshold value in the step S3, the local controller 250 causes the chuck rotation driving mechanism 204 to stop the rotation of the rotation shaft 203 to stop the rotation of the substrate W (step S6) and causes the spin chuck 201 to release the holding of the substrate W.

The local controller 250 then calculates the position correction conditions of the substrate W on the basis of the eccentric signal EI and the notch position signal NP (step S7). Here, the position correction conditions of the substrate W are conditions under which the substrate W moves such that the center W1 of the substrate W (FIG. 6) coincides with the axis P1 of the spin chuck 201, and include the movement direction and the movement distance of the substrate W.

The local controller 250 then corrects the position of the substrate W using the correction pins 261 on the basis of the results of the calculation of the position correction conditions of the substrate W in the step S6 (step S8). Specifically, the three correction pins 261 integrally move upward to support the substrate W at three points. The correction pins 261 then move in the horizontal direction such that the center W1 of the substrate W (FIG. 6) coincides with the axis P1 of the spin chuck 201 (FIG. 6). The correction pins 261 move downward to place the substrate W on the spin chuck 201, so that the spin chuck 201 holds the substrate W. This causes the position of the substrate W to be corrected. Thereafter, the procedure is returned to the processing in the step S2.

In the step S8, the correction pin 261 may be replaced with the seventh central robot CR7 to correct the position of the substrate W. In the case, the necessity of providing the correction pins 261 and the pin driving devices 262 is eliminated, thereby allowing the edge cleaning unit EC to be miniaturized and made lightweight.

Although in the example shown in FIG. 8, four eccentricity sensors 263 are provided within the edge cleaning unit EC, the number of eccentricity sensors 263 may be suitably changed depending on the size of the substrate W, for example.

Although in the example shown in FIG. 8, the eccentricity amount of the substrate W is detected with the substrate W rotated, the eccentricity amount of the substrate W may be detected with the rotation of the substrate W stopped. When the eccentricity amount is detected with the rotation of the substrate W stopped in a case where the number of eccentricity sensors 263 provided within the edge cleaning unit EC is one or two, for example, the accurate eccentricity amount cannot, in some cases, be detected depending on the direction of eccentricity of the substrate W. When the number of eccentricity sensors 263 provided within the edge cleaning unit EC is one or two, for example, therefore, it is preferable that the eccentricity amount of the substrate W is detected with the substrate W rotated.

(3-c) Still Another Example of Configuration of Edge Cleaning Unit

Figure 10:
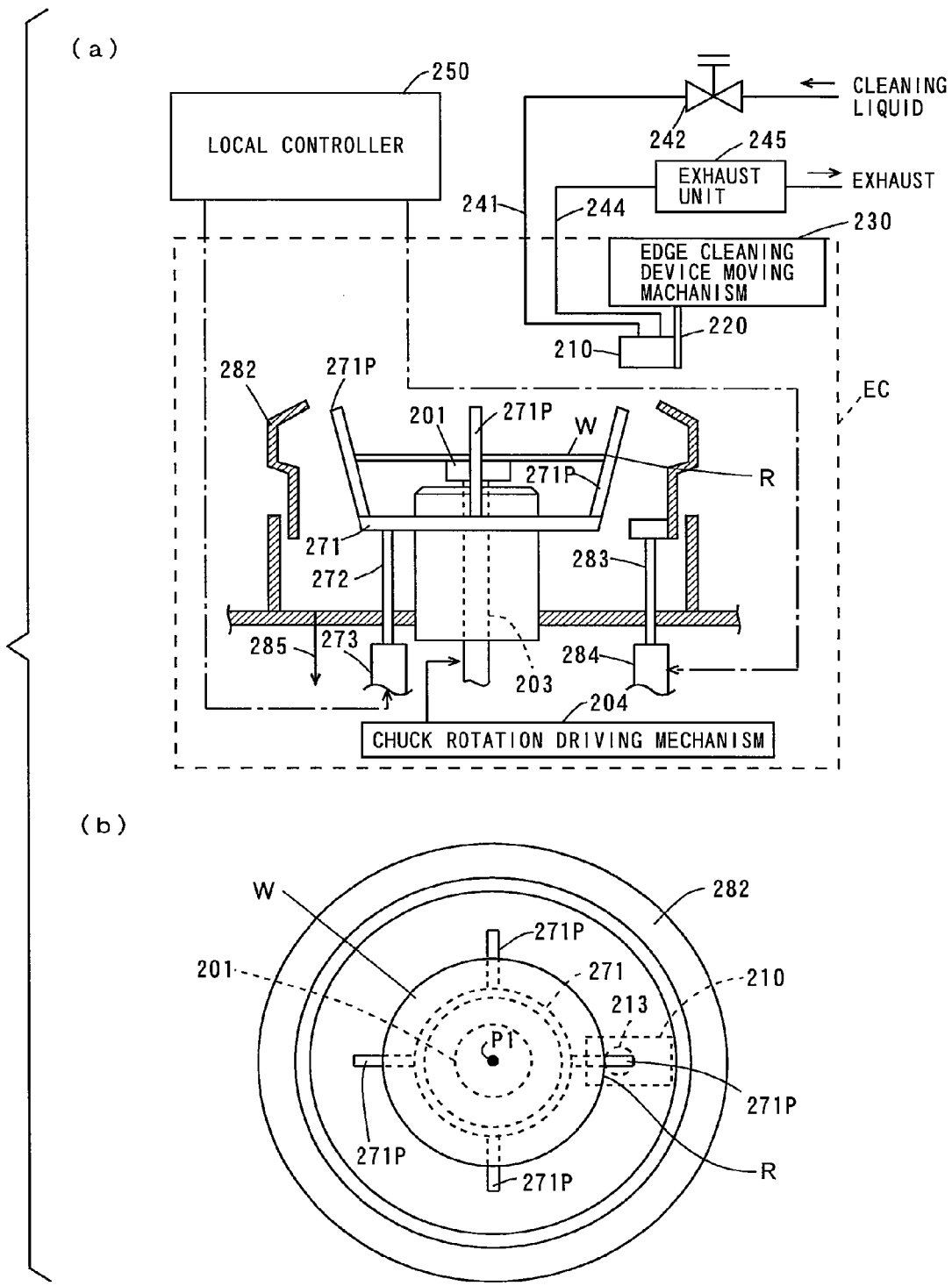
FIG. 10 is a diagram for explaining still another example of the configuration of an edge cleaning unit.

The edge cleaning unit EC may further have the following configuration. FIG. 10 is a diagram for explaining still another example of the configuration of the edge cleaning unit EC. FIG. 10 (a) is a side view showing still another example of the configuration of the edge cleaning unit EC, and FIG. 10 (b) is a top view of a part of the edge cleaning unit EC shown in FIG. 10 (a). The difference between the edge cleaning unit EC shown in FIG. 10 and the edge cleaning unit EC shown in FIG. 4 will be described.

As shown in FIGS. 10 (a) and 10 (b), three or more support pins 271P are arranged at substantially equal angles so as to surround a rotation shaft 203 and a spin chuck 201. In this example, four support pins 271P are provided.

The four support pins 271P have their respective lower ends held by an annular pin holding member 271, so that they are inclined obliquely upward outward with the rotation shaft 203 as its center. Note that the diameter of a circular region surrounded by the respective lower ends of the four support pins 271P is not more than the diameter of the substrate W, and the diameter of a circular region surrounded by respective upper ends of the four support pins 271P is more than the diameter of the substrate W.

The pin holding member 271 is attached to a lifting shaft 272. A pin driving device 273 is controlled by a local controller 250, and operates the lifting shaft 272 upward and downward. This causes the four support pins 271P, together with the pin holding member 271, to be raised and lowered.

A processing cup 282 in a substantially cylindrical shape for preventing a cleaning liquid from the substrate W from being splashed outward is provided so as to surround the four support pins 271P and the pin holding member 271.

The processing cup 282 is attached to a lifting shaft 283 in a cup driving device 284. The cup driving device 284 is controlled by the local controller 250, and operates the lifting shaft 283 upward and downward.

This causes the processing cup 282 to be raised and lowered between a discharged liquid recovery position surrounding an edge R of the substrate W held by the spin chuck 201 and a waiting position below the spin chuck 201.

During edge cleaning processing of the substrate W, the edge cleaning device 210 moves into the processing cup 282 while the processing cup 282 is raised to the discharged liquid recovery position, so that a brush 213 abuts against the edge R of the substrate W, as shown in FIG. 10 (b).

In this state, the edge cleaning device 210 cleans the edge R of the substrate W, so that the cleaning liquid splashed from the substrate W flows downward along an inner surface of the processing cup 282. The cleaning liquid that has flown down is discharged outward through a discharge system 285 formed on a bottom surface of the edge cleaning unit EC.

Figure 11:
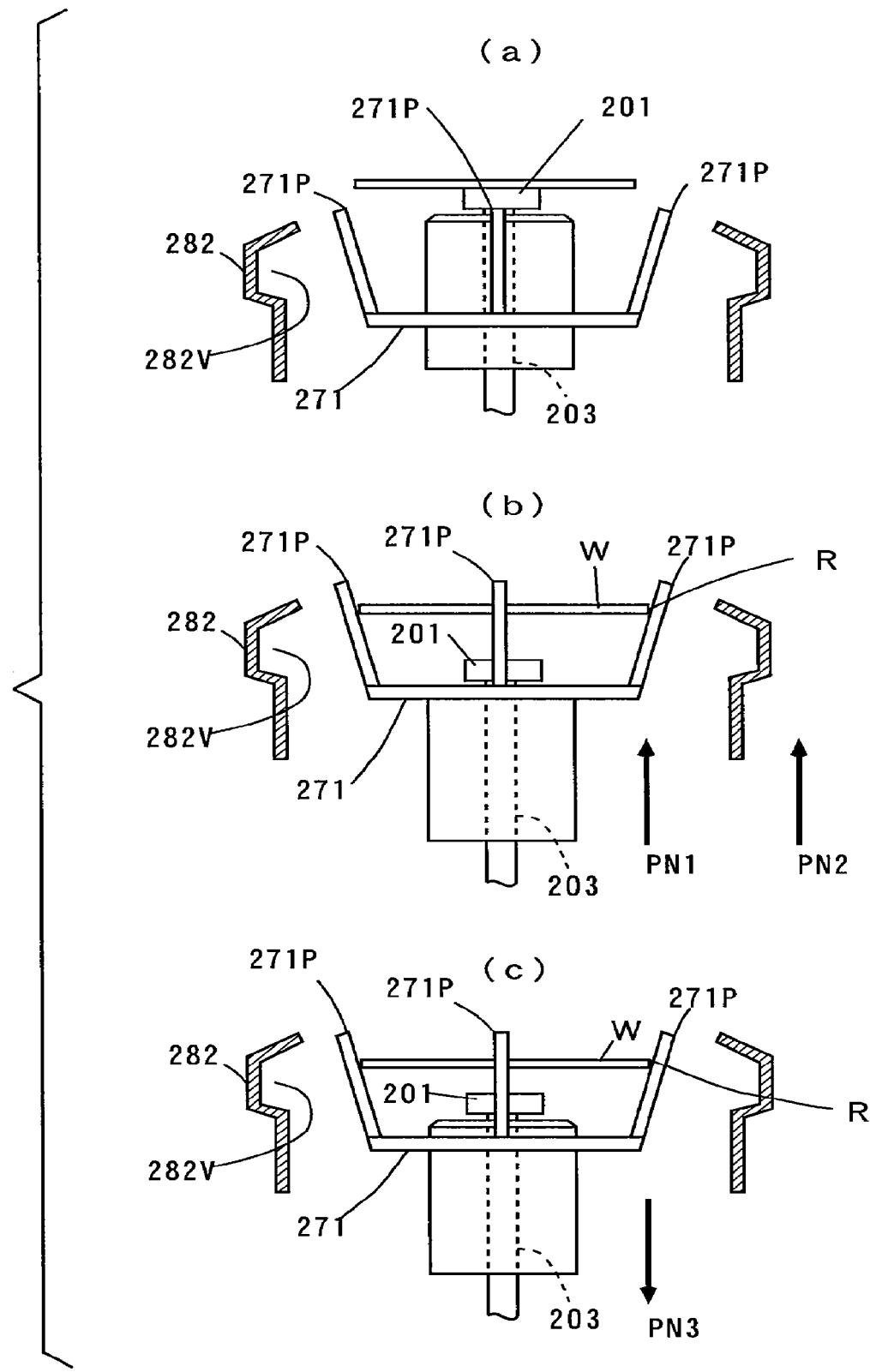
FIG. 11 is a diagram for explaining an operation of raising and lowering four support pins and a processing cup in the edge cleaning unit shown in FIG. 10.
Figure 12:
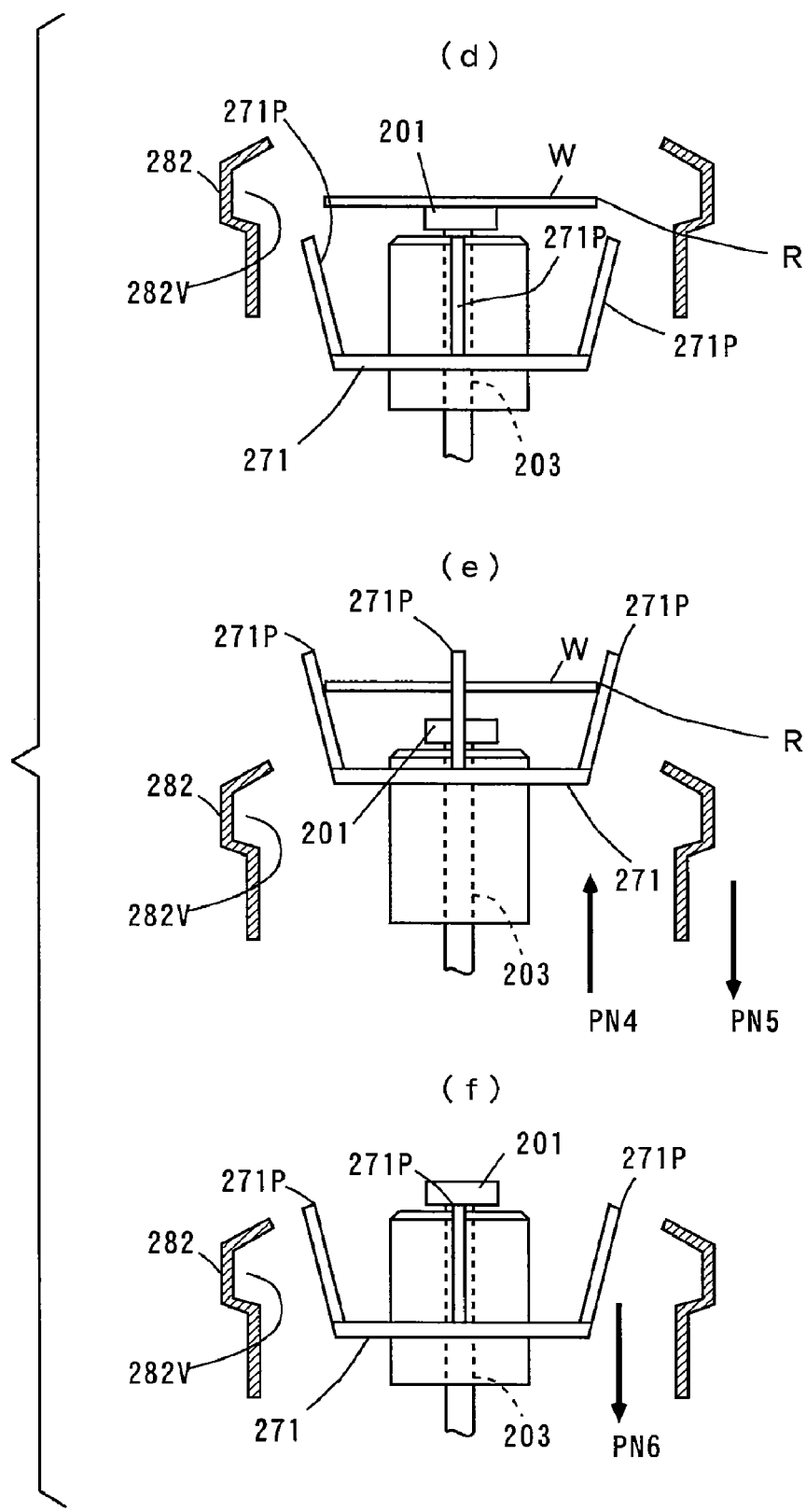
FIG. 12 is a diagram for explaining an operation of raising and lowering four support pins and a processing cup in the edge cleaning unit shown in FIG. 10.

The details of an operation of raising and lowering the four support pins 271P and the processing cup 282 and their functions will be described. FIGS. 11 and 12 are diagrams for explaining the operation of raising and lowering the four support pins 271P and the processing cup 282 in the edge cleaning unit EC shown in FIG. 10.

As shown in FIG. 11 (a), when the substrate W is carried into the edge cleaning unit EC, the substrate W is first placed on the spin chuck 201. At this time, both the four support pins 271P and the processing cup 282 are respectively at the waiting positions below the spin chuck 201.

As shown in FIG. 11 (b), when the substrate W is placed on the spin chuck 201, the pin holding member 271 is raised (an arrow PN1), and the processing cup 282 is also raised (an arrow PN2).

Here, the four support pins 271P are obliquely inclined upward outward with the rotation shaft 203 as its center. Further, the diameter of a circular region surrounded by the four support pins 271P is gradually enlarged upward from below.

When the four support pins 271P are raised in a case where the center W1 of the substrate W (FIG. 6) and the axis P1 of the spin chuck 201 (FIG. 6) coincide with each other, therefore, the edge R of the substrate W almost simultaneously abuts against the four support pins 271P. The substrate W is lifted by the four support pins 271P.

On the other hand, when the four support pins 271P are raised in a case where the center W1 of the substrate W (FIG. 6) and the axis P1 of the spin chuck 201 (FIG. 6) do not coincide with each other, therefore, the edge R of the substrate W first abuts against any one to three of the four support pins 271P.

At this time, as the support pins 271P are raised, the edge R of the substrate W that abuts against the support pin or pins 271P moves in the horizontal direction toward the rotation shaft 203 while sliding on the support pin 271P.

When the four support pins 271P are further raised, the four support pins 271P abut against the edge R of the substrate W, so that the center W1 of the substrate W and the axis P1 of the spin chuck 201 coincide with each other. The substrate W is lifted by the four support pins 271P.

Thereafter, the four support pins 271P are lowered (an arrow PN3), as shown in FIG. 11 (c). Thus, the four support pins 271P are respectively returned to the waiting positions, so that the substrate W is placed on the spin chuck 201 with the center W1 of the substrate W coinciding with the axis P1 of the spin chuck 201, as shown in FIG. 12 (d). In this state, the substrate W is held by suction on the spin chuck 201. The edge cleaning device 210 shown in FIG. 10 moves into the processing cup 282, to subject the substrate W to the edge cleaning processing.

When the edge cleaning processing of the substrate W is terminated, the processing cup 282 is lowered (an arrow PN5), and the four support pins 271P are raised (an arrow PN4), as shown in FIG. 12 (e). This causes the substrate W to be lifted.

The substrate W lifted by the four support pins 271P is received with the hand CRH1 shown in FIG. 1, and is carried out of the edge cleaning unit EC. Finally, the four support pins 271P are respectively lowered to the waiting positions (an arrow PN6), as shown in FIG. 12 (f).

As described in the foregoing, in the edge cleaning unit EC in this example, the four support pins 271P are raised and lowered, so that the position of the substrate W is corrected in a simple configuration and easily. This causes the substrate W to be subjected to the edge cleaning processing correctly and reliably.

(3-d) Still Another Example of Configuration of Edge Cleaning Unit

Figure 13:
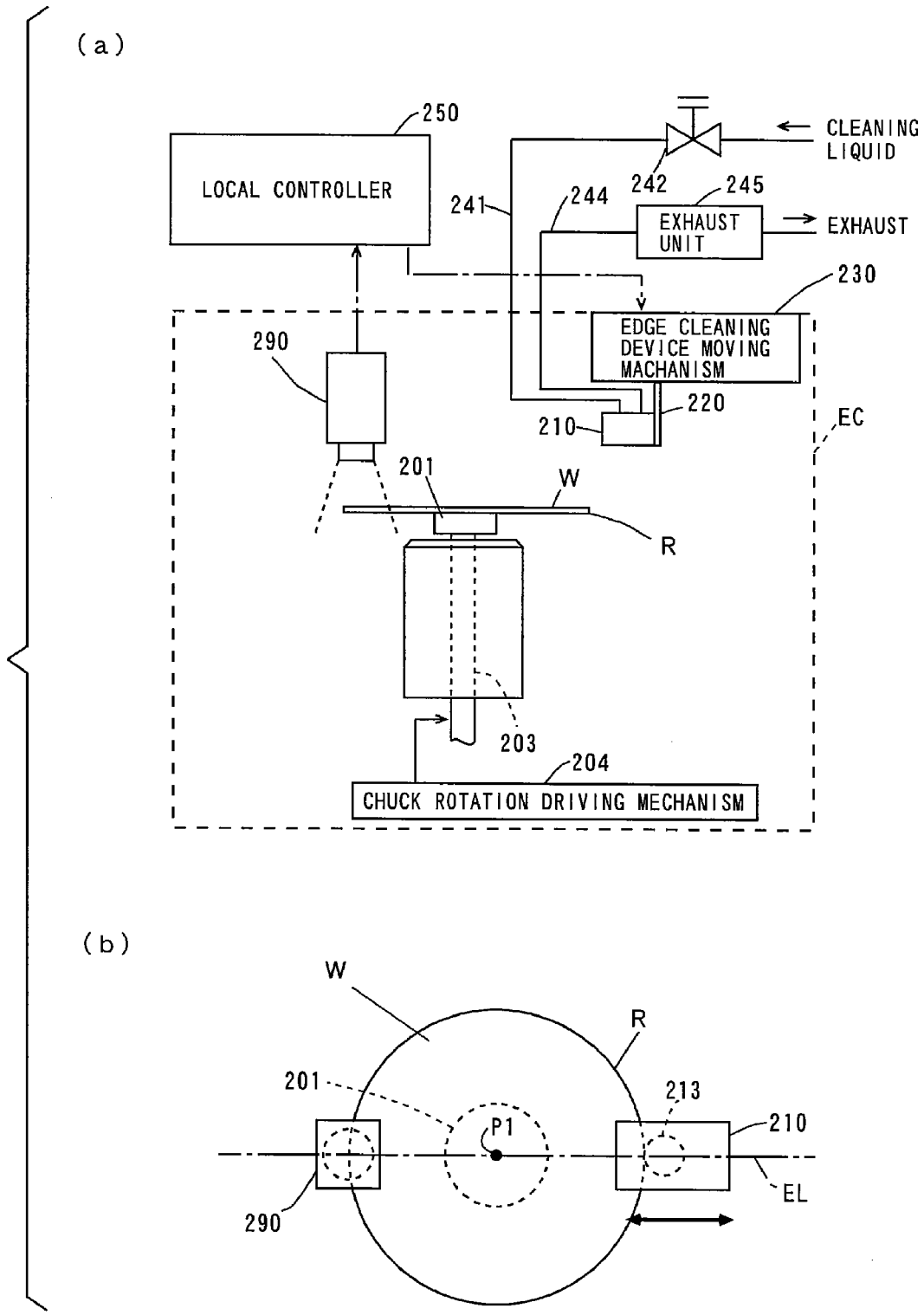
FIG. 13 is a diagram for explaining still another example of the configuration of an edge cleaning unit.

The edge cleaning unit EC may further have the following configuration. FIG. 13 is a diagram for explaining still another example of the configuration of the edge cleaning unit EC. FIG. 13 (a) is a side view showing still another example of the configuration of the edge cleaning unit EC, and FIG. 13 (b) is a top view of a part of the edge cleaning unit EC shown in FIG. 13 (a). The difference between the edge cleaning unit EC shown in FIG. 13 and the edge cleaning unit EC shown in FIG. 4 will be described.

As shown in FIGS. 13 (a) and 13 (b), a camera 290 is arranged in the vicinity of an edge R of a substrate W held by a spin chuck 201 above the spin chuck 201. The camera 290 is a CCD camera, for example, to image the edge R of the substrate W held by the spin chuck 201 from above. An image obtained by the camera 290 is given as an electric signal to a local controller 250.

A chuck rotation driving mechanism 204 includes a motor and an encoder. The local controller 250 can detect a rotation angle from the reference position (zero degree) of a rotation shaft 203 whose rotation is driven by a motor on the basis of an output signal of the encoder.

As shown in FIG. 13 (a), during edge cleaning processing of the substrate W, the camera 290 and an edge cleaning device 210 are opposed with an axis P1 of the spin chuck 201 interposed therebetween.

When the center W1 of the substrate W coincides with the axis P1 of the spin chuck 201, the edge R of the substrate W is not displaced as the substrate W rotates on a horizontal line connecting the axis P1 of the spin chuck 201 and the center of a brush 213 in the edge cleaning device 210.

On the other hand, when the center W1 of the substrate W does not coincide with the axis P1 of the spin chuck 201, the edge R of the substrate W is displaced as the substrate W rotates on the horizontal line connecting the axis P1 of the spin chuck 201 and the center of the brush 213 in the edge cleaning device 210. In this case, the displacement amount of the edge R varies depending on the rotation angle of the spin chuck 201.

In the following description, the horizontal line connecting the axis P1 of the spin chuck 201 and the center of the brush 213 in the edge cleaning device 210 is referred to as an eccentricity detection line EL.

A local controller 250 detects the relationship between the displacement amount of the edge R of the substrate W on the eccentricity detection line EL and the rotation angle of the spin chuck 201 on the basis of the image given from the camera 290.

Furthermore, the local controller 250 causes an edge cleaning device moving mechanism 230 to move the edge cleaning device 210 on the eccentricity detection line EL on the basis of the relationship between the displacement amount of the edge R and the rotation angle of the spin chuck 201.

Specifically, the local controller 250 rotates the substrate W once, to detect the relationship between a rotation angle from the reference angle of the spin chuck 201 and the displacement amount of the edge R on the eccentricity detection line EL on the basis of the image given from the camera 290 and store the detected relationship.

The local controller 250 moves the edge cleaning device 210 at real time on the eccentricity detection line EL such that the relative position (distance) between the rotation center of the substrate W and the center of the brush 213 is held on the basis of the stored relationship between the rotation angle and the displacement amount during the rotation of the substrate W (see an arrow in FIG. 13 (b)).

This allows a contact state between the edge R and the brush 213 in the edge cleaning device 210 to be kept constant over the whole periphery of the substrate W even in a case where the axis P1 of the spin chuck 201 and the center W1 of the substrate W placed on the spin chuck 201 do not coincide with each other. As a result, the edge cleaning processing of the substrate W is uniformly and accurately performed over the whole periphery of the substrate W.

(3-e) Still Another Example of Configuration of Edge Cleaning Unit

Figure 14:
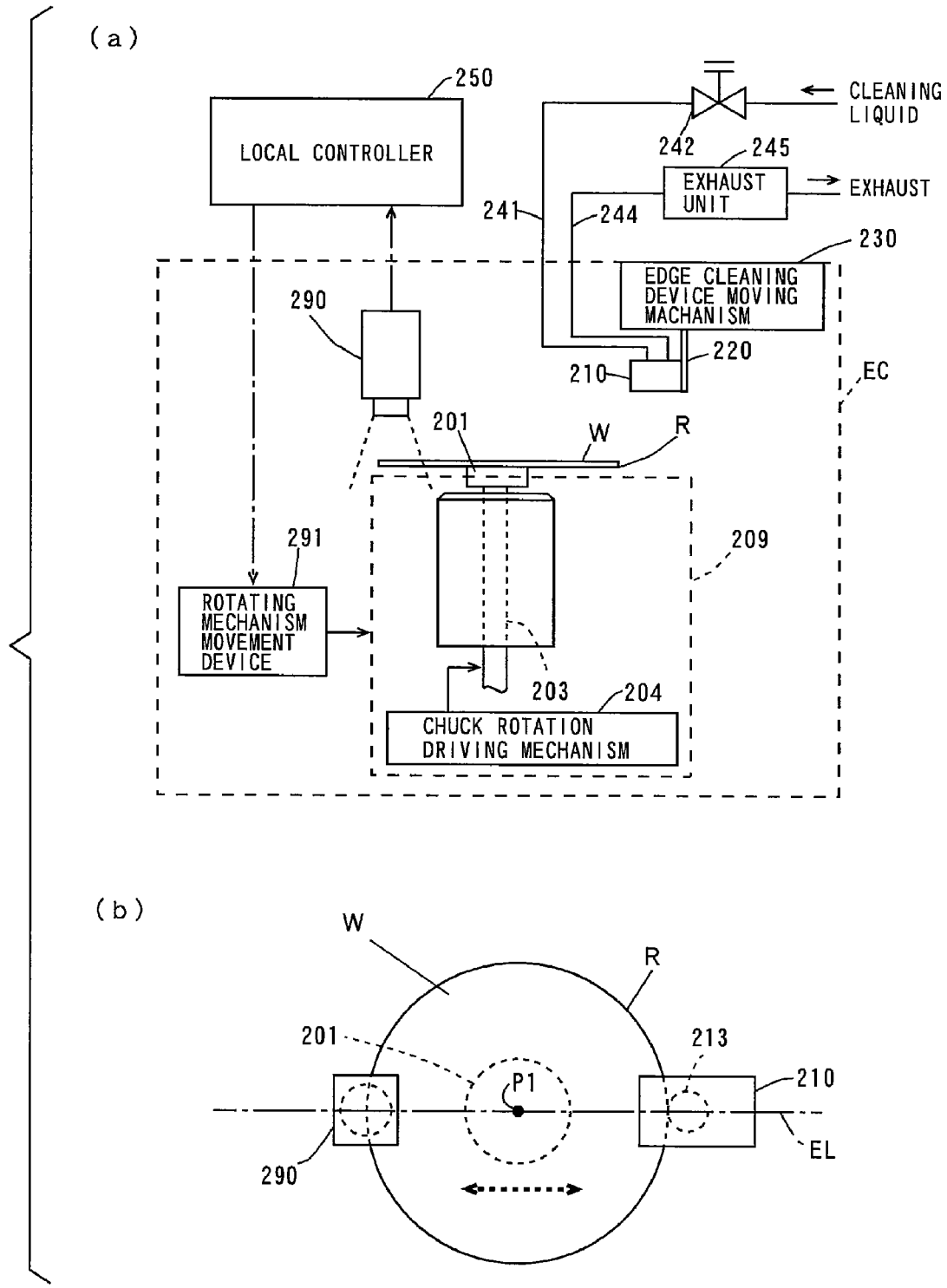
FIG. 14 is a diagram for explaining still another example of the configuration of an edge cleaning unit.

The edge cleaning unit EC may further have the following configuration. FIG. 14 is a diagram for explaining still another example of the configuration of the edge cleaning unit EC. FIG. 14 (a) is a side view showing still another example of the configuration of the edge cleaning unit EC, and FIG. 14 (b) is a top view of a part of the edge cleaning unit EC shown in FIG. 14 (a). The difference between the edge cleaning unit EC shown in FIG. 14 and the edge cleaning unit EC shown in FIG. 13 will be described.

Here, a spin chuck 201, a rotation shaft 203, and a chuck rotation driving mechanism 204 that constitute the edge cleaning unit EC in this example are referred to as a substrate rotating mechanism 209. The edge cleaning unit EC in this example is provided with a rotating mechanism movement device 291 that moves the substrate rotating mechanism 209 in a direction parallel to an eccentricity detection line EL.

A local controller 250 rotates a substrate W once with the substrate rotating mechanism 209 secured. This causes the relationship between a rotation angle from the reference angle of the spin chuck 201 and the displacement amount of an edge R of the substrate W on the eccentricity detection line EL to be detected on the basis of an image given from a camera 290 and stored.

The local controller 250 moves the substrate rotating mechanism 209 at real time on the eccentricity detection line EL such that the relative position (distance) between the rotation center of the substrate W and the center of a brush 213 is held on the basis of the stored relationship between the rotation angle and the displacement amount during the rotation of the substrate W (see an arrow in FIG. 14 (b)).

This allows a contact state between the edge R and the brush 213 in the edge cleaning device 210 to be kept constant over the whole periphery of the substrate W. As a result, edge cleaning processing of the substrate W is uniformly and accurately performed over the whole periphery of the substrate W.

(3-f) Still Another Example of Configuration of Edge Cleaning Unit

Figure 15:
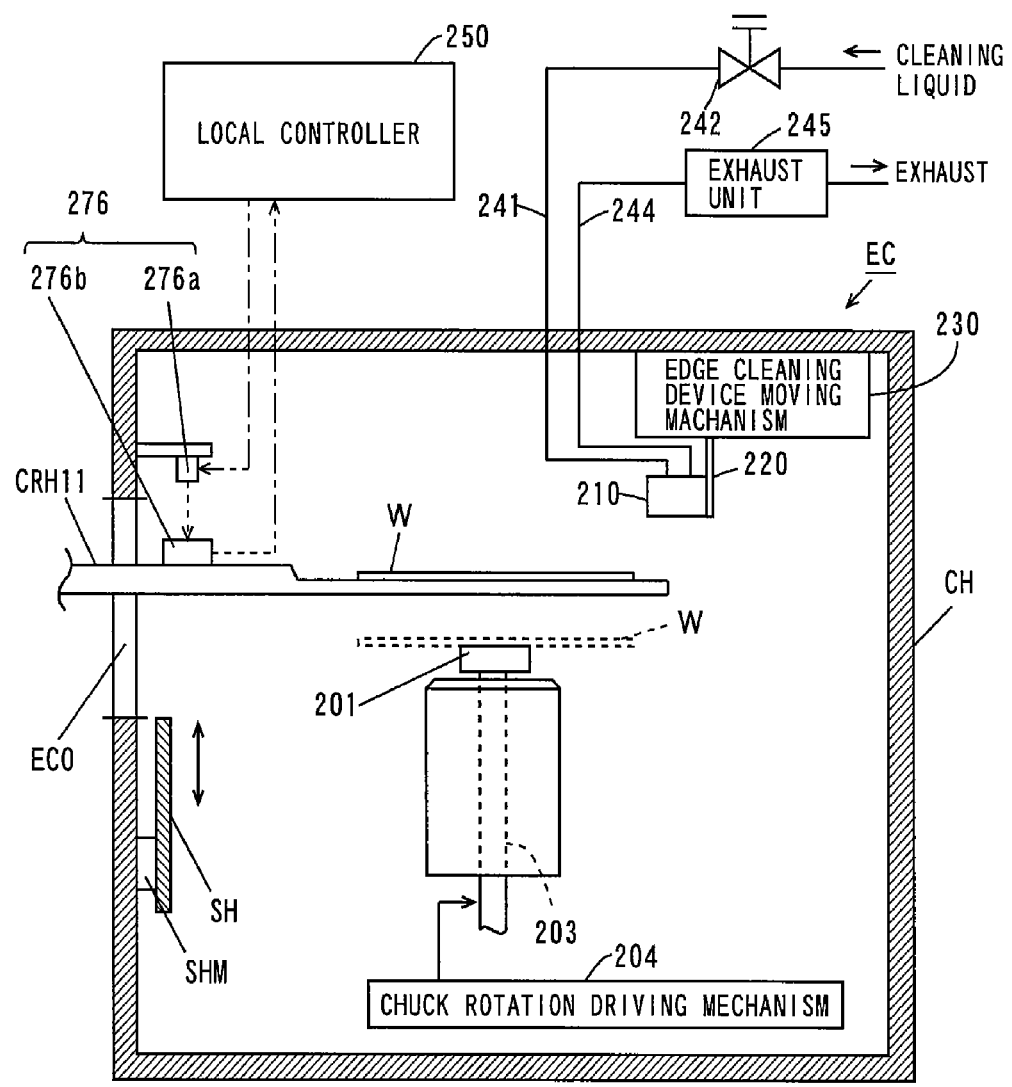
FIG. 15 is a diagram for explaining another example of the configuration of an edge cleaning unit.

The edge cleaning unit EC may further have the following configuration. FIG. 15 is a diagram for explaining still another example of the configuration of the edge cleaning unit EC. The difference between the edge cleaning unit EC shown in FIG. 15 and the edge cleaning unit EC shown in FIG. 4 will be described.

As shown in FIG. 15, in the edge cleaning unit EC in this example, a spin chuck 201, a rotation shaft 203, a chuck rotation driving mechanism 204, an edge cleaning device 210, and an edge cleaning device moving mechanism 230 are arranged within a processing chamber CH.

Note that the arrangement of the constituent elements in the processing chamber CH is the same as that in the edge cleaning unit EC shown in FIG. 4. The edge cleaning unit EC in this example is not provided with guide arms 251 and 252, unlike the edge cleaning unit EC shown in FIG. 4.

An opening ECO for carrying the substrate W into the edge cleaning unit EC and carrying the substrate W out of the edge cleaning unit EC is formed on one side wall of the processing chamber CH. A shutter SH capable of opening and closing the opening ECO and a shutter driving device SHM for driving the shutter SH are provided on the one side wall.

The shutter SH opens the opening ECO, which allows the substrate W to be carried into the edge cleaning unit EC and carried out of the edge cleaning unit EC. The substrate W is carried into and out of the edge cleaning unit EC with the hand CRH11 of the seventh central robot CR7 shown in FIG. 1.

Furthermore, a light emitter 276a in a photoelectric sensor 276 is provided above the opening ECO on one side wall of the processing chamber CH. A light receiver 276b in the photoelectric sensor 276 is provided in a predetermined area on an upper surface of the hand CRH11. The light emitter 276a emits light in the vertical direction toward a bottom surface of the processing chamber CH, for example.

The light emitter 276a and the light receiver 276b in the photoelectric sensor 276 are connected to a local controller 250. The local controller 250 causes the light emitter 276a to emit light when the substrate W is carried into the edge cleaning unit EC.

The light receiver 276b feeds a signal indicating that light is received (hereinafter referred to as a light receiving signal) to the local controller 250 when it receives the light from the light emitter 276a.

The local controller 250 controls the operation of each of the constituent elements in the edge cleaning unit EC, and also controls the operation of the seventh central robot CR7 shown in FIG. 1. The operation of the hand CRH11 controlled by the local controller 250 will be described on the basis of FIG. 16.

Figure 16:
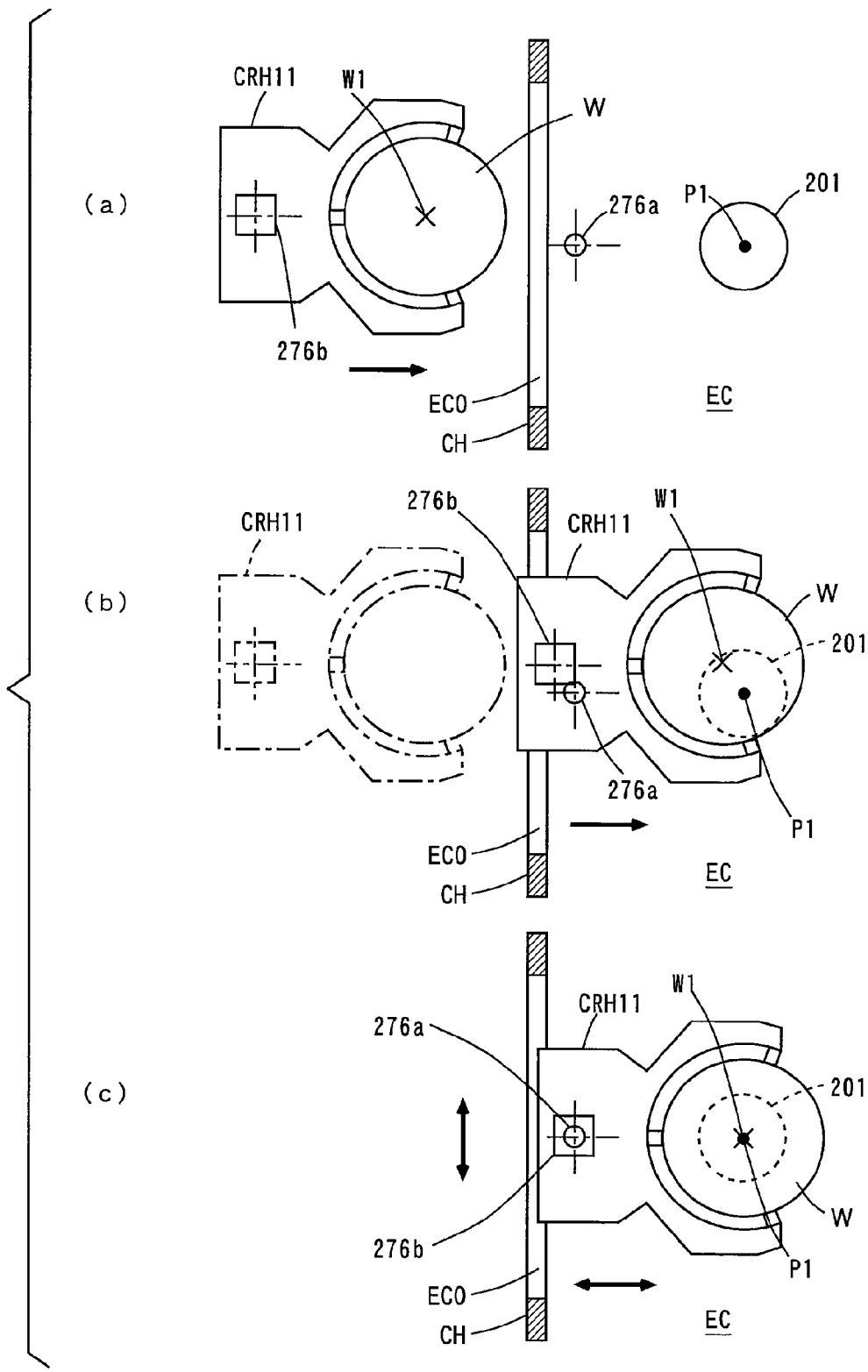
FIG. 16 is a diagram for explaining the operation of a hand shown in FIG. 15 at the time of carrying a substrate into an edge cleaning unit.

FIG. 16 is a diagram for explaining the operation of the hand CRH1 shown in FIG. 15 at the time of carrying the substrate W into the edge cleaning unit EC. In FIG. 16, a part of the configuration of the hand CRH11 and the edge cleaning unit EC (the light emitter 276a and the spin chuck 201 shown in FIG. 15) is shown from the top.

In FIG. 16 (a), the substrate W held with the hand CRH11 is carried into the edge cleaning unit EC, as indicated by an arrow. The positional relationship between the hand CRH11 and the spin chuck 201 is previously set.

However, the position of the hand CRH11 may, in some cases, be shifted from a previously set position. This causes the substrate W carried into the edge cleaning unit EC to be placed on the spin chuck 201 with the center W1 of the substrate W shifted from an axis P1 of the spin chuck 201, as shown in FIG. 16 (b).

In this case, the light emitted from the light emitter 276a is not received by the light receiver 276b. Consequently, a light receiving signal is not fed from the light receiver 276b to the local controller 250.

Therefore, the local controller 250 moves the hand CHR11 in a horizontal plane until the light receiving signal is fed from the light receiver 276b, as shown in FIG. 16 (c). The local controller 250 stops the movement of the hand CRH11 when the light receiving signal is fed thereto, and places the substrate W on the spin chuck 201.

This causes the axis P1 of the spin chuck 201 and the center W1 of the substrate W to coincide with each other. This allows a contact state between the edge R and the brush 213 in the edge cleaning device 210 to be kept constant over the whole periphery of the substrate W during edge cleaning processing of the substrate W. As a result, the edge cleaning processing of the substrate W is uniformly and accurately performed over the whole periphery of the substrate W.

The light receiving sensor 276 for causing the center W1 of the substrate W and the axis P1 of the spin chuck 201 to coincide with each other can be also provided in the edge cleaning units EC respectively shown in FIGS. 4, 8, 10, 13, and 14.

In this case, the local controller 250 can sufficiently prevent the substrate W from being eccentric by controlling the operation of the hand CRH11.

(3-g) Still Another Example of Configuration of Edge Cleaning Unit

Figure 17:
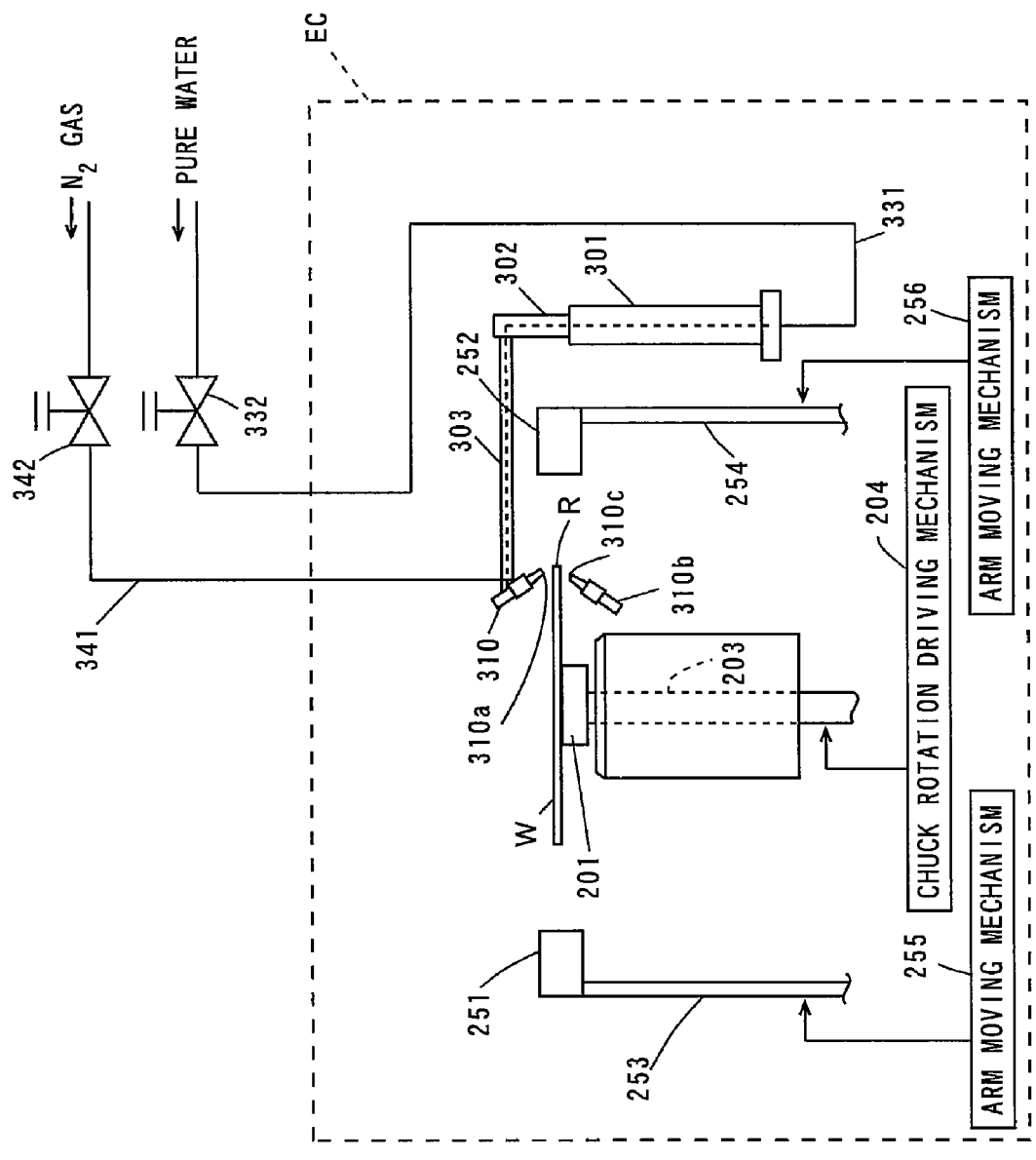
FIG. 17 is a diagram for explaining still another example of the configuration of an edge cleaning unit.

The edge cleaning unit EC may further have the following configuration. FIG. 17 is a diagram for explaining still another example of the configuration of the edge cleaning unit EC. The difference between the edge cleaning unit EC shown in FIG. 17 and the edge cleaning unit EC shown in FIG. 4 will be described.

As shown in FIG. 17, a motor 301 is provided outside a spin chuck 201. A rotation shaft 302 is connected to the motor 301.

An arm 303 is connected to the rotation shaft 302 so as to extend in the horizontal direction, and has its tip provided with a two-fluid nozzle 310. The two-fluid nozzle 310 discharges a fluid mixture of a gas and a liquid. The details will be described later.

The two-fluid nozzle 310 is attached so as to be inclined to a main surface of a substrate W held by the spin chuck 201 at the tip of the arm 303.

When edge cleaning processing of the substrate W is started, the motor 301 causes the rotation shaft 302 to rotate while causing the arm 303 to swing. This causes the two-fluid nozzle 310 to move to above an edge R of the substrate W held by the spin chuck 201. As a result, a discharge port 310a of the fluid mixture in the two-fluid nozzle 310 is opposed to the edge R of the substrate W.

A cleaning liquid supply pipe 331 is provided so as to pass through the motor 301, the rotation shaft 302, and the arm 303. The cleaning liquid supply pipe 331 has its one end connected to the two-fluid nozzle 310 and the other end connected to a cleaning liquid supply system (not shown) through a valve 332. By opening the valve 332, a cleaning liquid is supplied to the two-fluid nozzle 310 through the cleaning liquid supply pipe 331. Although pure water, for example, is used as the cleaning liquid in this example, the pure water may be replaced with any one of a predetermined resist solvent, a fluorine-based medical liquid, an ammonia/hydrogen peroxide mixture, a liquid used for an immersion method in an exposure device 17, hydrofluoric acid, sulfuric acid, and a sulfuric acid/hydrogen peroxide mixture.

One end of a gas supply pipe 341, together with the cleaning liquid supply pipe 331, is connected to the two-fluid nozzle 310. The other end of the gas supply pipe 341 is connected to a gas supply system (not shown) through a valve 342. By opening the valve 342, a gas is supplied to the two-fluid nozzle 310. Although nitrogen gas ($N_2$) is used as the gas supplied to the two-fluid nozzle 310 in this example, the nitrogen gas ($N_2$) may be replaced with another inert gas such as argon gas or helium gas.

When the substrate W is subjected to the edge cleaning processing, the cleaning liquid and the gas are supplied to the two-fluid nozzle 310. This causes the fluid mixture to be discharged from the two-fluid nozzle 310 to the edge R of the rotating substrate W. Thus, the edge R of the substrate W is satisfactorily cleaned.

Furthermore, in the present embodiment, a two-fluid nozzle 310b having the same configuration and function as those of the above-mentioned two-fluid nozzle 310 is provided within the edge cleaning unit EC. The two-fluid nozzle 310b is attached so as to be opposed to a back surface of the substrate W held by the spin chuck 201 and inclined to the back surface of the substrate W. The two-fluid nozzle 310b comprises a discharge port 310c that discharges a fluid mixture, and is attached to an arm (not shown).

The two-fluid nozzles 310 and 310b are thus provided so as to be opposed to the main surface and the back surface of the substrate W, which allows the edge R of the substrate W to be reliably cleaned. Supply systems of the cleaning liquid and the gas in the two-fluid nozzle 310b are the same as those in the two-fluid nozzle 310 and hence, the description thereof is not repeated.

The edge cleaning unit EC shown in FIG. 17 is provided with guide arms 251 and 252, supporting members 253 and 254, and arm moving mechanism 255 and 256, similarly to the edge cleaning unit EC shown in FIG. 4. They respectively have the same configurations and functions as those in the edge cleaning unit EC shown in FIG. 4. When the substrate W is placed on the spin chuck 201, therefore, the position of the substrate W is corrected by the guide arms 251 and 252.

The guide arms 251 and 252, the supporting members 253 and 254, and the arm moving mechanisms 255 and 256 may be replaced with the correction pin 261, the pin driving device 262, and the eccentricity sensor 263 shown in FIG. 8, the four support pins 271P, the pin holding member 271, and the pin driving device 273 shown in FIG. 10, the camera 290 shown in FIG. 13, or the camera 290 and the rotating mechanism movement device 291 shown in FIG. 14.

Furthermore, in place of the guide arms 251 and 252, the supporting members 253 and 254, and the arm moving mechanisms 255 and 256, the edge cleaning unit EC shown in FIG. 17 may have the light emitter 276a provided therein and have the light receiver 276b provided on the hand CRH11, as shown in FIG. 15.

An example of the internal configuration of the two-fluid nozzle 310 will be then described. The internal configuration of the two-fluid nozzle 310b is the same as the internal configuration of the two-fluid nozzle 310 and hence, the description thereof is not repeated.

Figure 18:
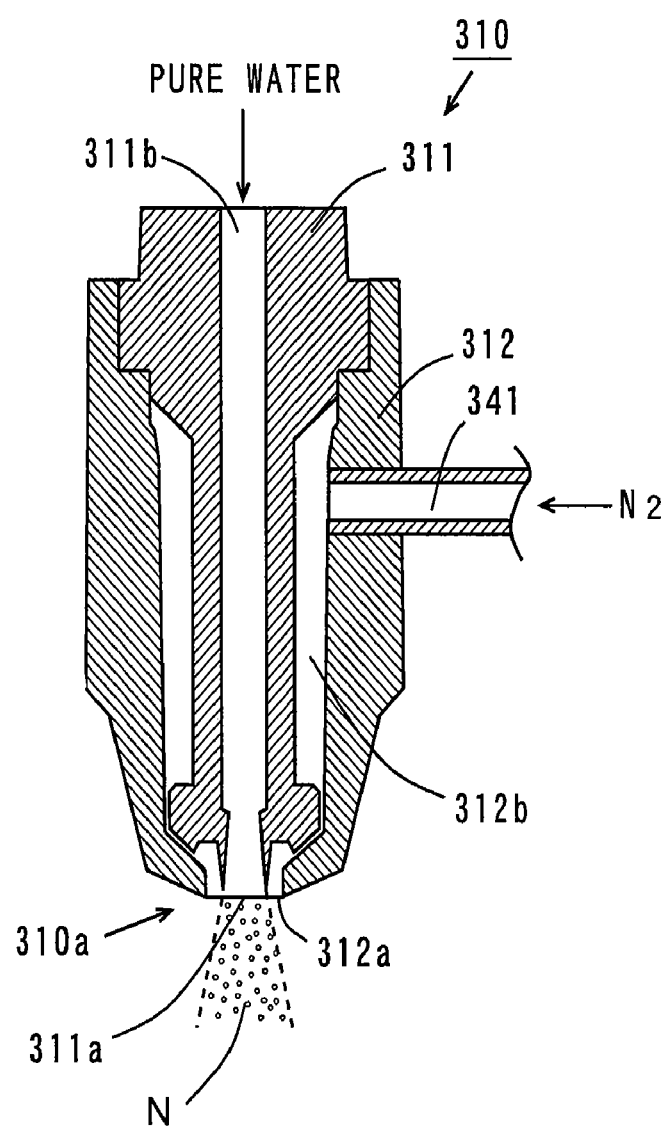
FIG. 18 is a vertical sectional view showing an example of the internal configuration of a two-fluid nozzle used for edge cleaning processing.

FIG. 18 is a vertical sectional view showing an example of the internal configuration of the two-fluid nozzle 310 used for edge cleaning processing.

The two-fluid nozzle 310 shown in FIG. 18 is referred to as an external-mix type two-fluid nozzle. The external-mix type two-fluid nozzle 310 shown in FIG. 18 comprises an internal main body 311 and an external main body 312. The internal main body 311 is composed of quartz, for example, and the external main body 312 is composed of fluororesin such as PTFE (polytetrafluoroethylene), for example.

A pure water passage 311b is formed along a central axis of the internal main body 311. A cleaning liquid supply pipe 331 shown in FIG. 17 is attached to the pure water passage 311b. This causes pure water supplied from the cleaning liquid supply pipe 331 to be introduced into the pure water passage 311b.

A pure water discharge port 311a communicating with the pure water passage 311b is formed at a lower end of the internal main body 311. The internal main body 311 is inserted into the external main body 312. Note that respective upper ends of the internal main body 311 and the external main body 312 are joined to each other, and respective lower ends thereof are not joined to each other.

A cylindrical gas passage 312b is formed between the internal main body 311 and the external main body 312. A gas discharge port 312a communicating with the gas passage 312b is formed at the lower end of the external main body 312. A gas supply pipe 341 shown in FIG. 17 is attached to a peripheral wall of the external main body 312 so as to communicate with the gas passage 312b. This causes a nitrogen gas ($N_2$) supplied from the gas supply pipe 341 to be introduced into the gas passage 312b.

The gas passage 312b decreases in diameter downward in the vicinity of the gas discharge port 312a. As a result, the nitrogen gas ($N_2$) is discharged from the gas discharge port 312a after the velocity of flow thereof is accelerated.

In the two-fluid nozzle 310, the pure water discharged from the pure water discharge port 311a and the nitrogen gas ($N_2$) discharged from the gas discharge port 312a are mixed outside the vicinity of a lower end of the two-fluid nozzle 310, to produce an atomized fluid mixture N including a fine droplet of the pure water.

As described in the foregoing, during the edge cleaning processing of the substrate W, the atomized fluid mixture N is discharged to the edge R of the substrate W, so that the edge R of the substrate W is cleaned.

In the edge cleaning unit EC shown in FIG. 17, the two-fluid nozzle 310 shown in FIG. 18 may be replaced with an internal-mix type two-fluid nozzle 310 that produces a fluid mixture N inside a nozzle main body. Another example of the internal configuration of the two-fluid nozzle 310 will be described.

Figure 19:
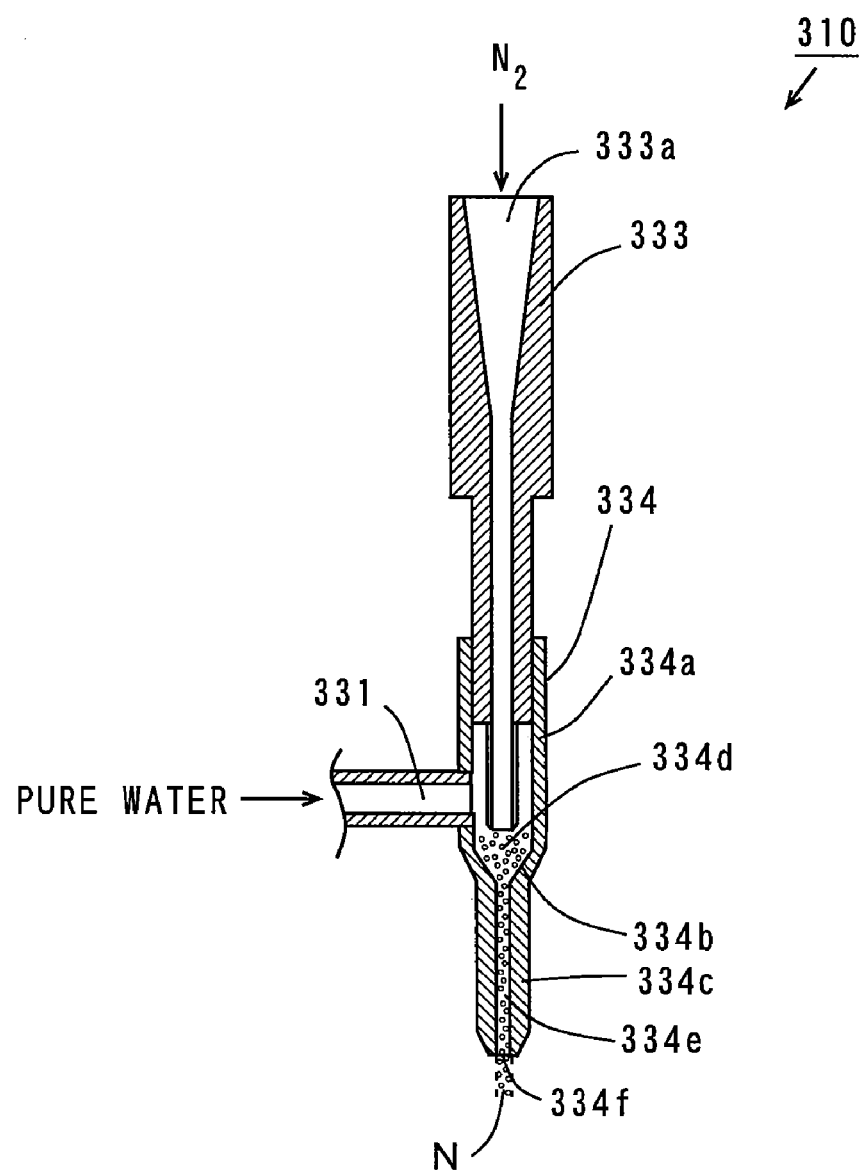
FIG. 19 is a vertical sectional view showing another example of the internal configuration of a two-fluid nozzle used for edge cleaning processing.

FIG. 19 is a vertical sectional view showing another example of the internal configuration of the two-fluid nozzle 310 used for the edge cleaning processing. The two-fluid nozzle 310 shown in FIG. 19 is referred to as an internal-mix type two-fluid nozzle.

The internal-mix type two-fluid nozzle 310 shown in FIG. 19 comprises a gas inlet port 333 and a main body 334. The main body 334 is composed of quartz, for example, and the gas inlet port 333 is composed of PTFE (polytetrafluoroethylene), for example.

In the gas inlet port 333, a gas passage 333a communicating with its upper end to its lower end is formed. The gas supply pipe 341 shown in FIG. 17 is attached to an upper end of the gas inlet port 333. This causes the nitrogen gas ($N_2$) supplied from the gas supply pipe 341 to be introduced into the gas passage 333a.

The main body 334 comprises an upper cylinder 334a having a large diameter, a taper portion 334b, and a lower cylinder 334c having a small diameter.

A mixture space 334d is formed within in the upper cylinder 334a and the taper portion 334b, and a direct flow passage 334e is formed within the lower cylinder 334c. A fluid mixture discharge port 334f communicating with the direct flow passage 334e is formed at a lower end of the lower cylinder 334c.

The cleaning liquid supply pipe 331 shown in FIG. 17 is attached to the upper cylinder 334a in the main body 334 so as to communicate with the mixture space 334d. This causes pure water supplied from the cleaning liquid supply pipe 331 to be introduced into the mixture space 334d. The lower end of the gas inlet port 333 is inserted into the mixture space 334d in the upper cylinder 334a of the main body 334.

In the internal-mix type two-fluid nozzle 310 shown in FIG. 19, when a pressurized nitrogen gas ($N_2$) is supplied from the gas passage 333a, and pure water is supplied from the cleaning liquid supply pipe 331, the nitrogen gas ($N_2$) and the pure water are mixed in the mixture space 334d, to produce an atomized fluid mixture N including a fine droplet of the pure water.

The fluid mixture N produced in the mixture space 334d is accelerated by passing through the direct flow passage 334e along the taper portion 334b. The accelerated fluid mixture is discharged to the edge R of the substrate W from the fluid mixture discharge port 334f. This causes the edge R of the substrate W to be cleaned.

(3-h) Still Another Example of Configuration of Edge Cleaning Unit

Figure 20:
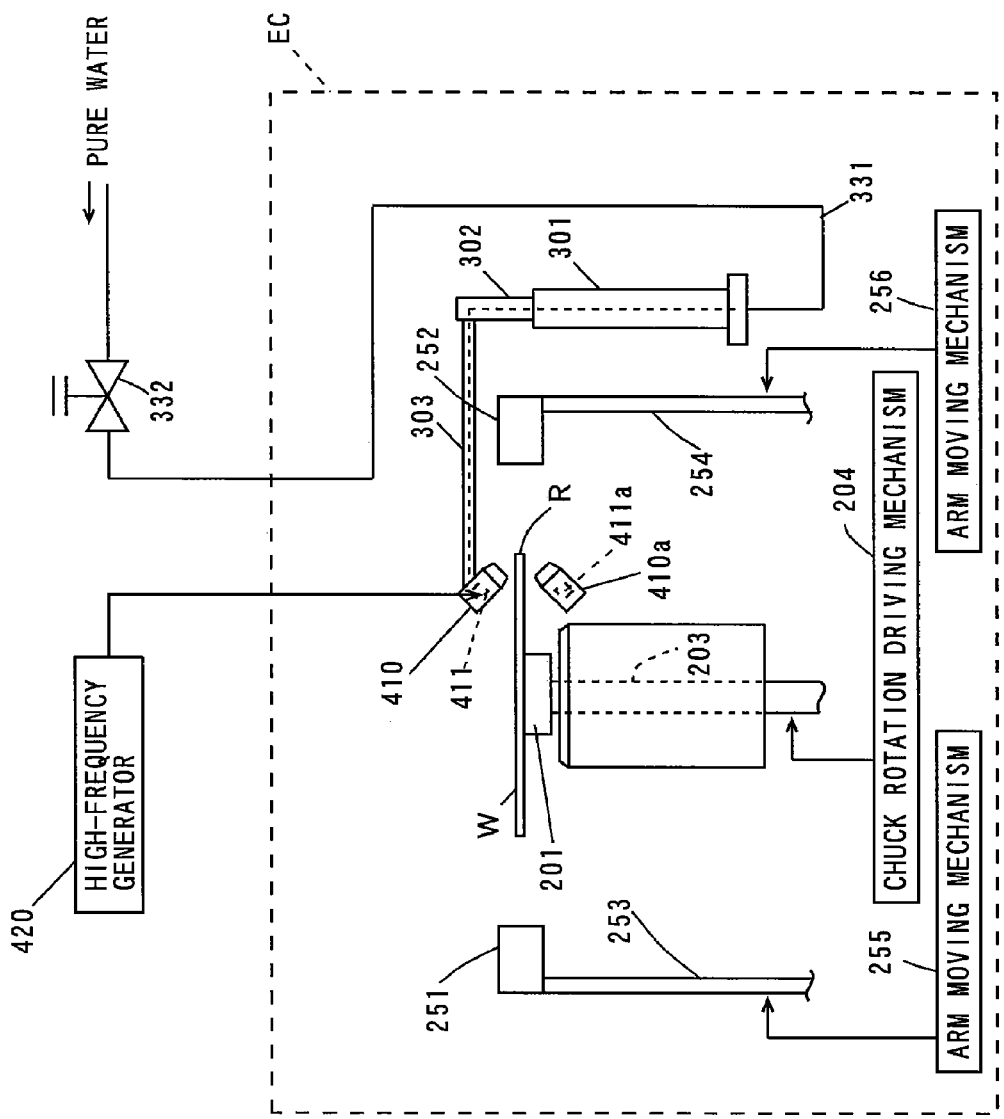
FIG. 20 is a diagram for explaining still another example of the configuration of an edge cleaning unit.

The edge cleaning unit EC may further have the following configuration. FIG. 20 is a diagram for explaining still another example of the configuration of the edge cleaning unit EC. The difference between the edge cleaning unit EC shown in FIG. 20 and the edge cleaning unit EC shown in FIG. 17 will be described.

As shown in FIG. 20, in the edge cleaning unit EC in this example, an ultrasonic nozzle 410 is also provided in place of the two-fluid nozzle 310 at the tip of an arm 303.

In this example, the ultrasonic nozzle 410 is also attached to the tip of the arm 303 so as to be inclined to a main surface of a substrate W held by a spin chuck 201.

A cleaning liquid supply pipe 331 is connected to the ultrasonic nozzle 410. By opening a valve 332, therefore, a cleaning liquid is supplied to the ultrasonic nozzle 410 through the cleaning liquid supply pipe 331, as in the example shown in FIG. 17. In this example, pure water is also used as the cleaning liquid.

A high-frequency vibrator 411 is contained in the ultrasonic nozzle 410. The high-frequency vibrator 411 is electrically connected to a high-frequency generator 420.

When the substrate W is subjected to edge cleaning processing, pure water is discharged toward an edge R of the substrate W from the ultrasonic nozzle 410. Here, when the pure water is discharged from the ultrasonic nozzle 410, a high-frequency current is supplied to the high-frequency vibrator 411 from the high-frequency generator 420.

Thus, the high-frequency vibrator 411 is ultrasonically vibrated, to apply a high-frequency output corresponding to the value of the high-frequency current to the pure water passing through the ultrasonic nozzle 410. As a result, the pure water in a ultrasonic vibration state is discharged to the edge R of the substrate W, to clean the edge R of the substrate W.

In this example, a ultrasonic nozzle 410a having the same configuration and function as those of the ultrasonic nozzle 410 is also provided within the edge cleaning unit EC. The ultrasonic nozzle 410a is attached so as to be opposed to a back surface of the substrate W held by the spin chuck 201 and inclined to the back surface of the substrate W. Note that the ultrasonic nozzle 410a contains a high-frequency vibrator 411a, and is attached to an arm (not shown).

The ultrasonic nozzles 410 and 410a are thus provided so as to be respectively opposed to the main surface and the back surface of the substrate W, which allows the edge R of the substrate W to be reliably cleaned. Respective supply systems of the cleaning liquid and the high-frequency current in the ultrasonic nozzle 410a are the same as those in the ultrasonic nozzle 410 and hence, the description thereof is not repeated.

The edge cleaning unit EC shown in FIG. 20 is provided with guide arms 251 and 252, supporting members 253 and 254, and arm moving mechanism 255 and 256, similarly to the edge cleaning unit EC shown in FIG. 4. They respectively have the same configurations and functions as those in the edge cleaning unit EC shown in FIG. 4. When the substrate W is placed on the spin chuck 201, therefore, the position of the substrate W is corrected by the guide arms 251 and 252.

The guide arms 251 and 252, the supporting members 253 and 254, and the arm moving mechanisms 255 and 256 may be replaced with the correction pins 261, the pin driving devices 262, and the eccentricity sensors 263 shown in FIG. 8, the four support pins 271P, the pin holding member 271, and the pin driving device 273 shown in FIG. 10, the camera 290 shown in FIG. 13, or the camera 290 and the rotating mechanism movement device 291 shown in FIG. 14.

Furthermore, in place of the guide arms 251 and 252, the supporting members 253 and 254, and the arm moving mechanisms 255 and 256, the edge cleaning unit EC shown in FIG. 17 may have the light emitter 276a provided therein and have the light receiver 276b provided on the hand CRH11, as shown in FIG. 15.

(4) As to Cleaning/Drying Processing Unit

The cleaning/drying processing unit SD will be then described using the drawings.

(4-a) Configuration of Cleaning/Drying Processing Unit

Figure 21:
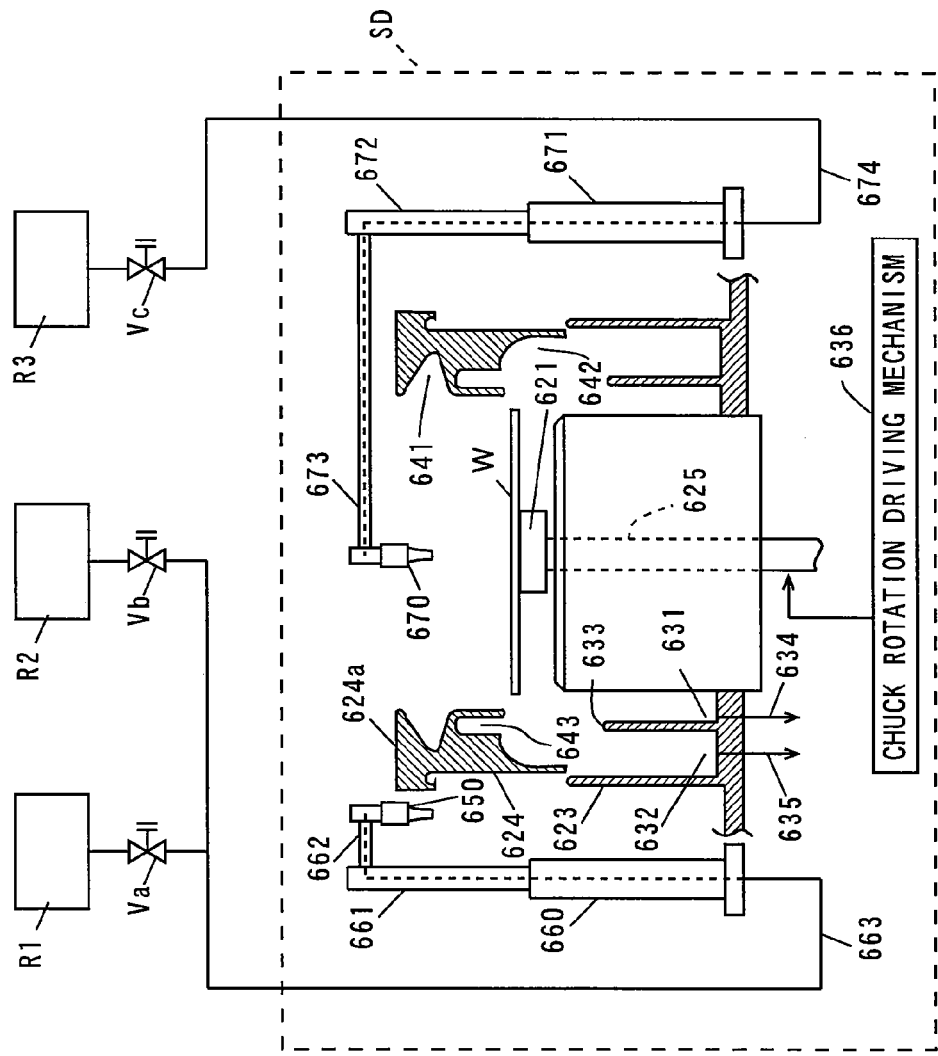
FIG. 21 is a diagram for explaining the configuration of a cleaning/drying processing unit.

The configuration of a cleaning/drying processing unit SD will be described. FIG. 21 is a diagram for explaining the configuration of the cleaning/drying processing unit SD.

As shown in FIG. 21, the cleaning/drying processing unit SD comprises a spin chuck 621 for horizontally holding a substrate W as well as rotating the substrate W around a vertical rotation shaft passing through the center of the substrate W.

The spin chuck 621 is secured to an upper end of a rotation shaft 625, which is rotated by a chuck rotation driving mechanism 636. A suction path (not shown) is formed in the spin chuck 621. Air inside the suction path is exhausted with the substrate W placed on the spin chuck 621, to adsorb a back surface of the substrate W on the spin chuck 621 under vacuum, so that the substrate W can be held in a horizontal attitude.

A first motor 660 is provided outside the spin chuck 621. A first rotation shaft 661 is connected to the first motor 660. A first arm 662 is connected to the first rotation shaft 661 so as to extend in the horizontal direction, and its end is provided with a nozzle 650 for cleaning processing.

The first motor 660 causes the first rotation shaft 661 to rotate while causing the first arm 662 to swing, which causes the nozzle 650 to move to above the substrate W held on the spin chuck 621.

A supply pipe 663 for cleaning processing is provided so as to pass through the first motor 660, the first rotation shaft 661, and the first arm 662. The supply pipe 663 is connected to a cleaning liquid supply source R1 and a rinse liquid supply source R2 through a valve Va and a valve Vb, respectively. By controlling the opening and closing of the valves Va and Vb, it is possible to select a processing liquid supplied to the supply pipe 663 and adjust the amount of the processing liquid to be supplied. In the configuration shown in FIG. 21, a cleaning liquid can be supplied to the supply pipe 663 by opening the valve Va, and a rinse liquid can be supplied to the supply pipe 663 by opening the valve Vb.

The cleaning liquid and the rinse liquid are supplied to the nozzle 650 through the supply pipe 663 from the cleaning liquid supply source R1 and the rinse liquid supply source R2, respectively. This allows the cleaning liquid or the rinse liquid to be supplied to a main surface of the substrate W. Examples of the cleaning liquid include pure water, a pure water solution containing a complex (ionized), or a fluorine-based medical liquid. Examples of the rinse liquid include pure water, carbonic water, hydrogen water, electrolytic ionic water, and HFE (hydrofluoroether).

A second motor 671 is provided outside the spin chuck 621. A second rotation shaft 672 is connected to the second motor 671. A second arm 673 is connected to the second rotation shaft 672 so as to extend in the horizontal direction, and its end is provided with a nozzle 670 for drying processing.

The second motor 671 causes the second rotation shaft 672 to rotate while causing the second arm 673 to swing, which causes the nozzle 670 to move to above the substrate W held on the spin chuck 621.

A supply pipe 674 for drying processing is provided so as to pass through the second motor 671, the second rotation shaft 672, and the second arm 673. The supply pipe 674 is connected to an inert gas supply source R3 through a valve Vc. By controlling the opening and closing of the valve Vc, it is possible to adjust the amount of an inert gas to be supplied to the supply pipe 674.

The inert gas is supplied to the nozzle 670 through the supply pipe 674 from the inert gas supply source R3. Thus, the inert gas can be supplied to the main surface of the substrate W. An example of the inert gas is nitrogen gas ($N_2$).

When supplying the cleaning liquid or the rinse liquid to the main surface of the substrate W, the nozzle 650 is positioned above the substrate W. When supplying the inert gas to the main surface of the substrate W, the nozzle 650 is retracted to a predetermined position.

When supplying the cleaning liquid or the rinse liquid to the main surface of the substrate W, the nozzle 670 is retracted to a predetermined position. When supplying the inert gas to the main surface of the substrate W, the nozzle 670 is positioned above the substrate W.

The substrate W held on the spin chuck 621 is housed in a processing cup 623. A cylindrical partition wall 633 is provided inside the processing cup 623. A discharge space 631 for discharging the processing liquid (i.e., cleaning liquid or rinse liquid) used for processing the substrate W is formed so as to surround the spin chuck 621. Further, a liquid recovery space 632 for recovering the processing liquid used for processing the substrate W is formed between the processing cup 623 and the partition wall 633 so as to surround the discharge space 631.

A discharge pipe 634 for introducing the processing liquid into a liquid discharge processing device (not shown) is connected to the discharge space 631. A recovery pipe 635 for introducing the processing liquid into a recovery processing device (not shown) is connected to the liquid recovery space 632.

A guard 624 is provided above the processing cup 623 for preventing the processing liquid on the substrate W from being splashed outward. The guard 624 is shaped to be rotationally-symmetric with respect to the rotation shaft 625. An annular-shaped liquid discharge guide groove 641 with a V-shaped cross section is formed inwardly at an upper end of the guard 624.

Furthermore, a liquid recovery guide 642 having an inclined surface that is inclined outwardly downward is formed inwardly at a lower end of the guard 624. A partition wall housing groove 643 for receiving the partition wall 633 in the processing cup 623 is formed in the vicinity of an upper end of the liquid recovery guide 642.

This guard 624 is provided with a guard lifting mechanism (not shown) composed of a ball-screw mechanism or the like. The guard lifting mechanism moves the guard 624 upward and downward between a recovery position in which the liquid recovery guide 642 is opposed to outer edges of the substrate W held on the spin chuck 621 and a discharge position in which the liquid discharge guide groove 641 is opposed to the outer edges of the substrate W held on the spin chuck 621. When the guard 624 is in the recovery position (i.e., the position of the guard 624 shown in FIG. 21), the processing liquid splashed outward from the substrate W is introduced into the liquid recovery space 632 by the liquid recovery guide 642, and then recovered through the recovery pipe 635. On the other hand, when the guard 624 is in the discharge position, the processing liquid splashed outward from the substrate W is introduced into the discharge space 631 by the liquid discharge guide groove 641, and then discharged through the discharge pipe 634. The foregoing configuration causes the processing liquid to be discharged and recovered.

(4-b) Operation of Cleaning/Drying Processing Unit

The processing operation of the cleaning/drying processing unit SD having the above-mentioned configuration will be then described. Note that the operation of each constituent element in the cleaning/drying processing unit SD described below is controlled by the main controller (controller) 91 shown in FIG. 1.

When the substrate W is first carried into the cleaning/drying processing unit SD, the guard 624 is lowered, and the interface transporting mechanism IFR shown in FIG. 1 places the substrate W on the spin chuck 621. The substrate W placed on the spin chuck 621 is held by suction on the spin chuck 621.

Then, the guard 624 moves to the above-mentioned discharge position while the nozzle 650 moves to above the center of the substrate W. Thereafter, the rotation shaft 625 rotates, which causes the substrate W held on the spin chuck 621 to rotate. Thereafter, the cleaning liquid is discharged onto a main surface of the substrate W from the nozzle 650. The substrate W is thus cleaned.

In the cleaning/drying processing unit 80a, components of the resist cover film on the substrate W are eluted in the cleaning liquid during the cleaning. In the cleaning of the substrate W, the cleaning liquid is supplied onto the substrate W while the substrate W is being rotated.

In this case, the cleaning liquid on the substrate W always moves toward a peripheral portion of the substrate W by a centrifugal force and splashed. It is thus possible to prevent the components of the resist cover film eluted in the cleaning liquid from remaining on the substrate W. Note that the components of the resist cover film may be eluted with pure water poured onto the substrate W and kept thereon for a certain time period. The cleaning liquid may be supplied onto the substrate W by means of a soft spray method using a two-fluid nozzle as shown in FIG. 18.

After an elapse of a predetermined time period, the supply of the cleaning liquid is stopped, and the rinse liquid is discharged from the nozzle 650. This causes the cleaning liquid on the substrate W to be cleaned away.

Figure 22:
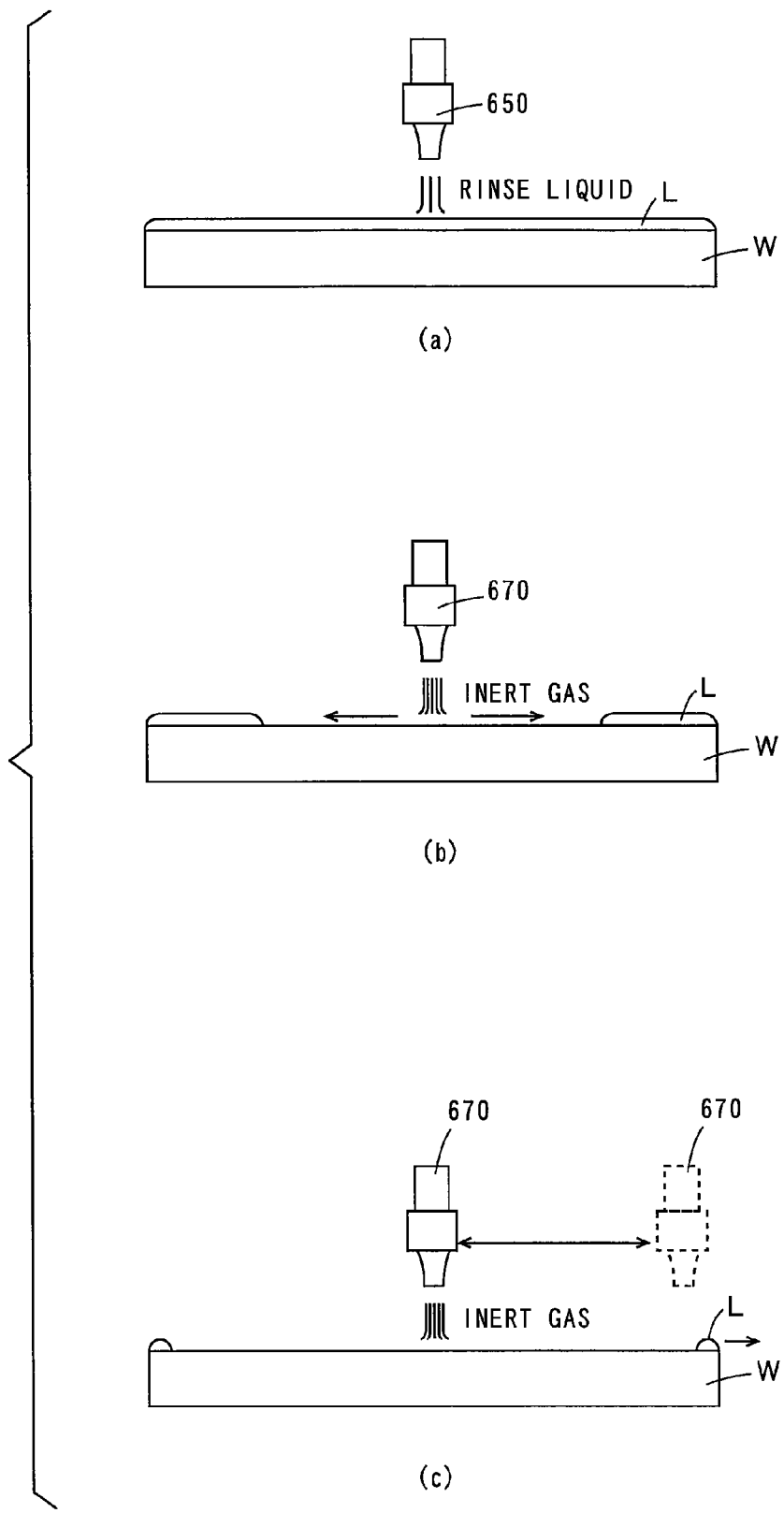
FIG. 22 is a diagram for explaining the operation of a cleaning/drying processing unit.

After an elapse of another predetermined time period, the rotation speed of the rotation shaft 625 decreases. This causes the amount of the rinse liquid that is shaken off by the rotation of the substrate W to be reduced, so that a liquid layer L of the rinse liquid is formed over the entire main surface of the substrate W, as shown in FIG. 22 (a). Alternatively, the rotation of the rotation shaft 625 may be stopped to form the liquid layer L over the entire main surface of the substrate W.

Then, the supply of the rinse liquid is stopped, and the nozzle 650 is retracted to the predetermined position while the nozzle 670 moves to above the center of the substrate W. Thereafter, the inert gas is discharged from the nozzle 670. This causes the rinse liquid at the center of the substrate W to move to the peripheral portion of the substrate W, leaving the liquid layer L only on the peripheral portion of the substrate W, as shown in FIG. 22 (b).

Then, the number of revolutions of the rotation shaft 625 (see FIG. 21) increases while the nozzle 670 gradually moves from above the center of the substrate W to above the peripheral portion thereof, as shown in FIG. 22 (c). This causes a great centrifugal force to act on the liquid layer L on the substrate W while the inert gas can be sprayed on the entire main surface of the substrate W, thereby allowing the liquid layer L on the substrate W to be reliably removed. As a result, the substrate W can be reliably dried.

Then, the supply of the inert gas is stopped, and the nozzle 670 is retracted to the predetermined position while the rotation of the rotation shaft 625 is stopped. Thereafter, the guard 624 is lowered while the interface transporting mechanism IFR shown in FIG. 1 carries the substrate W out of the cleaning/drying processing unit SD. The processing operation in the cleaning/drying processing unit SD is thus terminated. It is preferred that the position of the guard 624 during the cleaning and drying processing is suitably changed according to the necessity of recovering or discharging the processing liquid.

Although in the above-mentioned embodiment, a configuration in which the nozzle 650 is shared between the supply of the cleaning liquid and the supply of the rinse liquid is adopted to allow both of the cleaning liquid and the rinse liquid to be supplied from the nozzle 650, a configuration in which different nozzles are respectively used for the supply of the cleaning liquid and the supply of the rinse liquid may be also adopted.

In a case where the rinse liquid is supplied, pure water may be supplied from a nozzle for a back rinse (not shown) to the back surface of the substrate W so as to prevent the rinse liquid from flowing around to the back surface of the substrate W.

In a case where the pure water is used as the cleaning liquid for cleaning the substrate W, it is not necessary to supply the rinse liquid.

Although in the above-mentioned embodiment, the substrate W is subjected to the drying processing by a spin drying method, the substrate W may be also subjected to drying processing by other drying methods such as a reduced pressure drying method and an air knife drying method.

Although in the above-mentioned embodiment, the inert gas is supplied from the nozzle 670 with the liquid layer L of the rinse liquid formed, the inert gas may be supplied from the nozzle 670 to thoroughly dry the substrate W immediately after the liquid layer of the cleaning liquid is shaken off once by rotating the substrate W when the liquid layer L of the rinse liquid is not formed or the rinse liquid is not used.

(5) As to Interface Transporting Mechanism in Interface Block

Figure 23:
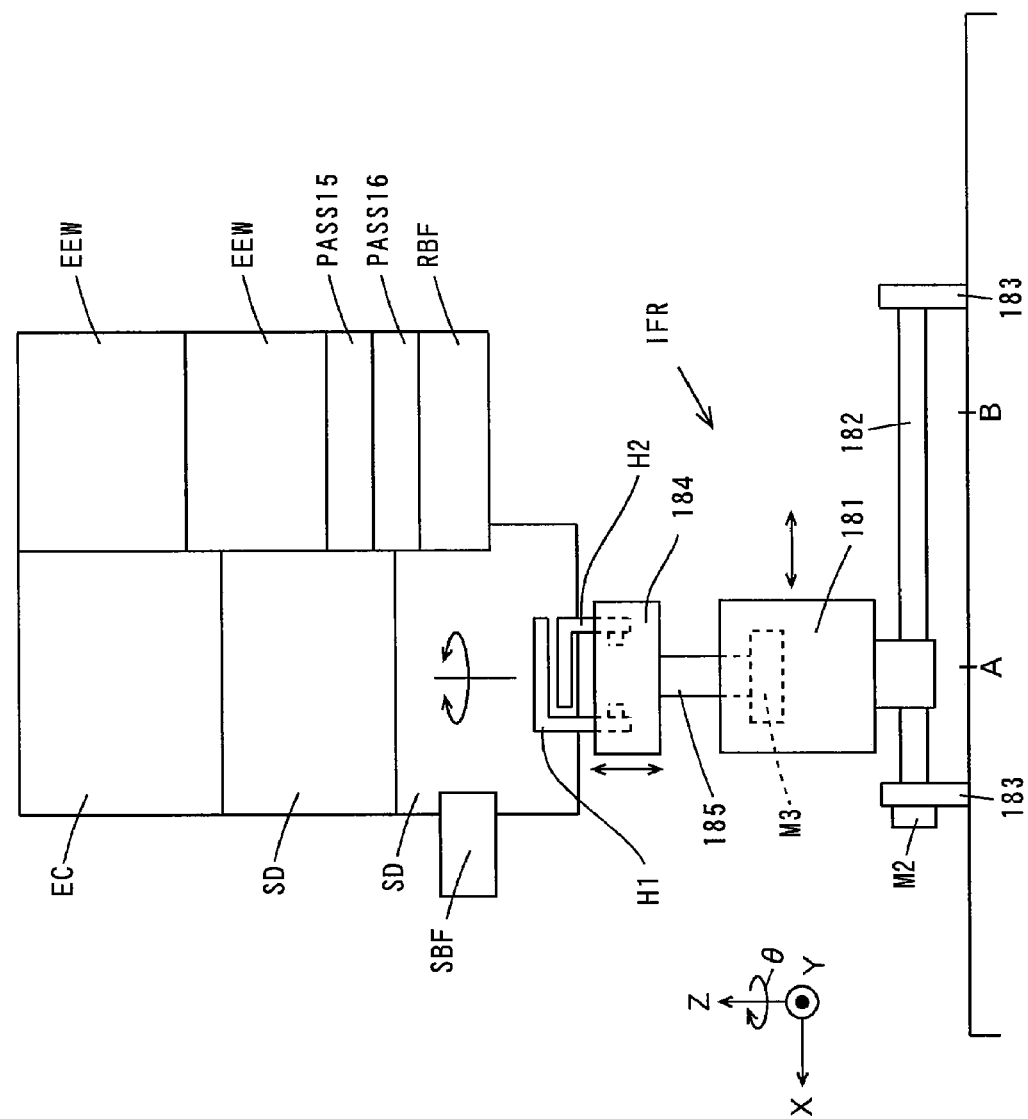
FIG. 23 is a diagram for explaining the configuration and the operation of an interface transporting mechanism.

An interface transporting mechanism IFR will be described. FIG. 23 is a diagram for explaining the configuration and the operation of the interface transporting mechanism IFR.

First, the configuration of the interface transporting mechanism IFR will be described. As shown in FIG. 23, a movable base 181 in the interface transporting mechanism IFR is screwed into a screwed shaft 182. The screwed shaft 182 is rotatably supported on support bases 183 so as to extend in the X direction. One end of the screwed shaft 182 is provided with a motor M2. The motor causes the screwed shaft 182 to rotate and the movable base 181 to horizontally move in the ±X direction.

Furthermore, a hand support base 184 is placed on the movable base 181 so as to be rotatable in the ±θ direction and movable up and down in the ±Z direction. The hand support base 184 is connected to a motor M3 in the movable base 181 through a rotation shaft 185, and rotates by the motor M3. Two hands H1 and H2 for holding a substrate W in a horizontal attitude are provided in the hand support base 184 one above the other so as to be movable back and forth.

The operation of the interface transporting mechanism IFR will be then described. The operation of the interface transporting mechanism IFR is controlled by the main controller (controller) 91 shown in FIG. 1.

First, the interface transporting mechanism IFR rotates the hand support base 184 at a position A shown in FIG. 23 while raising the hand support base 184 in the +Z direction, to allow the upper hand H1 to enter the substrate platform PASS15. When the hand H1 receives the substrate W in the substrate platform PASS15, the interface transporting mechanism IFR retracts the hand H1 from the substrate platform PASS15 and lowers the hand support base 184 in the −Z direction.

The interface transporting mechanism IFR then moves in the −X direction, and rotates the hand support base 184 at a position B while allowing the hand H1 to enter the substrate carry-in section 17a (see FIG. 1) in the exposure device 17. After carrying the substrate W into the substrate carry-in section 17a, the interface transporting mechanism IFR retracts the hand H1 from the substrate carry-in section 17a.

The interface transporting mechanism IFR then allows the lower hand H2 to enter the substrate carry-out section 17b (see FIG. 1) in the exposure device 17. When the hand H2 receives the substrate W after the exposure processing in the substrate carry-out section 17b, the interface transporting mechanism IFR retracts the hand H2 from the substrate carry-out section 17b.

Thereafter, the interface transporting mechanism IFR moves in the +X direction, and rotates the hand support base 184 at the position A while allowing the hand H2 to enter a cleaning/drying processing unit SD, and carries the substrate W into the cleaning/drying processing unit SD. This causes the cleaning/drying processing unit SD to subject the substrate W after the exposure processing to cleaning and drying processing.

Then, the interface transporting mechanism IFR allows the upper hand H1 to enter the cleaning/drying processing unit SD, and receives the substrate W after the cleaning and drying processing from the cleaning/drying processing unit SD. The interface transporting mechanism IFR places the substrate W on the substrate platform PASS16.

When the exposure device 17 cannot receive the substrate W, as described above, the substrate W is temporarily stored in a sending buffer unit SBF. When the cleaning/drying processing unit SD cannot temporarily perform the cleaning and drying processing, the substrate W after the exposure processing is temporarily stored in a return buffer unit RBF in an interface block 16.

Although the single interface transporting mechanism IFR transports the substrate W from the substrate platform PASS15 to the exposure device 17 and from the exposure device 17 to the cleaning/drying processing unit SD in the present embodiment, a plurality of interface transporting mechanisms IFR may be used to transport the substrate W.

(6) Effects of the Present Embodiment (6-a) Effects of Edge Cleaning Processing

In the above-mentioned embodiment, in the edge cleaning unit EC in the cleaning/drying processing group 80, the position of the substrate W is corrected such that the center W1 of the substrate W coincides with the axis P1 of the spin chuck 201 before the edge cleaning processing of the substrate W. This prevents the substrate W to be eccentric from the rotation shaft 203 during the edge cleaning processing of the substrate W, thereby allowing the edge R of the substrate W to be uniformly cleaned. This prevents the edge R of the substrate W from being non-uniform in cleaning, thereby allowing a contaminant that has adhered to the edge R from being reliably removed.

The substrate W is prevented from being eccentric, so that a cleaning region of the edge R by the edge cleaning processing can be adjusted with high accuracy. This allows various regions at the edge R of the substrate W such as a region including only the bevel portion at the edge R (see FIG. 5) or a region including the bevel portion and the peripheral portion at the edge R to be cleaned selectively and accurately. This prevents a portion, which should not be subjected to cleaning processing, of an organic film or the like formed on the substrate W to be subjected to unnecessary cleaning processing.

Furthermore, the rotation of the substrate W is stabilized during the edge cleaning processing of the substrate W, which prevents the cleaning liquid from being splashed on its surroundings. Thus, the splashed cleaning liquid is prevented from contaminating the substrate W by adhering to the main surface of the substrate W again.

As a result of these, the contamination in the exposure device 17 due to the contamination at the edge R of the substrate W can be prevented, which can prevent a defective dimension and a defective shape of an exposure pattern.

When one or both of the anti-reflection film and the resist film formed in the peripheral portion on the substrate W is/are exposed without being coated with the resist cover film, components of one or both of the antireflection film and the resist film may be eluded or deposited during the exposure processing using the immersion method. By cleaning a region of the peripheral portion including the exposed portion, therefore, the components eluded or deposited from one or both of the anti-reflection film and the resist film during the exposure processing using the immersion method are previously eluded or deposited in the edge cleaning unit EC, and an eluate or a deposit is cleaned away. Consequently, one or both of the anti-reflection film and the resist film is/are prevented from being eluded or deposited in the immersion liquid during the exposure processing. Thus, the exposure device 17 (a lens of the exposure device 17) is prevented from being contaminated, which prevents a defective dimension and a defective shape of an exposure pattern.

The components that may be eluded or deposited in the immersion liquid during the exposure processing are not limited to the components included in the anti-reflection film and the resist film. Examples are components included in a semiconductor film, a metal film, an insulating film, an organic film, or the like formed on the substrate W by an external device provided outside the substrate processing apparatus 500 according to the present embodiment. The components included in the films can be also previously eluded or deposited in the edge cleaning unit EC.

In order to thus previously elude or deposit the components of the film on the substrate W during the edge cleaning processing of the substrate W, it is preferable that the immersion liquid used in the exposure device 17 is used as the cleaning liquid. Examples of the immersion liquid include pure water, glycerol with a high refractive index, a liquid mixture of fine particles with a high refractive index (e.g., aluminum oxide) and pure water, and an organic liquid.

Other examples of the immersion liquid include a pure water solution containing a complex (ionized), carbonic water, hydrogen water, electrolytic ionic water, HFE (hydrofluoroether), hydrofluoric acid, sulfuric acid, and a sulfuric acid/hydrogen peroxide mixture.

(6-b) Effects of Edge Cleaning Processing Using Brush

When the substrate W is subjected to the edge cleaning processing using the brush 213 in the edge cleaning unit EC, the brush 213 is brought into direct contact with the edge R of the substrate W, a contaminant at the edge of the substrate W can be physically stripped. This allows the contaminant that has strictly adhered to the edge R to be more reliably removed.

(6-c) Effects of Edge Cleaning Processing Using Two-Fluid Nozzle

In the edge cleaning unit EC, when the substrate W is subjected to the edge cleaning processing using the two-fluid nozzle 310, the liquid mixture N of the gas and the liquid is discharged to the edge R of the substrate W, so that the edge R of the substrate W is cleaned. This allows a high cleaning effect to be obtained by using the fluid mixture N.

The fluid mixture N of the gas and the liquid is discharged to the edge R of the substrate W, so that the edge R of the substrate W is cleaned in non-contact, which prevents the edge R of the substrate W from being damaged during the cleaning. Further, it is also possible to easily control the cleaning conditions of the edge R of the substrate W by controlling the discharge pressure of the fluid mixture N and the ratio of the gas and the liquid in the fluid mixture N.

The two-fluid nozzle 310 allows the uniform fluid mixture N to be discharged to the edge R of the substrate W, which prevents the edge R from being non-uniform in cleaning.

(6-d) Effects of Edge Cleaning Processing Using Ultrasonic Nozzle

In the edge cleaning unit EC, when the substrate W is subjected to the edge cleaning processing using the ultrasonic nozzle 410, a high-frequency output is applied to the pure water passing through the ultrasonic nozzle 410 depending on the value of the high-frequency current.

This causes the pure water in a ultrasonic vibration state to be discharged to the edge R of the substrate W, thereby causing the edge R of the substrate W to be cleaned. In this case, the high-frequency output applied to the pure water can be variably controlled electrically depending on the type of the substrate W and the cleaning conditions.

(6-e) Effects of Cleaning Processing of Substrate after Exposure Processing

After the substrate W is subjected to the exposure processing in the exposure device 17, the substrate W is subjected to the cleaning processing in the cleaning/drying processing group 80 in the cleaning/drying processing block 15. In this case, even if the particles and the like in the atmosphere adhere to the substrate W to which the liquid adheres during the exposure processing, the attachment can be removed. This can prevent the substrate W from being contaminated.

In the cleaning/drying processing group 80, the substrate W after the exposure processing is subjected to the drying processing. This prevents the liquid that has adhered to the substrate W during the exposure processing from dropping in the substrate processing apparatus 500. As a result, operational troubles such as abnormalities in an electric system in the substrate processing apparatus 500 can be prevented.

The particles and the like in the atmosphere are prevented from adhering to the substrate W after the exposure processing by subjecting the substrate W after the exposure processing to the drying processing, which can prevent the substrate W from being contaminated.

The substrate W to which the liquid adheres is prevented from being transported in the substrate processing apparatus 500, which can prevent the liquid that has adhered to the substrate W during the exposure processing from influencing the atmosphere in the substrate processing apparatus 500. This facilitates the adjustment of temperature and humidity in the substrate processing apparatus 500.

The liquid that has adhered to the substrate W during the exposure processing is prevented from adhering to the indexer robot IR and the second to eighth central robots CR2 to CR8, which prevents the liquid from adhering to the substrate W before the exposure processing. This prevents the particles and the like in the atmosphere from adhering to the substrate W before the exposure processing, thereby preventing the substrate W from being contaminated. As a result, it is possible to prevent degradation in resolution performance during the exposure processing and reliably prevent contamination in the exposure device 17. As a result, it is possible to reliably prevent processing defects in the substrate W.

A configuration for subjecting the substrate W after the exposure processing to the drying processing is not limited to that in the example of the substrate processing apparatus 500 shown in FIG. 1. Instead of providing the cleaning/drying processing block 15 between the resist cover film removal block 14 and the interface block 16, the cleaning/drying processing group 80 may be provided in the interface block 16 to subject the substrate W after the exposure processing to the drying processing.

(6-f) Effects of Drying Processing of Substrate after Exposure Processing

The cleaning/drying processing unit SD subjects the substrate W to the drying processing by spraying the inert gas on the substrate W from the center to the peripheral portion thereof while rotating the substrate W. In this case, the cleaning liquid and the rinse liquid on the substrate W can be reliably removed, which can reliably prevent the particles and the like in the atmosphere from adhering to the cleaned substrate W. This can reliably prevent the contamination of the substrate W and can prevent the generation of dry marks on the main surface of the substrate W.

(6-g) Effects of Cleaning/Drying Processing Block

Since the substrate processing apparatus 500 according to the present embodiment has the configuration in which the cleaning/drying processing block 15 is added to the existing substrate processing apparatus, processing defects of the substrate W can be prevented at low cost.

(6-h) Effects of Hand of Interface Transporting Mechanism

In the interface block 16, the hand H1 of the interface transporting mechanism IFR is used when the substrate W before the exposure processing is transported from the substrate platform PASS15 to the substrate carry-in section 17a in the exposure device 17 and when the substrate W after the cleaning and drying processing is transported from the cleaning/drying processing unit SD to the substrate platform PASS16, and the hand H2 of the interface transporting mechanism IFR is used when the substrate W after the exposure processing is transported from the substrate carry-out section 17b in the exposure device 17 to the cleaning/drying processing unit SD.

That is to say, the hand H1 is used for transporting the substrate W having no liquid adhering thereto, and the hand H2 is used for transporting the substrate W having a liquid adhering thereto.

In this case, since the liquid that has adhered to the substrate W during the exposure processing is prevented from adhering to the hand H1, the liquid is prevented from adhering to the substrate W before the exposure processing. In addition, since the hand H2 is provided below the hand H1, the liquid can be prevented from adhering to the hand H1 and the substrate W held thereby even if the liquid drops from the hand H2 and the substrate W held thereby. This can reliably prevent the liquid from adhering to the substrate W before the exposure processing. As a result, the substrate W can be reliably prevented from being contaminated before the exposure processing.

(6-i) Effects of Removal Processing of Resist Cover Film

Before the substrate W is subjected to the development processing in the development processing block 12, the removal processing of the resist cover film is performed in the resist cover film removal block 14. In this case, the resist cover film is reliably removed before the development processing, so that the development processing can be reliably performed.

(6-j) Effects of Cleaning/Drying Processing Unit

As described in the foregoing, the cleaning/drying processing unit SD subjects the substrate W to the drying processing by spraying the inert gas on the substrate W from the center to the peripheral portion thereof while rotating the substrate W, so that the cleaning liquid and the rinse liquid can be reliably removed.

This can reliably prevent the components of the resist or the resist cover film from being eluted in the cleaning liquid and the rinse liquid remaining on the substrate W while the substrate W is transported from the cleaning/drying processing group 80 to the development processing group 50. This can prevent the exposure pattern formed on the resist film from being deformed. As a result, it is possible to reliably prevent line-width precision from being degraded during the development processing.

(6-k) Effects of Hand of Robot

In the second to sixth central robots CR2 to CR6 and the indexer robot IR, the upper hand is used for transporting the substrate W before the exposure processing, while the lower hand is used for transporting the substrate W after the exposure processing. This can reliably prevent the liquid from adhering to the substrate W before the exposure processing.

(7) Another Embodiment and its Effect

(7-a) Another Example of Cleaning Nozzle Used for Edge Cleaning Processing

Although in the above-mentioned embodiment, the cleaning liquid supply paths 241a and 241b, the two-fluid nozzles 310 and 310b, and the ultrasonic nozzles 410 and 410a are used in subjecting the substrate W to the edge cleaning processing, the present invention is not limited to the same. For example, a cleaning nozzle comprising a needle-shaped discharge port having a small diameter may be used. In this case, the small edge R in a region of the substrate W can be cleaned with high accuracy.

(7-b) Another Example of Arrangement

Although in the above-mentioned embodiment, the resist cover film removal block 14 comprises the two resist cover film removal processing groups 701 and 70b, the resist cover film removal block 14 may comprise a thermal processing section that subjects the substrate W to thermal processing in place of one of the two resist cover film removal processing groups 70a and 70b. In this case, a plurality of substrates W are efficiently subjected to thermal processing, resulting in improved throughput.

(7-c) As to Another Example of Cleaning/Drying Processing Unit

Although the nozzle 650 for cleaning processing and the nozzle 670 for drying processing are separately provided in the cleaning/drying processing unit SD shown in FIG. 21, the nozzle 650 and the nozzle 670 may be integrally provided, as shown in FIG. 24. In this case, the nozzle 650 and the nozzle 670 need not be separately moved when the substrate W is subjected to the cleaning processing or the drying processing, so that the driving mechanism can be simplified.

Figure 25:
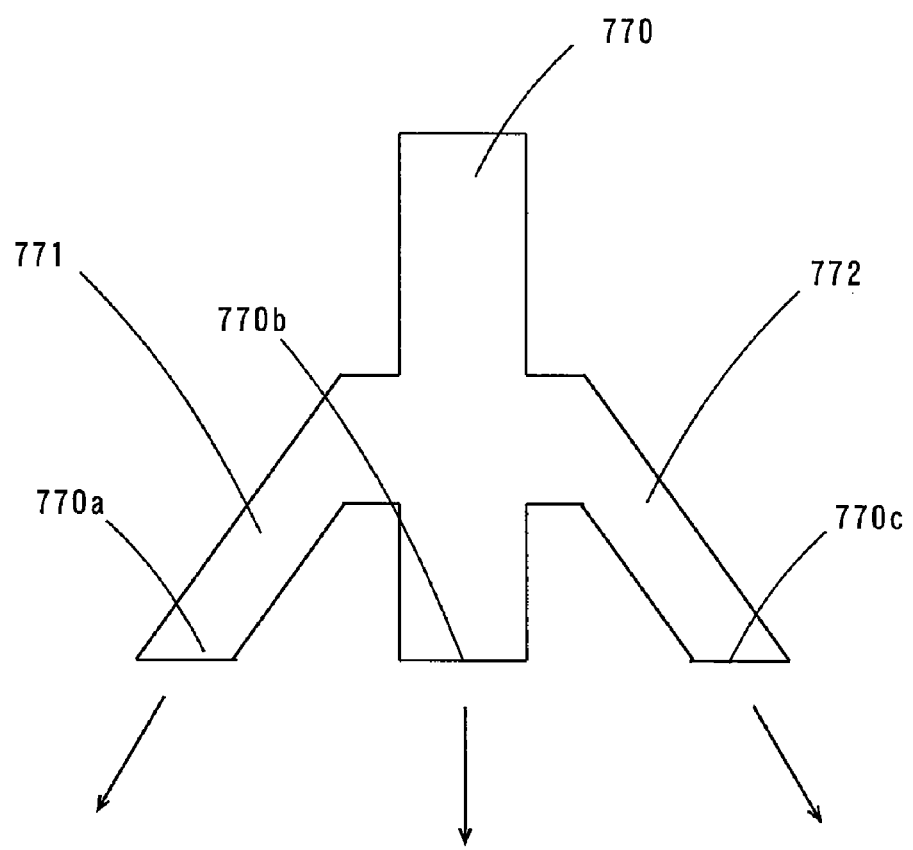
FIG. 25 is a schematic view showing another example of a nozzle for drying processing.

The nozzle 670 shown in FIG. 21 may be replaced with a nozzle 770 for drying processing as shown in FIG. 25.

The nozzle 770 shown in FIG. 25 extends vertically downward and has branch pipes 771 and 772 that extend obliquely downward from the sides thereof. Gas discharge ports 770a, 770b, and 770c for discharging an inert gas are respectively formed at a lower end of the branch pipe 771, a lower end of the nozzle 770, and a lower end of the branch pipe 772. The discharge port 770b discharges the inert gas vertically downward, and the discharge ports 770a and 770c each discharge the inert gas obliquely downward, as indicated by arrows in FIG. 25. That is to say, the inert gas is discharged from the nozzle 770 such that a spraying range is enlarged downward.

Here, the cleaning/drying processing unit SD subjects the substrate W to drying processing by the operation described below when the nozzle 770 is used.

Figure 26:
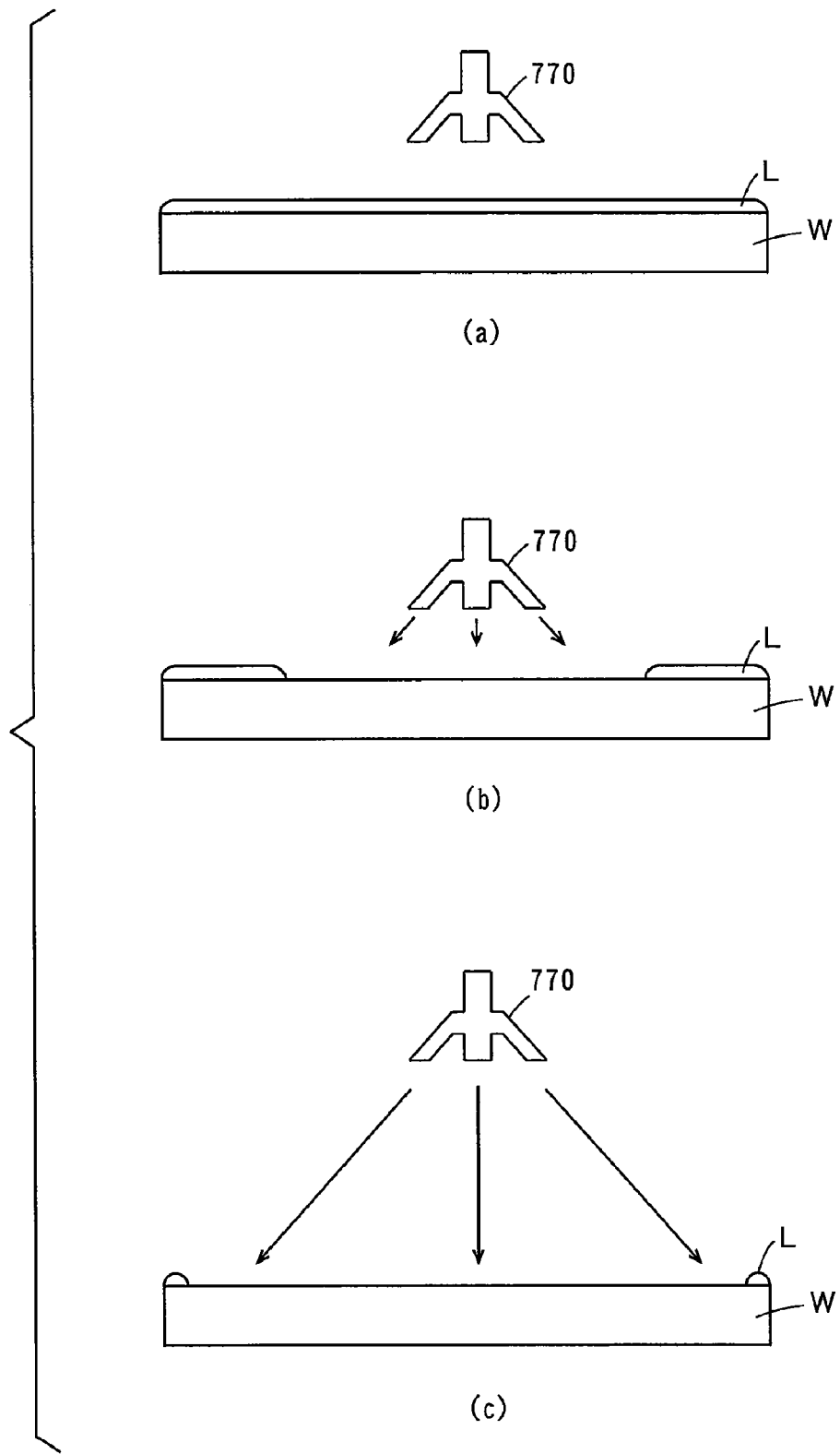
FIG. 26 is a diagram for explaining a method of subjecting a substrate to drying processing using the nozzle for drying processing shown in FIG. 25.

FIG. 26 is a diagram for explaining a method of subjecting the substrate W to drying processing using the nozzle 770.

First, a liquid layer L is formed on the main surface of the substrate W by the method described in FIG. 22, and the nozzle 770 then moves to above the center of the substrate W, as shown in FIG. 26 (*a*). Thereafter, the inert gas is discharged from the nozzle 770. This causes the rinse liquid at the center of the substrate W to move to the peripheral portion of the substrate W, leaving the liquid layer L only on the peripheral portion of the substrate W, as shown in FIG. 26 (*b*). At the time, the nozzle 770 is brought close to the main surface of the substrate W such that the rinse liquid existing at the center of the substrate W can be reliably moved.

Then, as the number of revolutions of the rotation shaft 625 (see FIG. 21) increases, the nozzle 770 moves upward, as shown in FIG. 26 (*c*). This causes a great centrifugal force to act on the liquid layer L on the substrate W while enlarging a range in which the inert gas is sprayed on the substrate W. As a result, the liquid layer L on the substrate W can be reliably removed. Note that the nozzle 770 can be moved up and down by raising and lowering the second rotation shaft 672 using a rotation shaft lifting mechanism (not shown) provided in the second rotation shaft 672 shown in FIG. 21.

Figure 27:
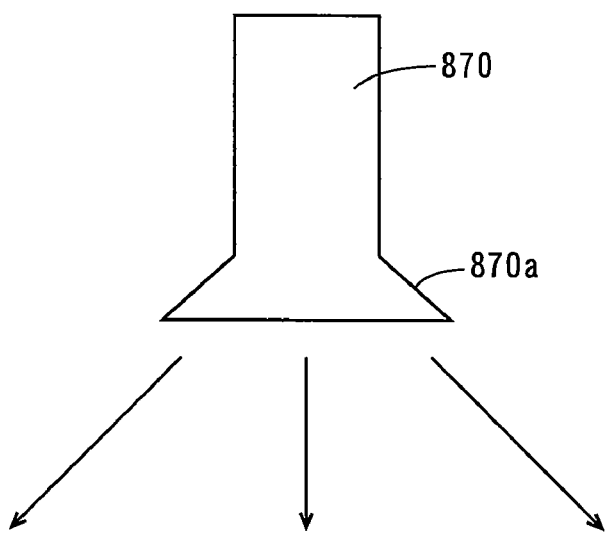
FIG. 27 is a schematic view showing another example of a nozzle for drying processing.

Alternatively, the nozzle 770 may be replaced with a nozzle 870 for drying processing as shown in FIG. 27. The nozzle 870 shown in FIG. 27 has a discharge port 870a whose diameter gradually increases downward. The discharge port 870a discharges an inert gas vertically downward and obliquely downward, as indicated by arrows in FIG. 27. That is, similarly to the nozzle 770 shown in FIG. 25, the nozzle 870 discharges the inert gas such that a spraying range is enlarged downward. Consequently, the substrate W can be subjected to drying processing using the nozzle 870 by a method similar to that using the nozzle 770.

Figure 28:
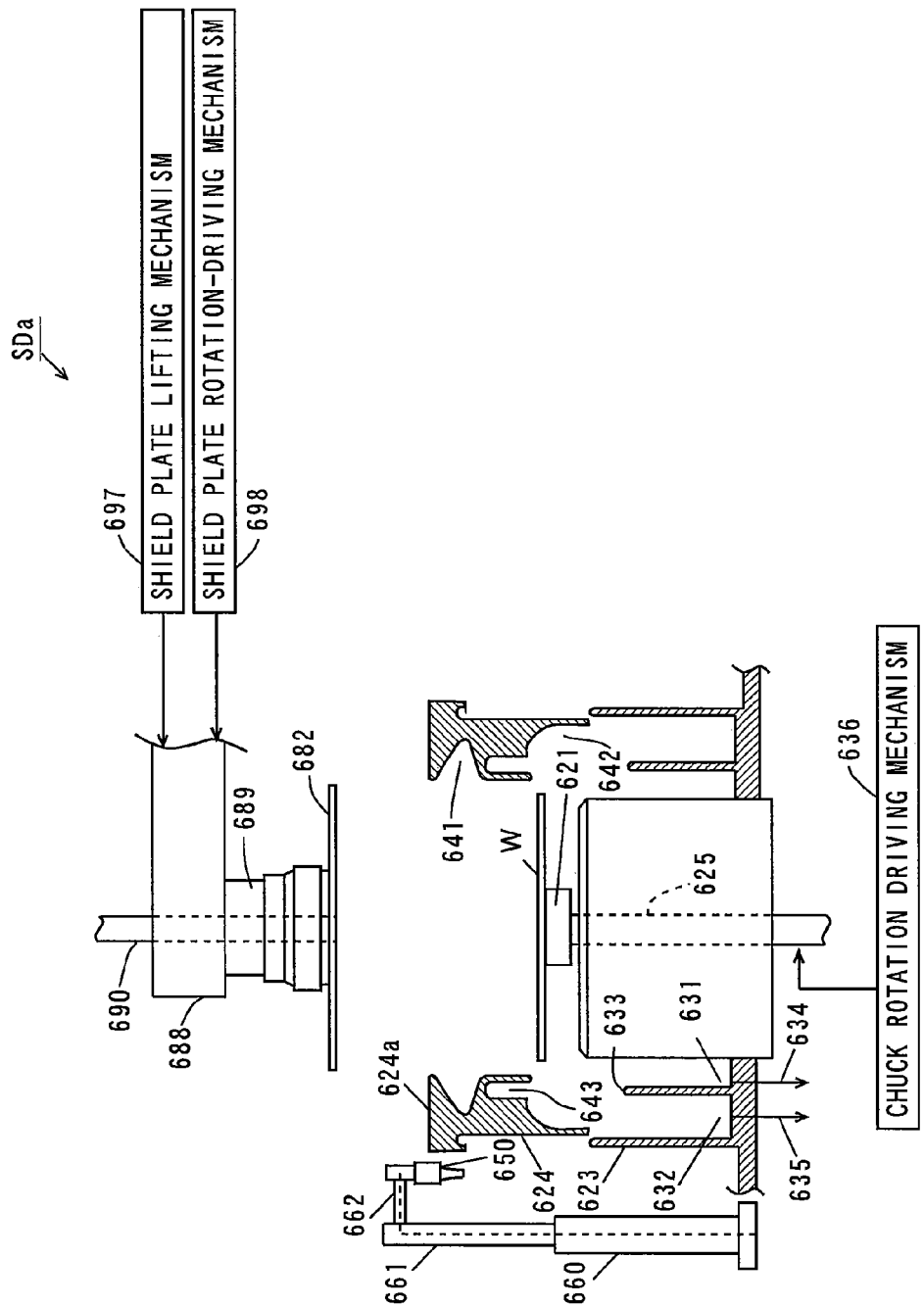
FIG. 28 is a schematic view showing another example of a cleaning/drying processing unit.

The cleaning/drying processing unit SD shown in FIG. 21 may be replaced with a cleaning/drying processing unit SDa as shown in FIG. 28.

The cleaning/drying processing unit SDa shown in FIG. 28 differs from the cleaning/drying processing unit SD shown in FIG. 21 in the following.

In the cleaning/drying processing unit SDa shown in FIG. 28, a disk-shaped shield plate 682 having an opening at its center is provided above a spin chuck 621. A support shaft 689 extends vertically downward from the vicinity of the tip of an arm 688, and the shield plate 682 is mounted at a lower end of the support shaft 689 so as to be opposed to the main surface of a substrate W held on the spin chuck 621.

A gas supply passage 690 communicating with the opening of the shield plate 682 is inserted into the support shaft 689. A nitrogen gas, for example, is supplied to the gas supply passage 690.

A shield plate lifting mechanism 697 and a shield plate rotation driving mechanism 698 are connected to the arm 688. The shield plate lifting mechanism 697 moves the shield plate 682 upward and downward between a position close to the main surface of the substrate W held on the spin chuck 621 and a position spaced upwardly apart from the spin chuck 621.

When the substrate W is subjected to the drying processing in the cleaning/drying processing unit SDa shown in FIG. 28, an inert gas is supplied to a clearance between the substrate W and the shield plate 682 from the gas supply passage 690 with the shield plate 682 brought close to the substrate W as shown in FIG. 29. In this case, the inert gas can be efficiently supplied from the center of the substrate W to the peripheral portion thereof, so that a liquid layer L on the substrate W can be reliably removed.

(7-d) Another Example of Arrangement of Edge Cleaning Unit EC

Although in the above-mentioned embodiment, the edge cleaning unit EC is arranged within the cleaning/drying processing block 15, the edge cleaning unit EC may be arranged in the interface block 16 shown in FIG. 1.

Figure 30:
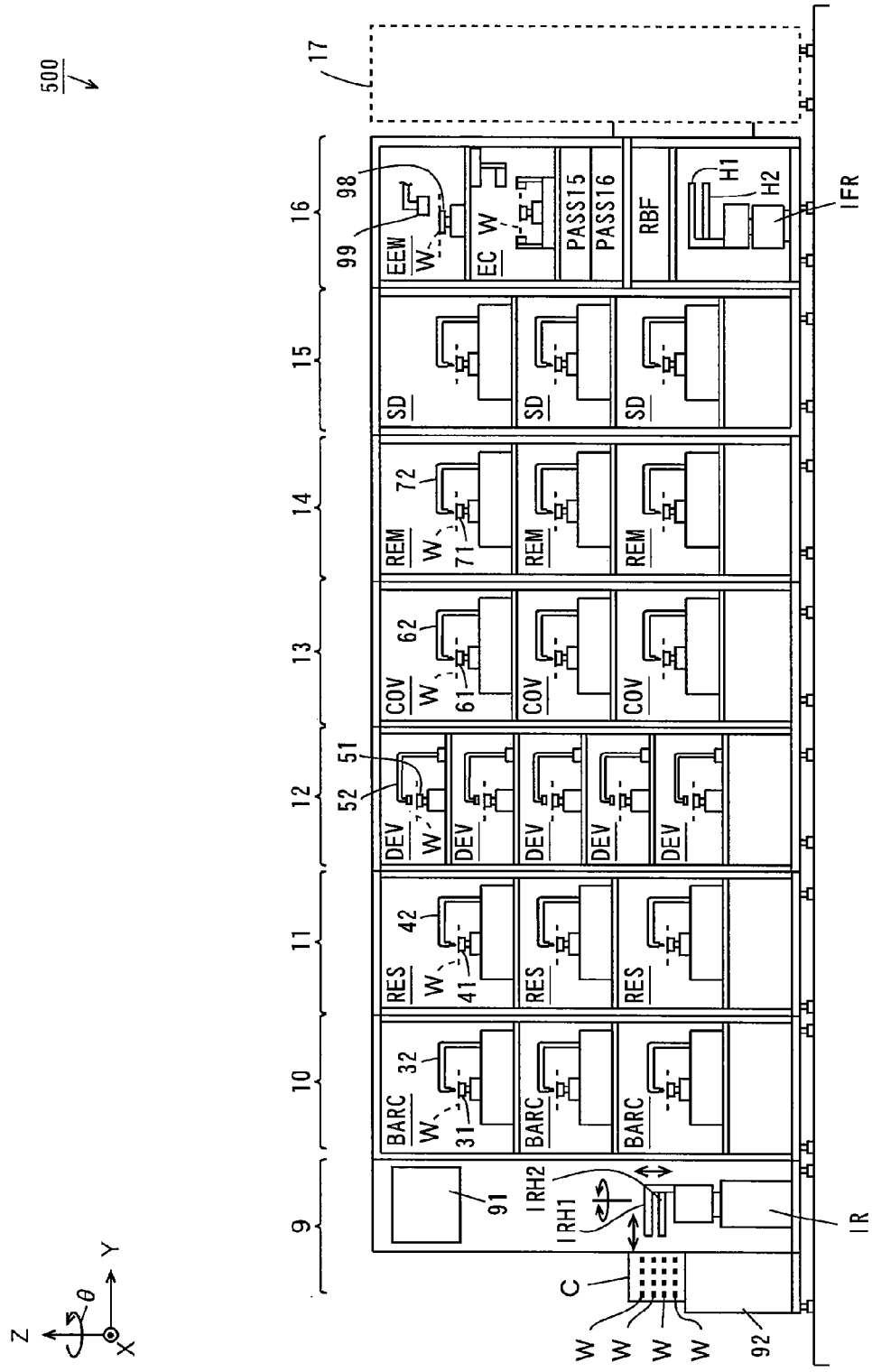
FIG. 30 is a side view of a substrate processing apparatus in a case where an edge cleaning unit is provided in an interface block shown in FIG. 1.

FIG. 30 is a side view of a substrate processing apparatus 500 in a case where an edge cleaning unit EC is provided in the interface block 16 shown in FIG. 1.

As shown in FIG. 30, a cleaning/drying processing group 80 (see FIG. 1) in a cleaning/drying processing block 15 has a vertical stack of three cleaning/drying processing units SD in this example.

The interface block 16 has a stack of one edge exposure unit EEW, one edge cleaning unit EC, substrate platforms PASS15 and PASS16, and a return buffer unit RBF in this order, and has an eighth central robot CR8 (see FIG. 1) and an interface transporting mechanism IFR arranged therein.

In this case, a contaminant that has adhered to an edge R of a substrate W can be also reliably removed before exposure processing by an exposure device 17, as in the above-mentioned embodiment. This can prevent contamination in the exposure device 17 due to contamination at the edge R of the substrate W, which can prevent a defective dimension and a defective shape of an exposure pattern.

Particularly, the contaminant that has adhered to the edge R of the substrate W can be removed immediately before the exposure processing by the exposure device 17, so that the edge R of the substrate W is kept in a sufficiently clean state immediately before the exposure processing.

In addition thereto, an edge cleaning unit EC may be arranged in the anti-reflection film processing block 10 shown in FIG. 1. Alternatively, an edge cleaning processing block comprising the edge cleaning unit EC may be provided between the indexer block 9 shown in FIG. 1 and the anti-reflection film processing block 10.

In this case, before a coating unit BARC forms an anti-reflection film by coating on the substrate W, that is, before the substrate W is subjected to another processing, the edge cleaning unit EC subjects the substrate W to edge cleaning processing. This prevents the contaminant at the edge R of the substrate W from being transferred to first to eighth central robots CR1 to CR8 and hands CRH1 to CRH14, H1, and H2 of an interface transporting mechanism IFR for transporting the substrate W between the blocks.

This allows the substrate W to be subjected to processing in a clean state in an anti-reflection film processing block 10, a resist film processing block 11, a development processing block 12, a resist cover film processing block 13, a resist cover film removal block 14, and a cleaning/drying processing block 15.

Since the edge R of the substrate W is kept clean, processing defects of the substrate W due to the contamination at the edge R of the substrate W can be sufficiently prevented.

Although in the above-mentioned embodiment, the edge cleaning processing of the substrate W is performed in the edge cleaning unit EC in the cleaning/drying processing group 80 in the cleaning/drying processing block 15, the present invention is not limited to the same. For example, it may be performed in a place other than the cleaning/drying processing group 80 (e.g., a coating unit COV in a resist cover film coating processing group 60 in the resist cover film processing block 13). In this case, the number of transport processes up to the edge cleaning unit EC after forming the resist cover film can be reduced, so that throughput can be improved.

(8) Correspondence Between Each Constituent Element in the Claims and Each Part in the Embodiments In the following paragraphs, non-limiting examples of correspondences between various elements recited in the claims below and those described above with respect to various preferred embodiments of the present invention are explained.

In the above-mentioned embodiment, the anti-reflection film processing block 10, the resist film processing block 11, the developing processing block 12, the resist cover film processing block 13, the resist cover film removal block 14, and the cleaning/drying processing block 15 are examples of a processing section, and the interface block 16 is an example of an interface.

The spin chuck 201 is an example of a substrate holding device, and the chuck rotation driving mechanism 204 is an example of a rotation driving mechanism.

The edge cleaning unit EC in the cleaning/drying processing group 80 is an example of a first processing unit, the coating unit RES in the resist film coating processing group 40 is an example of a second processing unit, the coating unit COV in the resist cover film coating processing group 60 is an example of a third processing unit, the removal unit REW in each of the resist cover film removal processing groups 70a and 70b is an example of a fourth processing unit, the coating unit BARC in the anti-reflection film coating processing group 30 is an example of a fifth processing unit, and the development processing unit DEW in the development processing group 50 is an example of a sixth processing unit.

The substrate rotating mechanism 209, the edge cleaning device moving mechanism 230, the local controller 250, the guide arms 251 and 252, the supporting members 253 and 254, the arm moving mechanisms 255 and 256, the correction pin 261, the pin driving device 262, and the rotating mechanism movement device 291 are examples of a position correction device, the guide arms 251 and 252 and the support pin 271 are examples of an abutting member, the correction pin 261 is an example of a supporting member, the eccentricity sensor 263 is an example of a substrate position detector, the local controller 250 is an example of a control device, the interface transporting mechanism IFR is an example of a transport device, and the hands H1 and H2 are respective examples of first and second holders.

Furthermore, the pin driving device 273 is an example of a lifting device, the camera 290 is an example of an edge detector, the edge cleaning device moving mechanism 230 is an example of a cleaning device moving mechanism, the rotating mechanism movement device 291 is an example of a holding device moving mechanism, the photoelectric sensor 276 is an example of a carry-in position detector, the hand CHR11 is an example of a carry-in position detector, and the local controller 250 is an example of a position adjustment device.

As each of various elements recited in the claims, various other elements having configurations or functions described in the claims can be also used.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A substrate processing method employing a substrate processing apparatus that is arranged adjacent to an exposure device that subjects a substrate to exposure processing by means of an immersion method, said substrate processing apparatus comprising a processing section that subjects the substrate to processing, and an interface that is provided adjacent to one end of said processing section for exchanging the substrate between said processing section and said exposure device, the substrate processing method comprising the steps of:
   forming a photosensitive film made of a photosensitive material on the substrate before said exposure processing in said processing section;
   subjecting the substrate after said step of forming the photosensitive film and before said exposure processing to thermal processing in said processing section;
   cleaning an edge of the substrate after said thermal processing and before said exposure processing using a brush such that a contaminant at the edge, on which the photosensitive film is not formed, of the substrate is physically stripped while horizontally holding the substrate by a holder, rotating the substrate held by the holder around an axis perpendicular to the substrate, and supplying pure water to the edge, on which the photosensitive film is not formed, of the substrate being rotated in said interface, immediately before said exposure processing by said exposure device; and
   transporting the substrate after said step of cleaning the edge to said exposure device in said interface, wherein the brush does not come into contact with the photosensitive film formed by the step of forming the photosensitive film in said cleaning step.

2. The substrate processing method according to claim 1, wherein said step of transporting the substrate to the exposure device includes the step of holding the substrate before said exposure processing with a first holder of said substrate processing apparatus and transporting the substrate to said exposure device, and the substrate processing method further comprises the step of holding the substrate after said exposure processing with a second holder of said substrate processing apparatus and transporting the substrate from said exposure device to said substrate processing apparatus.

3. The substrate processing method according to claim 2, wherein said second holder is provided below said first holder.

4. The substrate processing method according to claim 1, further comprising the step of forming a protective film on the substrate for protecting said photosensitive film after said thermal processing and before said step of cleaning the edge in said substrate processing apparatus.

5. The substrate processing method according to claim 4, further comprising the step of removing said protective film from the substrate after said exposure processing in said substrate processing apparatus.

6. The substrate processing method according to claim 1, further comprising the step of forming an anti-reflection film on the substrate before said step of forming the photosensitive film in said substrate processing apparatus.

7. The substrate processing method according to claim 1, further comprising the step of subjecting the substrate after said exposure processing to development processing in said substrate processing apparatus.

8. The substrate processing method according to claim 1, wherein said step of cleaning the edge of the substrate includes the steps of
   holding the substrate after said thermal processing and before said exposure processing substantially horizontally;
   rotating said substrate that is held around an axis perpendicular to the substrate;
   cleaning the edge of said substrate that is rotated using a brush; and
   correcting the position where the substrate is cleaned using the brush.

* * * * *